(12) United States Patent
Seto et al.

(10) Patent No.: US 8,992,797 B2
(45) Date of Patent: *Mar. 31, 2015

(54) PHOSPHOR AND PRODUCTION METHOD THEREOF, PHOSPHOR-CONTAINING COMPOSITION, LIGHT EMITTING DEVICE, ILLUMINATING DEVICE, DISPLAY, AND NITROGEN-CONTAINING COMPOUND

(71) Applicant: Mitsubishi Chemical Corporation, Tokyo (JP)

(72) Inventors: Takatoshi Seto, Yokohama (JP); Naoto Kijima, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/842,220

(22) Filed: Mar. 15, 2013

(65) Prior Publication Data

US 2013/0234588 A1    Sep. 12, 2013

Related U.S. Application Data

(63) Continuation of application No. 12/588,519, filed on Oct. 19, 2009, now Pat. No. 8,398,890, which is a continuation-in-part of application No. PCT/JP2008/056673, filed on Apr. 3, 2008.

(30) Foreign Application Priority Data

Apr. 18, 2007    (JP) .................................. 2007-109270

(51) Int. Cl.
| | |
|---|---|
| C09K 11/08 | (2006.01) |
| C09K 11/77 | (2006.01) |
| H05B 33/12 | (2006.01) |
| H01L 33/50 | (2010.01) |

(52) U.S. Cl.
CPC ......... C09K 11/7774 (2013.01); C09K 11/0883 (2013.01); C09K 11/7706 (2013.01); C09K11/7734 (2013.01); C09K 11/7737 (2013.01); C09K 11/7792 (2013.01); H01L 33/502 (2013.01); H05B 33/12 (2013.01); H01L 2224/48091 (2013.01); H01L 2224/48247 (2013.01)
USPC .................................................. 252/301.4 F

(58) Field of Classification Search
USPC ....... 252/301.4 F, 301.4 R, 301.6 R; 313/467, 313/468, 483, 487, 503
See application file for complete search history.

(56) References Cited

U.S. PATENT DOCUMENTS

| | | | |
|---|---|---|---|
| 7,297,293 B2 | 11/2007 | Tamaki et al. | |
| 7,470,378 B2 | 12/2008 | Hirosaki | |
| 7,494,606 B2 | 2/2009 | Takahashi et al. | |
| 7,608,200 B2 | 10/2009 | Seto et al. | |
| 8,398,890 B2 * | 3/2013 | Seto et al. | 252/301.4 F |
| 8,574,459 B2 * | 11/2013 | Seto et al. | 252/301.4 F |
| 2003/0094893 A1 * | 5/2003 | Ellens et al. | 313/503 |
| 2006/0049414 A1 | 3/2006 | Chandran et al. | |
| 2009/0134775 A1 | 5/2009 | Watanabe et al. | |
| 2009/0140205 A1 | 6/2009 | Kijima et al. | |
| 2010/0052515 A1 | 3/2010 | Watanabe et al. | |
| 2012/0256533 A1 | 10/2012 | Seto et al. | |
| 2013/0147344 A1 * | 6/2013 | Won et al. | 313/503 |
| 2014/0246623 A1 * | 9/2014 | Takashina et al. | 252/301.4 F |

FOREIGN PATENT DOCUMENTS

| | | |
|---|---|---|
| JP | 61-283681 | 12/1986 |
| JP | 10-190066 | 7/1998 |
| JP | 2003-206481 | 7/2003 |
| JP | 2004-238505 | 8/2004 |
| JP | 2006-232868 | 9/2006 |
| JP | 2006-257326 | 9/2006 |
| JP | 2007-326914 | 12/2007 |
| JP | 2008-88362 | 4/2008 |
| KR | 10-2004-0093374 | 11/2004 |
| KR | 10-2006-0115354 | 11/2006 |
| WO | WO 2006/025261 A1 | 3/2006 |
| WO | WO 2006/106948 A1 | 10/2006 |
| WO | WO 2009/017206 | 2/2009 |

OTHER PUBLICATIONS

Kohsei Takahashi, et al., "Luminescence Properties of JEM Blue Phosphor and their Application White Light-Emitting Diodes", Summery of the 316th Speech by Phosphor Research Society, 1997, pp. 23-32 and 1-16, with English translation.

H. Huppertz, et al., "Synthesis Crystal Structure, and Properties of Nitridosilicates SrYbSi$_4$N$_7$ and BaYbSi$_4$N$_7$", Z. anorg. Allg. Chem., vol. 623, Feb. 1997, pp. 212-217 and 1 additional page.

Huppertz, H., Doctoral thesis, "Barium—europium—ytterbium—nitridosilicat BaEu(Ba$_{0.6}$Eu$_{0.6}$)YbSi$_6$N$_{11}$," University of Bayreuth, 1997, pp. 56-71 and 156-171.

Extended European Search Report issued on Jan. 28, 2011, in Patent Application No. 08739780.8.

Michael Woike, et al., "Preparation and Crystal Structure of the Nitridosilicates Ln$_3$Si$_6$N$_{11}$ (Ln=La, Ce, Pr, Nd, Sm) and LnSi$_3$N$_5$ (Ln=Ce, Pr, Nd)", Inorganic Chemistry, American Chemical Society, vol. 34, No. 21, XP-002610912, 1995, pp. 5105-5108.

Korean Office Action dated Jan. 16, 2012, to Korean Application No. 2009-7018346 (with English Translation).

\* cited by examiner

*Primary Examiner* — Carol M Koslow
*Assistant Examiner* — Lynne Edmondson
(74) *Attorney, Agent, or Firm* — Oblon, McClelland, Maier & Neustadt, L.L.P.

(57) ABSTRACT

To provide a new phosphor of which fluorescence contains much red light component and has a large full width at half maximum, the crystal phase represented by the formula [I] is included in the phosphor.

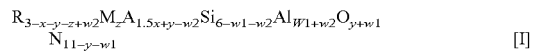

$$R_{3-x-y-z+w2}M_zA_{1.5x+y-w2}Si_{6-w1-w2}Al_{w1+w2}O_{y+w1}N_{11-y-w1} \quad [I]$$

(R represents La, Gd, Lu, Y and/or Sc, M represents Ce, Eu, Mn, Yb, Pr and/or Tb, A represents Ba, Sr, Ca, Mg and/or Zn, and x, y, z, w1 and w2 are the numeric values in the following ranges:

$(1/7) \leq (3-x-y-z+w2)/6 < (1/2)$, $0 < (1.5x+y-w2)/6 < (9/2)$, $0 < x < 3$, $0 \leq y < 2$, $0 < z < 1$, $0 \leq w1 \leq 5$, $0 \leq w2 \leq 5$, and $0 \leq w1+w2 \leq 5$).

7 Claims, 13 Drawing Sheets

——— Example I-8 (excited by 460-nm light)
- - - - Y$_3$Al$_5$O$_{12}$:Ce (excited by 460-nm light)
—·—· Comparative Example I-1 (excited by 340-nm light)

US 8,992,797 B2

PHOSPHOR AND PRODUCTION METHOD THEREOF, PHOSPHOR-CONTAINING COMPOSITION, LIGHT EMITTING DEVICE, ILLUMINATING DEVICE, DISPLAY, AND NITROGEN-CONTAINING COMPOUND

CROSS REFERENCE TO RELATED APPLICATION

This application is a continuation application of U.S. application Ser. No. 12/588,519, filed on Oct. 19, 2009, which is a Continuation-in Part-Application of PCT/JP08/056,673, filed on Apr. 3, 2008, and claims priority to the following applications: Japanese Application No 2007-109270 filed Apr. 18, 2007.

TECHNICAL FIELD

The present invention relates to a phosphor comprising a nitrogen-containing compound such as complex nitride or oxynitride and a production method thereof, to a phosphor-containing composition, and to a light emitting device, a display and an illuminating device using the same. More particularly, it relates to a phosphor that emits yellow green to orange light when irradiated with light from an excitation light source such as a semiconductor luminous element, which serves as a first luminous body, to a phosphor-containing composition comprising the same, to a high-efficiency light emitting device, a display, and an illuminating device using the same, and to a nitrogen-containing compound.

BACKGROUND ART

Though nitrides are inferior to oxides in facilitation of production, not a few of them are known to have characteristics which oxides or other inorganic compounds do not have. Actually, such binary system nitrides as $Si_3N_4$, BN, AlN, GaN and TiN are used for various purposes such as substrate material, semiconductor, light emitting diode (hereinafter abbreviated as "LED" as appropriate), structural ceramics and coating agent, and in industrial-scale production.

In addition, large numbers of new substances of ternary or higher nitrides are in production in these years. Among them, phosphor materials with superior characteristics made of particularly oxynitrides or multinary nitrides based on silicon nitride have been developed recently. It is known that these phosphor materials emit yellow to red light when excited by a blue LED or a near-ultraviolet LED.

Such combinations of those phosphors and a blue or near-ultraviolet LED can constitute a light emitting device emitting white light.

For example, Patent Document 1 discloses a white light emitting device in which a blue LED or LD chip of nitride-based semiconductor is combined with a cerium-activated yttrium aluminium garnet phosphor of which Y is partly substituted with Lu, Sc, Gd, or La. The white light emitting device can produce a white light by combining a blue light, generated from the LED, and a yellow light, generated from the phosphor. The white light emitting device is already in practical use for display or the like.

A phosphor comprising a Ce-activated nitride or oxynitride with a JEM-phase silicon oxynitride as the host material is known (Non-Patent Document 1).

In addition, as another phosphor having a nitride as the host material, $La_3Si_6N_{11}$:Ce is known (Patent Document 2).

Moreover, as known nitrides containing an alkaline-earth metal element, a trivalent rare-earth element and silicon, $SrYbSi_4N_7$ and $BaYbSi_4N_7$ are known to have a space group of $P6_3mc$ (Non-Patent Document 2), and $BaEu(Ba_{0.5}Eu_{0.5})YbSi_6N_{11}$ is known to have a space group of $P2_13$ (Non-Patent Document 3).

[Patent Document 1] Japanese Patent Laid-Open Publication No. Hei 10-190066

[Patent Document 2] Japanese Patent Laid-Open Publication No. 2003-206481

[Non-Patent Document 1] Preprints of Meeting, 316th, Phosphor Research Society, pp. 23

[Non-Patent Document 2] Zeitschrift fur Anorganische undAllgemeine Chemie, 1997, vol. 623, pp. 212

[Non-Patent Document 3] H. Huppertz, a thesis for a doctorate, Bayreuth Univ., 1997

DISCLOSURE OF THE INVENTION

Problem to Be Solved by the Invention

However, the white light emitting device disclosed in Patent Document 1 has a problem of low color rendering of the light emitted, for the use of an illuminating device. Namely, the aforementioned cerium-activated yttrium aluminium garnet phosphors have little red light component in the emission spectrum. Accordingly, it has been difficult to realize a illumination light with low color temperature and high color rendering, like "warm white" (JIS Z8110) of fluorescent lamps, which is a color felling warm, by combination of a cerium-activated yttrium aluminium garnet phosphor and a blue LED. Therefore, a phosphor that shows more red light component than cerium-activated yttrium aluminium garnet phosphors and of which emission spectrum has a large full width at half maximum has been desired.

However, the luminescent color of the phosphor described in Non-Patent Document 1 ranges from blue to green. The phosphor described in Patent Document 2 emits a blue light. Regarding Non-Patent Documents 2 and 3, there are no descriptions about features of their phosphors. In the result, the above-mentioned problem can not be solved by previously known phosphors such as those described in Patent Documents 1 and 2, Non-Patent Documents 1 to 3, and the like.

The present invention has been made to solve the above problems. The object thereof is to provide a new phosphor with large full width at half maximum and a production method thereof, a phosphor-containing composition, a light emitting device, a display and an illuminating device using the phosphor, and also a nitrogen-containing compound used for the phosphor.

Means for Solving the Problem

The inventors of the present invention have made an intensive investigation to solve the above problems. In consequence, they have found a totally new nitrogen-containing compound, such as nitride, oxynitrides or the like, and they have found that a phosphor having a crystal phase of that nitrogen-containing compound can exhibit a remarkably excellent characteristics as a high-performance yellow green to orange phosphor and is preferably used for a light emitting device or the like. In addition, they also investigated the production method thereof, which led to the completion of the present invention.

Namely, the phosphor of the present invention (I) is a phosphor including a crystal phase represented by the formula [I] (claim 1).

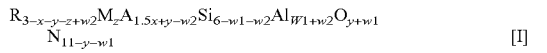
[I]

(In the formula [I],
R represents at least one kind of a rare-earth element selected from the group consisting of La, Gd, Lu, Y and Sc,
M represents at least one kind of a metal element selected from the group consisting of Ce, Eu, Mn, Yb, Pr and Tb,
A represents at least one kind of a bivalent metal element selected from the group consisting of Ba, Sr, Ca, Mg and Zn, and
x, y, z, w1 and w2 are the numeric values in the following ranges:

$(1/7) \leq (3-x-y-z+w2)/6 < (1/2)$, $0 < (1.5x+y-w2)/6 < (9/2)$, $0 < x < 3$, $0 \leq y \leq 2$, $0 < z < 1$, $0 \leq w1 \leq 5$, $0 \leq w2 \leq 5$, and $0 \leq w1+w2 \leq 5$.)

In this case, it is preferable for the phosphor of the present invention (I) that the wavelength of emission peak when excited with light of 460-nm wavelength is 480 nm or longer (claim 2).

Further, it is preferable for the phosphor of the present invention (I) that the color coordinates x and y, in CIE standard colorimetric system, of the luminescent color when excited with light having 460-nm wavelength are in the ranges of $0.420 \leq x \leq 0.600$ and $0.400 \leq y \leq 0.570$, respectively (claim 3).

The phosphor of the present invention (II) is a phosphor including a crystal phase represented by the formula [II] below and produced using, as at least a part of the raw material, an alloy containing two or more kinds of the metal elements that are included in said crystal phase (claim 4).

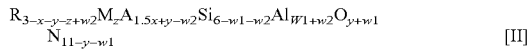
[II]

(In the formula [II],
R represents at least one kind of a rare-earth element selected from the group consisting of La, Gd, Lu, Y and Sc,
M represents at least one kind of a metal element selected from the group consisting of Ce, Eu, Mn, Yb, Pr and Tb,
A represents at least one kind of a bivalent metal element selected from the group consisting of Ba, Sr Ca, Mg and Zn, and
x, y, z, w1 and w2 are the numeric values in the following ranges:

$(1/7) \leq (3-x-y-z+w2)/6 < (1/2)$, $0(1.5x+y-w2)/6 < (9/2)$, $0 \leq x < 3$, $0 \leq y < 2$, $0 < z < 1$, $0 \leq w1 \leq 5$, $0 \leq w2 \leq 5$, and $0 \leq w1+w2 \leq 5$.)

In this case, it is preferable for the phosphor of the present invention (II) that the wavelength of emission peak when excited with light of 460-nm wavelength is 480 nm or longer (claim 5).

Further, it is preferable for the phosphor of the present invention (II) that the emission spectrum when excited with light of 460-nm wavelength satisfies the formula [B] below (claim 6).

$I(B)/I(A) \leq 0.88$ [B]

(In the above formula [B],
I(A) represents the emission intensity of the maximum peak wavelength that is present in the wavelength range of 500 nm or longer and 550 nm or shorter, and I(B) represents the emission intensity of the wavelength that is longer than the maximum peak wavelength by 45 nm.)

Further, it is preferable for the phosphor of the present invention (II) that in the powder X-ray diffraction pattern measured with CuKα line (1.54184 Å), a peak exists at 2θ from 17° to 20°, and the peak intensity ratio I, related to a peak present at 2θ from 21° to 24°, is 0.05 or smaller (claim 7).

The above-mentioned peak intensity ratio I is, in the powder X-ray diffraction pattern at 2θ ranging from 10° to 60°, the ratio of height $I_p$ of the peak, present at 2θ from 21° to 24°, to height $I_{max}$ of the most-intensive peak, present at 2θ from 17° to 20°, and the values of the peak intensities are used after background correction.

Further, it is preferable for the phosphor of the present invention (II) that in the above-mentioned formula [II], x and y satisfy $0 < (1.5x+y-w2)/6 < (9/2)$ and $0 < x < 3$ (claim 8).

Further, it is preferable for the phosphor of the present invention (II) that the color coordinates x and y, in CIE standard colorimetric system, of the luminescent color when excited with light having 460-nm wavelength are in the ranges of $0.320 \leq x \leq 0.600$ and $0.400 \leq y \leq 0.570$ (claim 9).

Further, it is preferable for the phosphor of the present invention (II) that the full width at half maximum of the emission peak when excited with light of 460-nm wavelength is 100 nm or longer (claim 10).

The production method of the present invention is a production method of a phosphor including a crystal phase represented by the above-mentioned formula [II], using, as at least a part of the raw material, an alloy containing two or more kinds of the metal elements that are included in said crystal phase, and comprising a step of nitriding in which the alloy is fired in a nitrogen-containing atmosphere (claim 11).

In this case, it is preferable that the alloy and a nitride are used as the raw material (claim 12).

The phosphor-containing composition of the present invention comprises the above-mentioned phosphor (I) and/or phosphor (II) and a liquid medium (claim 13).

The light emitting device of the present invention comprises: a first luminous body and a second luminous body that emits visible light when irradiated with light from said first luminous body, wherein said light emitting device comprises, as said second luminous body, a first phosphor including at least one kind of the above-mentioned phosphor (I) and/or phosphor (II) (claim 14).

In this case, it is preferable that the light emitting device of the present invention comprises, as said second luminous body, a second phosphor including at least one kind of a phosphor of which wavelength of emission peak is different from that of said first phosphor (claim 15).

The illuminating device of the present invention comprises a light emitting device of the present invention (claim 16).

The display of the present invention comprises a light emitting device of the present invention (claim 17).

The nitrogen-containing compound of the present invention includes a crystal phase represented by the above-mentioned formula [I] (claim 18).

Advantageous Effect of the Invention

According to the present invention, a new phosphor that can emit a fluorescence containing a large amount of red component and having a large full width at half maximum, a phosphor-containing composition, a light emitting device, an illuminating device and a display using the phosphor, and also a nitrogen-containing compound used for the phosphor can be achieved.

In addition, the phosphor produced by the production method of the present invention is excellent in its luminescent characteristics such as emission intensity.

BRIEF DESCRIPTION OF THE DRAWINGS

FIG. 2(*a*) shows a typical example of the light emitting device generally called a shell type. FIG. 2(*b*) shows a typical example of the light emitting device generally called a surface-mount type.

Both FIG. 7(*a*) and FIG. 7(*b*) are graphs showing the characteristics of the phosphor prepared in Example I-18 of the present invention. FIG. 7(*b*) shows the emission spectrum.

EXPLANATION OF LETTERS OR NUMERALS

Figure 1:
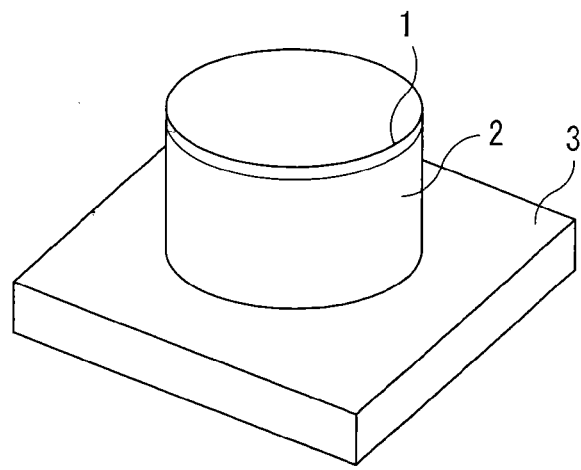
FIG. 1 is a schematic perspective view illustrating the positional relationship between the first luminous body, which functions as the excitation light source, and the second luminous body, a component functioning as the phosphor-containing part that contains a phosphor, in an example of the light emitting device of the present invention.

1 phosphor-containing part (second luminous body)
2 surface-emitting type GaN-based LD (excitation light source, first luminous body)
3 substrate
4 light emitting device
5 mount lead
6 inner lead
7 excitation light source (first luminous body)
8 phosphor-containing resinous part
9 conductive wire
10 mold member
11 surface-emitting illuminating device
12 holding case
13 light emitting device
14 diffusion plate
22 excitation light source (first luminous body)
23 phosphor-containing resinous part (phosphor-containing part, second luminous body)
24 frame
25 conductive wire
26 electrode
27 electrode

BEST MODES FOR CARRYING OUT THE INVENTION

An embodiment of the present invention will be explained in detail below. It is to be understood that the present invention is not limited to the following embodiment and any modification can be added thereto insofar as they do not depart from the scope of the present invention.

All the relationships between color names and their color coordinates in the present Description comply with the Japanese Industrial Standards (JIS Z8110 and Z8701).

Each composition formula of the phosphors in this Description is punctuated by a comma (,). Further, when two or more elements are juxtaposed with a comma (,) in between, one kind of or two or more kinds of the juxtaposed elements can be contained in the composition formula in any combination and in any composition. For example, a composition formula, "(Ca, Sr, Ba)$Al_2O_4$:Eu", inclusively indicates all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu" and "Ca$_{1-x-y}$Sr$_x$Ba$_y$Al$_2$O$_4$:Eu" (here, in these formulae, $0<x<1$, $0<y<1$, $0<x+y<1$).

[1. Phosphor (I)]
[1-1. Crystal phase of phosphor (I)]

The present inventors made a search for nitrides and oxynitrides of rare-earth elements, alkaline-earth metals and Si, for obtaining a new phosphor. As a consequence, they have found a substance including a crystal phase with a composition range represented by the general formula [I] below.

Namely, the phosphor of the present invention (I) includes a crystal phase represented by the general formula [I] below.

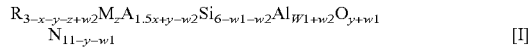

$$R_{3-x-y-z+w2}M_zA_{1.5x+y-w2}Si_{6-w1-w2}Al_{w1+w2}O_{y+w1}N_{11-y-w1} \quad [I]$$

(In the general formula [I], R represents at least one kind of a rare-earth element selected from the group consisting of La, Gd, Lu, Y and Sc. M represents at least one kind of a metal element selected from the group consisting of Ce, Eu, Mn, Yb, Pr and Tb. A represents at least one kind of a bivalent metal element selected from the group consisting of Ba, Sr, Ca, Mg and Zn. And, x, y, z, w1 and w2 are the numeric values in the following ranges:

$(1/7) \leq (3-x-y-z+w2)/6 < (1/2)$, $0 < (1.5x+y-w2)/6 < (9/2)$, $0 < x < 3$, $0 \leq y < 2$, $0 < z < 1$, $0 \leq w1 \leq 5$, $0 \leq w2 \leq 5$, and $0 \leq w1+w2 \leq 5$.)

In the following, explanation will be given on the crystal phase represented by the general formula [I] in more detail.

Regarding R:

In the general formula [I], R represents at least one kind of a rare-earth element selected from the group consisting of La, Gd, Lu, Y and Sc. Among them, R is preferably at least one kind of a rare-earth element selected from the group consisting of La, Lu and Y. Particularly, it is preferably La.

As R, either a single kind of rare-earth element can be used, or a combination of two or more kinds of them can be used in any combination and in any ratio. By using two or more kinds of rare-earth elements as R, the excitation wavelength and luminous wavelength of the phosphor of the present invention (I) can be adjusted.

However, when the R consists of two or more kinds of elements, it is preferable that the R includes at least one kind of a rare-earth element (this will be referred to as "the first element") selected from the group consisting of La, Lu and Y and the ratio of the first element used relative to the total amount of R is usually 70 mole percent or larger, preferably 80 mole percent or larger, and particularly preferably 95 mole percent or larger. In this case, the ratio of the elements other than the first element (this will be referred to as "the second element") of the above-mentioned R is therefore usually 30 mole percent or smaller, preferably 20 mole percent or smaller, and particularly preferably 5 mole percent or smaller. This makes it possible to improve the emission intensity.

Regarding M:

In the general formula [I], M represents at least one kind of a metal element selected from the group consisting of Ce, Eu, Mn, Yb, Pr and Tb. In this context, M serves as an activation element. As the M, either one kind of the above-mentioned metal elements can be used, or two or more kinds of them can be used in any combination and in any ratio.

Among them, it is preferable that the M includes at least Ce from the standpoint of good emission efficiency and wavelength of emission peak. It is more preferable that only Ce is used as M.

In the phosphor of the present invention (I), at least a part of Ce, an activation element, is present in a state of trivalent cation. Ce, the activation element, can be of trivalent or tetravalent valence. However, in this case, it is preferable that the content of trivalent cations is higher. Specifically, the content ratio of $Ce^{3+}$ to the whole amount of Ce is usually 20 mole percent or more, preferably 50 mole percent or more, more preferably 80 mole percent, and particularly preferably 90 mole percent or more.

In the same way as Ce, cations of different valences of the respective activation elements other than Ce, namely, Eu, Mn, Yb, Pr and Tb, may also coexist. In such a case, for each element, it is preferable that the content of $Eu^{2+}$, $Mn^{2+}$, $Yb^{2+}$, $Pr^{3+}$ and $Tb^{2+}$ is higher. For $Eu^{2+}$, $Mn^{2+}$ and $Pr^{3+}$, the preferable content is the same as that described above for $Ce^{3+}$ specifically. For $Yb^{2+}$ and $Tb^{2+}$, the content of bivalent cations to the whole amount of respective elements is usually 10 mole percent or more, preferably 20 mole percent or more, more preferably 40 mole percent, and still more preferably 60 mole percent or more, specifically.

The content of $Ce^{3+}$ to the whole amount of Ce contained in the phosphor of the present invention (I) can be examined by a measurement for its X-ray absorption fine structure, for example. Namely, the content can be decided quantitatively from the areas of each-separated absorption peaks of $Ce^{3+}$ and $Ce^{4+}$, which can be obtained by a measurement for the L3-absorption edge of Ce atom. The content of $Ce^{3+}$ to the whole amount of Ce contained in the phosphor of the present invention (I) can be decided also by a measurement of electron spin resonance (ESR). For the above-mentioned M, the ratio of atoms having desired valence can be decided in the same way as Ce by a measurement of its X-ray absorption fine structure.

Regarding A:

In the general formula [I], A represents at least one kind of a bivalent metal element selected from the group consisting of Ba, Sr, Ca, Mg and Zn. Among them, A is preferably at least one kind of a bivalent metal element selected from the group consisting of Sr, Ca and Mg. It is more preferably selected from Ca and Mg. It is still more preferably Ca. As the above-mentioned A, either one kind of these elements can be used or two or more kinds of them can be used in any combination and in any ratio.

The fundamental system of the crystal phase represented by the above-mentioned general formula [I] is such that R and A coexists in a surrounding $SiN_4$ tetrahedron. In the crystal phase represented by the above-mentioned general formula [I], bivalent A can be increased by decreasing trivalent R (this substitution will be hereinafter referred to as "R-A substitution"). However, the amount of increase in A does not correspond just to the amount of decrease in R, but to 1.5 times of the amount thereof, causing charge compensation, which is a unique feature of the present crystal phase.

In addition, in the phosphor of the present invention (I), a part of R may be substituted with A in a manner other than the above-mentioned R-A substitution. In that case, N-anions are substituted with O-anions by the number of R substituted.

Regarding Si and Al:

Moreover, in the above-mentioned fundamental system of the crystal phase, a part of Si may be substituted with Al. This is why Al is appeared in the general formula [I]. In that case, N-anions are substituted with O-anions, and/or bivalent A is substituted with trivalent R.

Regarding Range of x:

In the general formula [I], 1.5x is a numerical value representing the amount of A substituted for a part of R by the above-mentioned R-A substitution. The numerical value of x in this case is larger than 0, preferably 0.002 or larger, more preferably 0.01 or larger, still more preferably 0.03 or larger, and smaller than 3, preferably 2.7 or smaller, more preferably 2.5 or smaller, still more preferably 2.2 or smaller. This is because a concentration quenching may occur, when the content of the activation element is too large.

Regarding Range of y:

In the general formula [I], y is a numerical value representing the amount of A substituted for a part of R in the way other than the above-mentioned R-A substitution. The smaller the numerical value of y is, the more preferable. Specifically, it is usually 0 or larger, preferably 0.01 or larger, and usually 2 or smaller, preferably 1.9 or smaller, more preferably 1.5 or smaller, still more preferably 0.6 or smaller.

Regarding Range of z:

In the general formula [I], z is a numerical value representing the amount of the activation element M. It is larger than 0, preferably 0.002 or larger, more preferably 0.005 or larger, and smaller than 1, preferably 0.5 or smaller, more preferably 0.4 or smaller. When the value z is too large, the emission intensity may be lowered due to a concentration quenching.

Regarding Ranges of w1 and w2:

In the general formula [I], the number of moles of Al substituted is represented by w1 and w2. The range of w1 is usually 0 or larger, preferably 0.1 or larger, more preferably 0.2 or larger, and usually 5 or smaller, preferably 2 or smaller, more preferably 1 or smaller, still more preferably 0.5 or smaller. The range of w2 is also usually 0 or larger, preferably 0.1 or larger, more preferably 0.2 or larger, and usually 5 or smaller, preferably 2 or smaller, more preferably 1 or smaller, still more preferably 0.5 or smaller. Substitution with Al can adjust the color tone of the luminescent color of the phosphor of the present invention (I). In addition, w1 and w2 within the above-mentioned ranges respectively can adjust the luminescent color with the crystal structure remaining the same.

Regarding Conditions to be Satisfied by x, y and z:

In addition, in the general formula [I], the above-mentioned x, y and z satisfy the following two inequalities.

$(1/7) \leq (3-x-y-z+w2)/6 < (1/2)$ $0 < (1.5x+y-w2)/6 < (9/2)$

That is, in the general formula [I], "$(3-x-y-z+w2)/6$" represents a numerical value of 1/7 or larger and 1/2 or smaller.

Also in the general formula [I], "$(1.5x+y-w2)/6$" represents a numerical value of larger than 0 and smaller than 9/2.

Regarding Range of y+w1:

In the general formula [I], the number of moles of oxygen (namely, y+w1) is preferably smaller than 2, more preferably smaller than 1.7, and still more preferably smaller than 1.5, from the standpoint of emission intensity. On the other hand, the number of moles of oxygen (namely, y+w1) is preferably larger than 0.05, more preferably larger than 0.1, from the standpoint of ease of manufacture.

Regarding Range of w1+w2: Furthermore, in the general formula [I], the number of moles of Al (namely, w1+w2) is usually 5 or smaller, preferably 3 or smaller, more preferably 1 or smaller, from the standpoint of emission intensity. The lower limit thereof is, from the standpoint of ease of manufacture, preferably close to 0, and particularly preferably 0.

Examples of Chemical Composition

Preferable examples of the chemical composition of the above-mentioned general formula [I] will be listed below. However, the crystal phase composition of the phosphor of the present invention (I) is not limited to the following examples.

Preferable examples of the chemical composition of the general formula [I] with which oxygen is not mixed include: $La_{1.37}Ce_{0.03}Ca_{2.40}Si_6N_{11}$, $La_{2.15}Ce_{0.10}Ca_{1.23}Si_6N_{11}$, and $La_{2.57}Ce_{0.03}Ca_{0.60}Si_6N_{11}$, Preferable examples in which oxygen is present include: $La_{1.71}Ce_{0.1}Ca_{1.57}Si_6O_{0.44}N_{10.56}$, $La_{1.71}Ce_{0.03}Ca_{2.20}Si_6O_{1.00}N_{10.00}$, and $La_{2.37}Ce_{0.03}Ca_{0.75}Si_6O_{0.30}N_{10.70}$.

Regarding Space Group and Powder X-Ray Diffraction Pattern of Crystal Phase:

The crystal phase represented by the above-mentioned general formula [I] is essentially a new structure (with respect to its space group and site constituent ratio) among alkaline-earth metal element—rare-earth metal element (letting it "Ln")—Si—N systems. In the following, explanation will be given on the difference between this crystal phase and crystal phases of known substances.

The crystal phase represented by the above-mentioned general formula [I] is of P4bm or analogous space group, whereas known $SrYbSi_4N_7$ and $BaYbSi_4N_7$ are of $P6_3mc$ space group (refer to Non-Patent Document 2) and known $BaEu(Ba_{0.5}Eu_{0.5})YbSi_6N_{11}$ is of $P2_13$ space group (refer to Non-Patent Document 3). In this way, the space group of the crystal phase represented by the general formula [I] is significantly different from those of previously known phosphors. In addition, the powder X-ray diffraction pattern of the crystal phase represented by the general formula [I] is significantly different from those of previously known phosphors. This apparently indicates that they have different crystal structures from each other since crystal phases can be examined based on the powder X-ray diffraction patterns.

The crystal phase represented by the above-mentioned general formula [I] has a unique site constituent ratio in which the total number of cations with smaller valence than Si, surrounded by $SiN_4$ tetrahedron, relative to the number of $SiN_4$ tetrahedron is over 3/6. On the other hand, in known Ce-activated $La_3Si_6N_{11}$, the total number of cations with smaller valence than Si, surrounded by $SiN_4$ tetrahedron, relative to the number of $SiN_4$ tetrahedron is equal to 3/6 (refer to Patent Document 2). And, in known $LnAl(Si_{6-z}Al_z)N_{10-z}O_z$:Ce phosphor, the total number of cations with smaller valence than Si, surrounded by $Si(or Al)N(or O)_4$ tetrahedron, relative to the number of $Si(or Al)N(or O)_4$ tetrahedron is equal to 2/6 (refer to Patent Document 1). In this way, the crystal phase represented by the above-mentioned general formula [I] is apparently different from those of previously known phosphors in the constituent ratio of each site, which characterizes the crystal structure.

Figure 5:
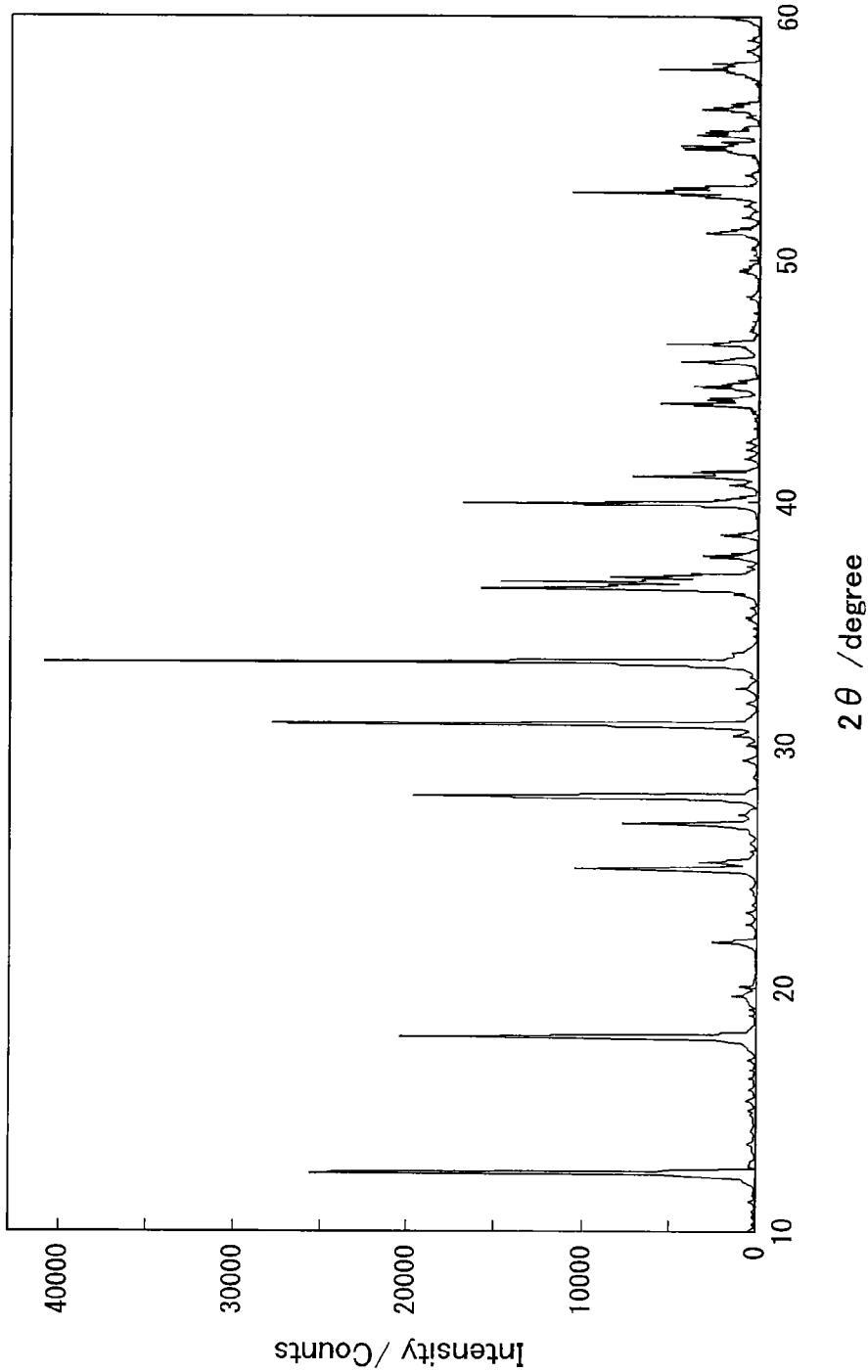
FIG. 5 is a graph showing the powder X-ray diffraction pattern of the phosphor, which was washed with aqua regia, of Example I-8 of the present invention.

FIG. 5 shows an example (it corresponds to Example 8 to be described later) of powder X-ray diffraction pattern of the phosphor of the present invention (I). FIG. 5 shows a pattern obtained by a measurement of a cluster of particles with no orientation. In the phosphor of the present invention, of which crystal is tetragonal or analogous system and space group is P4bm and analogous group, there is a tendency that the relative intensity of the 110 plane peak to the 001 plane peak, assuming that it is a tetragonal system, increases with increasing content of the A element such as Ca. It is known that the basic composition of crystal phase of the phosphor of the present invention (I) is $Ca_{1.5x}La_{3-x}Si_6N_{11}$ by an elemental analysis on a sample obtained by washing its single phase.

This indicates that the peak intensity of the 110 plane is significantly increased relatively because, in the chemical formula of $Ca_{1.5x}La_{3-x}Si_6N_{11}$, the $Ca^+$ La site exceeds 3 (=3+ 0.5x) and thus a site different from La site of $La_3Si_6N_{11}$ phase inevitably appears. Therefore, $Ca_{1.5x}La_3Si_6N_{11}$ is a new crystal phase that is different from $La_3Si_6N_{11}$ phase.

Other Points of Crystal Phase of the General Formula [I]:

In the phosphor of the present invention (I), a part of the constituent elements of the crystal phase represented by the above-mentioned formula [I] may be substituted with a defect or another kind of element, insofar as its performance is not deteriorated. Examples of the another kind of element are as follows.

For example, in the general formula [I], M site may be substituted with at least one kind of transition metal element or rare-earth element selected from the group consisting of Nd, Sm, Dy, Ho, Er and Tm. Among them, substitution of Sm and/or Tm, which are rare-earth elements, is preferable.

Furthermore, in the general formula [I], a part of or entire Al may be substituted with B, for example. When the phosphor of the present invention (I) is produced by firing the material in a BN container, a phosphor in which Al is substituted with B as described above can be produced. This is because B may be mixed into the resultant phosphor then.

In addition, in the general formula [I], O and/or N sites may be substituted with negative ions of S, Cl and/or F, for example.

Moreover, in the general formula [I], a part of Si may be substituted with Ge and/or C. The substitution rate is preferably 10 mole percent or lower, more preferably 5 mole percent or lower, and still more preferably O mole percent.

Because no significant reduction in emission intensity occurs, each site of R, A, Si, Al, O and N in the general formula [I] may be substituted with some elements in 5 mole percent or lower, or may have defects in 10 mole percent or lower. However, it is preferable that both of them are 0 mole percent.

At this point, it is preferable that the present phosphor (I) consists of the crystal phase with the chemical composition of the above-mentioned general formula [I] as a whole, in order to remarkably achieve the advantageous effect of the present invention.

[1-2. Characteristics of Phosphor (I)]

There is no limitation on the characteristics of the phosphor of the present invention (I) insofar as it comprises the crystal phase represented by the above-mentioned general formula [I]. However, it usually has such properties as described below.

[1-2-1. Characteristics on Luminescent Color of Phosphor (I)]

The phosphor of the present invention (I) usually emits yellow to orange light. Namely, the phosphor of the present invention (I) is usually a yellow to orange phosphor.

The color coordinates (x,y) of the fluorescence of the phosphor of the present invention (I) is usually within the area surrounded by (0.420, 0.400), (0.420, 0.570), (0.600, 0.570), and (0.600, 0.400). It is preferably within the area surrounded by (0.440, 0.430), (0.440, 0.530), (0.580, 0.530), and (0.580, 0.430). Accordingly, the color coordinate x of the fluorescence of the phosphor of the present invention (I) is usually 0.420 or larger, preferably 0.440 or larger, and usually 0.600 or smaller, preferably 0.580 or smaller. On the other hand, the color coordinate y is usually 0.400 or larger, preferably 0.430 or larger, and usually 0.570 or smaller, preferably 0.530 or smaller.

The color coordinate of fluorescence can be calculated from the emission spectrum to be described later. In this context, the above-mentioned color coordinates (x,y) mean those in the CIE standard colorimetric system of the luminescent color when excited with light having 460-nm wavelength.

[1-2-2. Characteristics on Emission Spectrum]

There is no special limitation on the spectrum (emission spectrum) of the fluorescence emitted by the phosphor of the present invention (I). In view of its use as yellow to orange phosphor, the wavelength of emission peak of the emission spectrum when excited with light of 460-nm wavelength is in the range of usually 480 nm or longer, preferably 560 nm or longer, more preferably 565 nm or longer, still more preferably 570 nm or longer, and usually 680 nm or shorter, preferably 650 nm or shorter, more preferably 625 nm or shorter.

In addition, the full width at half maximum (full width at half maximum, hereinafter referred to as "FWHM" as appropriate) of the emission peak of the phosphor of the present invention (I), when excited with light of 460-nm wavelength, is usually 130 nm or longer, preferably 140 nm or longer, more preferably 145 nm or longer. Such a large full width at half maximum can enhance the color rendering of the light emitting device or the like which uses the phosphor of the present invention (I) and a blue LED or the like in combination. In addition, since the phosphor of the present invention (I) has a sufficient emission intensity also at longer wavelength region (namely, around 630 nm to 690 nm) than that of yellow light, a warm white light can be obtained when incorporated with a blue LED. This characteristic of the phosphor of the present invention (I) is much superior to that of known YAG:Ce phosphors (the FWHM of commercially available P46-Y3 is 126 nm). There is no special limitation on the upper limit to the full width at half maximum of the emission peak, but usually it is 280 nm or smaller.

The measurement of the emission spectrum of the phosphor of the present invention (I) and the calculation of its light emitting area, wavelength of emission peak, and full width at half maximum of the peak can be carried out by, for example, using a fluorescence measurement apparatus manufactured by JASCO corporation at a room temperature (usually, 25° C.)

[1-2-3. Excitation Wavelength]

The phosphor of the present invention (I) can be excited by lights having a variety of wavelengths (excitation wavelengths) depending on the composition or the like of the phosphor of the present invention (I). It is usually excited by lights having wavelength ranges of near-ultraviolet region to blue region preferably. A specific range of the excitation wavelength is usually 300 nm or longer, preferably 340 nm or longer, and usually 500 nm or shorter, preferably 480 nm or shorter.

[1-2-4. Weight-Average Median Diameter]

It is preferable that the weight-average median diameter of the phosphor of the present invention (I) is in the range of usually 0.1 µm or larger, preferably 0.5 µm or larger, and usually 30 µm or smaller, preferably 20 µm or smaller. When the weight-average median diameter is too small, the brightness tends to decrease and the phosphor particles tend to aggregate. On the other hand, when the weight-average median diameter is too large, unevenness in coating, clogging in a dispenser, and the like tend to occur.

[1-2-5. Chemical Resistance]

The phosphor of the present invention (I) is also superior in chemical resistance usually. For example, in the phosphor of the present invention (I), the crystal phase represented by the above-mentioned general formula [I] is not dissolved in aqua regia, an extremely strong agent in acid strength, and it can emit a fluorescence even after immersed in aqua regia. Therefore, the phosphor of the present invention (I) can be used under a variety of environments, which is highly useful industrially.

[1-2-6. Temperature Characteristics]

The phosphor of the present invention (I) is also superior in temperature characteristics usually. Specifically, the ratio of the maximum emission peak intensity value at 130° C. in the emission spectral map relative to the maximum emission peak intensity value at 25° C. is usually 60% or more, preferably 65% or more, and particularly preferably 70% or more, when irradiated with a light having wavelength of 455 nm.

Furthermore, though this ratio of usual phosphors rarely exceeds 100% because its emission intensity decreases with increasing temperature, it can exceed 100% for some reason. However, over 150% of that ratio tends to lead to color shift due to the temperature change.

The above-mentioned temperature characteristics can be examined as follows, for example, using an emission spectrum measurement device of multi-channel spectrum analyzer, MCPD7000, manufactured by Otsuka Electronics Co., Ltd., a stage equipped with a cooling mechanism using a peltiert device and a heating mechanism using a heater, and a light source device equipped with a 150-W xenon lamp.

A cell holding the phosphor sample is put on the stage, and the temperature is changed within the range from 20° C. to 180° C. After verifying the surface temperature of the phosphor is held at 25° C. or 130° C., the emission spectrum of the phosphor is measured when it is excited with a light from the light source having wavelength of 455 nm, which is separated using a diffraction grating. Then the emission peak intensity can be decided from the measured emission spectrum. At this point, as the measurement value of the surface temperature of the phosphor on the side irradiated with the excitation light, is used a value corrected by the temperature values measured with a radiation thermometer and a thermocouple.

[1-2-7. Quantum Efficiency]

The external quantum efficiency of the phosphor of the present invention (I) is usually 30% or higher, preferably 35% or higher, more preferably 40% or higher, and particularly preferably 43% or higher.

The higher the external quantum efficiency is, the more preferable, for designing a light emitting device with high emission intensity.

The internal quantum efficiency of the phosphor of the present invention (I) is usually 35% or higher, preferably 40% or higher, more preferably 45% or higher, and still more preferably 50% or higher. In this context, internal quantum efficiency means the ratio of the number of emitted photons to the number of photons in the excitation light that is absorbed into the phosphor. When the internal quantum efficiency is low, the emission efficiency tends to decrease.

Also, the higher the absorption efficiency of the phosphor of the present invention (I) is, the more preferable. It is usually 70% or higher, preferably 75% or higher, and more preferably 80% or higher. Since external quantum efficiency is calculated as the product of internal quantum efficiency and absorption efficiency, the higher the absorption efficiency is, the more preferable, for higher external quantum efficiency.

(Method for Measuring Absorption Efficiency, Internal Quantum Efficiency and External Quantum Efficiency)

In the following, methods for determining the absorption efficiency $\alpha_q$, internal quantum efficiency $\eta_i$ and external quantum efficiency $\eta_o$ of a phosphor will be described.

First, the phosphor sample to be measured (for example in a state of powder or the like) is stuffed up in a cell with its surface smoothed sufficiently to keep high measurement accuracy, and then it is set on a condenser such as an integrating sphere. The reason for using a condenser such as an integrating sphere is to count up all the photons both reflected at and emitted, by a fluorescence phenomenon, from the phosphor sample. In other words, it is to prevent the failure in counting photons going out of the measurement system.

A light emission source for exciting the phosphor is attached on the condenser such as an integrating sphere. This light emission source, an Xe lamp for example, is adjusted using a filter, monochromator (grating monochromator) or the like so that the wavelength of emission peak thereof will be that of a monochromatic light of, for example, 455-nm wavelength. Then the spectrum including those of emitted light (fluorescence) and reflected light is measured, using a spectrometer, such as MCPD2000 or MCPD7000 manufactured by Otsuka Electronics Co., Ltd., for example, by irradiating the phosphor sample to be measured with the light from the light emission source, of which wavelength of emission peak is adjusted. The light, of which spectrum is to be measured here, actually includes, among lights (excitation lights) from the excitation light source, reflected lights that are not absorbed in the phosphor and lights (fluorescences) having the other wavelengths that are emitted by a fluorescence phenomenon from the phosphor which absorbed the excitation light. Namely, the region close to the excitation light corresponds to the reflection spectrum, and the region of which wavelengths are longer the reflection corresponds to the fluorescence spectrum (occasionally referred to as "emission spectrum").

Absorption efficiency $\alpha_q$ takes the value obtained through dividing $N_{abs}$ by N, where $N_{abs}$ is the number of photons of the excitation light that is absorbed in the phosphor sample and N is the number of all the photons in the excitation light.

First, the latter one, the total number N of all the photons in the excitation light is determined as follows. That is, the reflection spectrum $I_{ref}(\lambda)$ is measured using the spectrometer with respect to a substance to be measured having reflectance R of approx. 100% to the excitation light, such as a reflection plate "Spectralon" manufactured by Labsphere (with 98% of reflectance R to an excitation light of 400-nm wavelength), which is attached to the above condenser such as an integrating sphere in the same disposition as the phosphor sample. The value in the following (formula a), calculated from this reflection spectrum $I_{ref}(\lambda)$, is proportional to N.

[Mathematical Formula 1]

$$\frac{1}{R}\int \lambda \cdot I_{ref}(\lambda)d\lambda \qquad \text{(formula a)}$$

The integration of the formula may be performed at only such intervals that $I_{ref}(\lambda)$ takes a substantially significant value. The number $N_{abs}$ of the photons in the excitation light that is absorbed in the phosphor sample is proportional to the amount calculated in the following (formula b).

[Mathematical Formula 2]

$$\frac{1}{R}\int \lambda \cdot I_{ref}(\lambda)d\lambda - \int \lambda \cdot I(\lambda)d\lambda \qquad \text{(formula b)}$$

Here, the function $I(\lambda)$ is a reflection spectrum when the target phosphor sample, of which absorption efficiency $\alpha_q$ is intended to be determined, is attached. The integration interval in (formula b) is set to be the same as in (formula a). By restricting the integration interval as above, the second term in (formula b) becomes corresponding to the number of photons emitted from the measurement object, phosphor sample, by the reflection of the excitation light. In other words, it becomes corresponding to the number of all photons emitted from the measurement object, phosphor sample, except for the number of photons emitted by the fluorescence phenomenon. Since the actual measurement value of the spectrum is generally obtained as digital data which are divided by a certain finite band width relating to λ, the integrations of (formula a) and (formula b) are calculated as finite sum based on the band width.

Consequently, $\alpha_q$ can be calculated as $\alpha_q = N_{abs}/N =$ (formula b)/(formula a).

Next, a method for determining internal quantum efficiency $\eta_i$ will be described. The internal quantum efficiency $\eta_i$ takes the value obtained through dividing $N_{abs}$ by N, where $N_{PL}$ is the number of photons originating from the fluorescence phenomenon and $N_{abs}$ is the number of photons absorbed in the phosphor sample.

Here, $N_{PL}$ is proportional to the amount calculated by the following (formula c).

[Mathematical Formula 3]

$$\int \lambda \cdot I(\lambda) d\lambda \quad \text{(formula c)}$$

At this point, the integration interval is restricted to the wavelength region of photons that are originating from the fluorescence phenomenon of the phosphor sample. This is because contribution of the photons reflected from the phosphor sample should be eliminated from I(λ). Specifically, the lower limit of the integration interval in (formula c) takes the value of upper limit of the integration interval in (formula a), and the upper limit thereof takes the value that is necessary and sufficient for including the photons originating from the fluorescence.

Consequently, the internal quantum efficiency $\eta_i$ can be calculated as $\eta_i =$ (formula c)/(formula b).

Incidentally, the integration from spectra expressed by digital data can be carried out in the same way as when absorption efficiency $\lambda_q$ is calculated.

The external quantum efficiency $\eta_o$ can be decided as a product of the absorption efficiency $\pi_q$ and internal quantum efficiency $\eta_i$, which are obtained as above. In another way, it can be determined using a relation of $\eta_o =$ (formula c)/(formula a). $\eta_o$ takes the value obtained through dividing $N_{PL}$ by N, where $N_{PL}$ is the number of photons originating from the fluorescence and N is the number of total photons in the excitation light.

[1-3. Advantageous Effects of Phosphor of Present Invention (I)]

As described above, the phosphor of the present invention (I) contains much red light component and can emit lights having large full width at half maximums. Namely, the emission intensity of the phosphor of the present invention (I) is sufficient at red, longer wavelength region, and the emission spectrum thereof shows an emission peak with significantly large full width at half maximum.

Accordingly, when the phosphor of the present invention (I) is used for a white light emitting device, the white light emitting device can emit warm white light with high color rendering.

In addition, the phosphor of the present invention (I) can be excited particularly efficiently by a near-ultraviolet or blue semiconductor luminous element and emit yellow to green fluorescence, usually.

Furthermore, in the phosphor of the present invention (I), there is usually less reduction in emission efficiency associated with temperature rising than YAG:Ce phosphors, which have been frequently used for white light emitting devices conventionally.

[1-4. Use of Phosphor of Present Invention (I)]

There is no limitation on the use of the phosphor of the present invention (I). However, it can be used preferably for illuminating devices, displays or the like for example, making use of the above-mentioned advantageous effects. Among them, it is fit for realizing high-power LED lamps for general lighting and particularly fit for warm white LEDs with high brightness, high color rendering, and relatively low color temperature. In addition, since the phosphor of the present invention (I) shows less decrease in emission efficiency accompanying temperature rising as described above, light emitting devices using the phosphor of the present invention (I) can exhibit high emission efficiency, less decrease in emission efficiency accompanying temperature rising, high brightness, and broad range of color reproduction.

The phosphor of the present invention (I) can be used preferably for various light emitting devices (for example, for "light emitting devices of the present invention" to be described later), particularly making the most of such characteristics that it can be excited by a blue light or a near-ultraviolet light. In that case, by adjusting the kind or content of the phosphors used together, light emitting devices having various luminescent colors can be produced. Among them, a combined use of an excitation light source emitting blue light with the phosphor of the present invention (I), which is usually a yellow to orange phosphor, can realize a white light emitting device. In this case, even an emission spectrum that is similarly to so-called pseudo-white (which is the luminescent color of light emitting devices having a blue LED and a phosphor emitting yellow fluorescence (namely, yellow phosphor) in combination, for example) can be obtained.

Furthermore, by adding a red phosphor and, if necessary, a green phosphor to the above-mentioned white light emitting device, a light emitting device that is extremely excellent in red color rendering or that can emit a warm white light can be realized.

When using a near-ultraviolet excitation light source, adding a blue phosphor, red phosphor and/or a green phosphor for adjusting the luminous wavelength in addition to the phosphor of the present invention (I) properly can realize white light sources with desirable luminescent colors.

The luminescent color of the light emitting device is not limited to white. For example when the phosphor of the present invention (I) is used as wavelength conversion material, light emitting devices emitting any color of light can be realized by adding other phosphors or the like to the phosphor of the present invention (I) for adjusting the kind or content of the phosphors. The light emitting devices thus obtained can be used for illuminating devices or illuminant portions (especially, back-lightings of liquid crystal displays) of displays.

Preferable examples of the above-mentioned other phosphor include: phosphors emitting blue, blue green, green, yellow green, red or deep red light. It is particularly preferable to use a blue light emitting diode, as excitation light source, and a green or red phosphor in combination with the phosphor of the present invention (I), because it can realize a white light emitting device. Moreover, a desirable white light emitting device can be realized also by using a near-ultraviolet light emitting diode and a blue phosphor, a red phosphor, and a green phosphor in combination with the phosphor of the present invention (I). By adding a red to deep red phosphor to these white light emitting devices, the color rendering thereof can be further enhanced.

[2. Production Method of Phosphor (I)]

There is no limitation on the production method of the phosphor of the present invention (I); any method can be used. For example, it can be produced by mixing phosphor precursors (mixing step), which were prepared as the raw materials, and firing the mixed phosphor precursors (firing step). In the following, such a production method (hereinafter referred to as "the production method (I) according to the present invention" as appropriate) will be described as an example of the production method of the phosphor of the present invention (I).

[2-1. Preparation of Phosphor Precursors]

Phosphor precursors including material of the M (hereinafter referred to as "M source" as appropriate), material of the R (hereinafter referred to as "R source" as appropriate), material of the A (hereinafter referred to as "A source" as appropriate), material of Si (hereinafter referred to as "Si source" as appropriate), material of Al (hereinafter referred to as "Al source" as appropriate), material of 0 (hereinafter referred to as "0 source" as appropriate), and material of N (hereinafter referred to as "N source" as appropriate) of the aforementioned formula [I] are prepared.

Examples of the M source, R source, A source, Si source and Al source used in the production method (I) according to the present invention include: nitrides, nitrogen-containing compounds such as $Si(NH)_2$, oxides, hydroxides, carbonates, nitrates, sulfates, sulfides, oxalates, carboxylates, halides or the like of each of these M, R, A, Si and Al. Appropriate ones can be selected from these compounds depending on the kind of the firing atmosphere such as nitrogen, hydrogen-containing nitrogen, ammonia, argon or the like.

Examples of the M source can be listed as follows in terms of kinds of M.

Among the above-mentioned M source, examples of the Ce source include: $CeO_2$, $Ce_2(SO_4)_3$, hydrate of $Ce_2(C_2O_4)_3$, $CeCl_3$, $CeF_3$, hydrated of $Ce(NO_3)_3$, CeN and the like. Among them, $CeO_2$ and CeN are preferable.

Examples of the Eu source include: $Eu_2O_3$, $Eu_2(SO_4)_3$, $Eu_2(C_2O_4)_3 \cdot 10H_2O$, $EuCl_2$, $EuCl_3$ and $Eu(NO_3)_3 \cdot 6H_2O$, EuN, EuNH and the like. Among them, $Eu_2O_3$, $EuCl_2$, and the like are preferable. $Eu_2O_3$ is particularly preferable.

Examples of the raw materials of activator elements such as Mn source, Yb source, Pr source, Tb source or the like include: those compounds listed as the examples of the Eu source in which Eu is replaced by Mn, Yb, Pr, Tb or the like, respectively.

Examples of the R source can be listed as follows in terms of kinds of R.

Namely, examples of the La source of the R source include: lanthanum nitride, lanthanum oxide, lanthanum nitrate, lanthanum hydroxide, lanthanum oxalate, and lanthanum carbonate. Of these, lanthanum nitride is preferable.

Examples of the Gd source of the R source include: gadolinium nitride, gadolinium oxide, gadolinium nitrate, gadolinium hydroxide, gadolinium oxalate, and gadolinium carbonate.

In addition, examples of the Lu source of the R source include: lutetium nitride, lutetium oxide, lutetium nitrate, and lutetium oxalate.

Examples of the Y source of the R source include: yttrium nitride, yttrium oxide, yttrium nitrate, yttrium oxalate, and yttrium carbonate.

Further, examples of the Sc source of the R source include: scandium nitride, scandium oxide, scandium nitrate, and scandium oxalate.

Examples of the A source can be listed as follows in terms of kinds of A.

Namely, examples of the Ba source of the A source include: $BaSiN_2$, $Ba_3N_2$, barium carbonate, barium hydroxide, barium oxide, barium nitrate, barium acetate, and barium oxalate. Of these, $BaSiN_2$ and $Ba_3N_2$ are preferable.

Examples of the Sr source include: $SrSiN_2$, $Sr_3N_2$, strontium carbonate, strontium hydroxide, strontium oxide, strontium nitrate, strontium acetate, and strontium oxalate. Of these, $SrSiN_2$ and $Sr_3N_2$ are preferable.

In addition, examples of the Ca source of the A source include: $CaSiN_2$, $Ca_3N_2$, calcium carbonate, calcium hydroxide, calcium oxide, calcium nitrate, calcium acetate, and calcium oxalate. Of these, $CaSiN_2$ and $Ca_3N_2$ are preferable.

Examples of the Mg source of the A source include: $MgSiN_2$, $Mg_3N_2$, basic magnesium carbonate, magnesium oxide, magnesium nitrate, magnesium acetate, and magnesium oxalate. Of these, $MgSiN_2$ and $Mg_3N_2$ are preferable.

In addition, examples of the Zn source of the A source include: $Zn_3N_2$, zinc carbonate, zinc hydroxide, zinc oxide, zinc nitrate, zinc acetate, and zinc oxalate. Of these, $Zn_3N_2$ is preferable.

Examples of the Si source include: $CaSiN_2$, $Si_3N_4$, $SiO_2$, $H_4SiO_4$, $Si(NH)_2$, and $Si(OCOCH_3)_4$. Of these, $CaSiN_2$ and $Si_3N_4$ are preferable.

Regarding $Si_3N_4$, from the standpoint of reactivity, ones of small particle diameters are preferable, and from the standpoint of emission efficiency, ones with high purity are preferable. Further from the standpoint of emission efficiency, $\beta$—$Si_3N_4$ is more preferable than $\alpha$—$Si_3N_4$, and ones containing less carbon atoms, which are impurities, are particularly preferable. The smaller the content of the carbon atoms is, the more preferable. However, it is usually 0.01 weight % or more, and usually 0.3 weight % or less, preferably 0.2 weight % or less, more preferably 0.1 weight % or less, still more preferably 0.05 weight % or less, particularly preferably 0.03 weight % or less. When the content of carbon is large, the host crystals tend to color.

When the host crystals color, the internal quantum efficiency tends to decrease. However, when using $\beta$-silicon nitride containing less carbon atoms such as described above, the internal quantum efficiency and thus the brightness will improve due to reduced coloration of the host crystals.

Examples of the Al source include: AlN, $CaAlSiN_3$, AlON, $Al_2O_3$, Al, aluminium hydroxide, and aluminium nitrate.

In addition, examples of the R source, A source, Si source, Al source, and M source include: respective metal R, A, Si, Al, and M, and alloys of them.

An example of the N source is nitrogen from the atmosphere such as hydrogen-containing nitrogen atmosphere or ammonia which is used when producing the phosphor of the present invention (I). In that case, all of the above-mentioned compounds can be used as the R source, A source, Si source, Al source and M source respectively, but it is preferable to use nitrogen-containing compounds of the above-mentioned ones for them.

Or otherwise, nitrogen-containing compounds of the above-mentioned R source, A source, Si source, Al source, and M source examples can be used as the N source, when the phosphor of the present invention (I) is produced in a nitrogen atmosphere at a pressure of about 10 atmospheres or an argon atmosphere.

Furthermore, nitrogen gas can be used as the nitrogen source, when the phosphor of the present invention (I) is produced in a nitrogen atmosphere at such a high pressure as far beyond 10 and 2000 or lower atmospheres. In this case, respective metal R, A, Si, Al, and M, and alloys of them can be used for example as the R source, A source, Si source, Al source, and M source. The nitrogen pressure in this case is preferably 40 atmospheres or higher, and more preferably 80 atmospheres or higher from the standpoint of emission intensity. In view of ease in industrial production, it is preferably 500 atmospheres or lower, and more preferably 200 atmospheres or lower.

Examples of the O source include oxygen-containing compounds of the above-mentioned R source, A source, Si source, Al source, and M source.

Each of the M sources, R sources, A sources, Si sources, Al sources, O sources and N sources can be used either as a single kind thereof or as two or more kinds of them in any combination and in any ratio. A certain phosphor precursor can be two or more of the M source, R source, A source, Si source, Al source, O source or N source at the same time.

Of the above-mentioned various phosphor precursors, it is preferable to use ones of high purity with a high degree of whiteness in order to heighten the emission efficiency of the resultant phosphor (I). Specifically, it is preferable to use phosphor precursors whose reflectances in the wavelength region of from 380 nm to 780 nm are 60% or higher, preferably 70% or higher, more preferably 80% or higher. In particular, at 525 nm, which is close to the wavelength of emission peak of the phosphor of the present invention (I), the reflectances of the phosphor precursors are preferably 60% or higher, more preferably 70% or higher, still more preferably 80% or higher, particularly preferably 90% or higher.

Of all the plurality of phosphor precursors, $Si_3N_4$ in particular is preferably of high reflectance. As $Si_3N_4$ having such reflectance, those whose contents of carbon atoms, which are contained as impurities, are within the above-mentioned range can be used.

The reflectance can be determined by measuring reflectance spectrum. The method of measurement is the same as what is described for the previously-mentioned absorption efficiency, internal quantum efficiency and external quantum efficiency.

Of the impurities contained in the phosphor precursors, each content of Fe, Co, Cr or Ni in the phosphor precursor is usually 1000 ppm or lower, preferably 100 ppm or lower, more preferably 50 ppm or lower, still more preferably 10 ppm or lower, and particularly preferably 1 ppm or lower.

In addition, the oxygen concentration in each phosphor precursor is usually 1000 ppm or lower, preferably 100 ppm or lower, more preferably 50 ppm or lower, still more preferably 10 ppm or lower, and particularly preferably 1 ppm or lower.

The weight-average median diameter ($D_{50}$) in each phosphor precursor is usually 0.1 μm or larger, preferably 0.5 μm or larger, and usually 30 μm or smaller, preferably 20 μm or smaller, more preferably μm or smaller, still more preferably 3 μm or smaller. For that purpose, pulverization may be carried out preliminarily with a dry-type pulverizer such as a jet mill depending on the kind of the phosphor precursor. In this way, each phosphor precursor is dispersed homogenously in the mixture and the reactivity of the solid state reaction of the mixture can be heightened due to increased surface area of the phosphor precursor, thereby making it possible to inhibit impurity phase generation.

Particularly for a nitride phosphor precursor, it is preferable to use one having smaller particle diameter than the other kind of phosphor precursors from the standpoint of reactivity.

For a phosphor precursor with deliquescence, it is preferable to use anhydrides.

[2-2. Mixing Step]

The phosphor precursors are weighed out so as to give desired composition, mixed well, transferred to a container such as a crucible, and fired at a predetermined temperature in a predetermined atmosphere. The phosphor of the present invention (I) can be obtained by pulverizing and washing the fired product.

No particular limitation is imposed on the method of mixing the M source, R source, A source, Si source, Al source, O source and N source. The examples include the following methods (A) and (B).

(A) Dry-type mixing methods in which the phosphor precursors such as M source, R source, A source, Si source, Al source, O source and N source are pulverized and mixed by combining pulverization, which is done by means of a dry-type pulverizer such as a hammer mill, roll mill, ball mill and jet mill, or pestle/mortar, and mixing, which is done by means of a mixing apparatus such as ribbon blender, V type blender and Henschel mixer, or pestle/mortar.

(B) Wet-type mixing method in which solvent or dispersion medium such as water is added to the phosphor precursors such as M source, R source, A source, Si source, Al source, O source and N source, and mixing is done by means of a pulverizer, pestle/mortar or evaporation dish/stirring rod, to make a solution or slurry, followed by drying by such method as spray drying, heated drying or air drying. It is difficult to use this method for phosphor precursors that can not be present stably as a solution.

Concerning various conditions for those mixing methods, known conditions, such as using two kinds of balls having different particle diameters mixed in a ball mill, can be selected as appropriate.

The phosphor precursors are mixed preferably within an $N_2$ glove box with controlled moisture content using a mixer in order not to deteriorate the nitride material due to moisture. The moisture content of the workplace for mixing is usually 10000 ppm or lower, preferably 1000 ppm or lower, more preferably 10 ppm or lower, and still more preferably 1 ppm or lower. The oxygen content of the same workplace is usually 1 ppm or lower, preferably 10000 ppm or lower, more preferably 1000 ppm or lower, still more preferably 100 ppm or lower, and particularly preferably 10 ppm or lower.

The phosphor precursors may be sieved at the time of above-mentioned mixing if necessary. In such a case, various kinds of commercially available sieves can be used. However, sieves made of a resin such as nylon mesh are more preferable than those of metal mesh for preventing contamination with impurities.

In addition, it is preferable that nitrides are dispersed homogenously in the mixture of the phosphor precursors in that case so as to enhance reactivity of the solid state reaction of the mixture and prevent impurity phases from generating. In order to carry out it specifically, for example, phosphor precursors other than the nitrides are mixed, fired and pulverized preliminarily, followed by mixing the nitrides and firing the mixture. Using nitrides that are preliminarily pulverized with a dry-type pulverizer such as a jet mill as a phosphor precursor is particularly preferable because the surface areas of the nitride powders are increased and thus the reactivity of the solid state reaction of the nitrides is enhanced. The methods exemplified above may be employed singly, but preferably they are employed in some combination.

[2-3. Firing Step]

The firing step is usually done by filling the mixture of the phosphor precursors such as M source, R source, A source, Si source, Al source, O source and N source obtained in the above-mentioned mixing step into a heat-resistant vessel such as a crucible or a tray which is made of material unlikely to react with each phosphor precursor and firing them.

Material examples of such heat-resistant vessels used for such a firing step include: ceramics such as alumina, quartz, boron nitride, silicon nitride, silicon carbide, magnesium and mullite; metals such as platinum, molybdenum, tungsten, tantalum, niobium, iridium and rhodium; alloys mainly constituted of these metals; and carbon (graphite).

Among them, heat-resistant vessels made of boron nitride, alumina, silicon nitride, silicon carbide, platinum, molybdenum, tungsten, or tantalum are preferable. Ones made of boron nitride or molybdenum is more preferable. Particularly preferable are alumina ones that are stable even at firing temperatures in a nitrogen-hydrogen reducing atmosphere. However, when using phosphor precursors which react with alumina, boron nitride heat-resistant vessels can be preferably used.

The filling rates (hereinafter referred to as "filling rate into heat-resistant vessel") at which the phosphor precursors are filled into the above-mentioned heat-resistant vessels differ depending on the firing condition or the like. However, the rate may be such that the pulverization of the fired product will not be difficult at the post-treatment steps to be described later. Therefore, it is usually 10 volume % or larger, and usually 90 volume % or smaller. Meanwhile, there are gaps between the particles of the phosphor precursors filled in a crucible. The volume of the phosphor precursors themselves per 100 ml in which the phosphor precursors are filled is usually 10 ml or larger, preferably 15 ml or larger, more preferably 20 ml or larger, and usually 50 ml or smaller, preferably 40 ml or smaller, more preferably 30 ml or smaller.

When a large amount of phosphor precursors is treated at one time, it is preferable to make heat distributed uniformly within the heat-resistant vessel for example by decelerating the temperature rising rate.

The filling rate (hereinafter referred to as "filling rate into furnace" as appropriate) at which the heat-resistant vessels are filled into a furnace is preferably such that the heat-resistant vessels will be heated in the furnace uniformly.

When a large number of heat-resistant vessels are fired in the firing furnace, it is preferable to distribute heat uniformly to each heat-resistant vessel, for example by decelerating the above-mentioned temperature rising rate, for the uniformity of firing.

There is no limitation on the firing temperature (the maximum heating temperature) insofar as the phosphor of the present invention (I) can be obtained. However, it is usually 1300° C. or higher, preferably 1700° C. or higher, more preferably 1800° C. or higher, and usually 2300° C. or lower, preferably 2200° C. or lower. When the firing temperature is too low or too high, generation of the crystal phase of the present invention tends to be difficult.

Meanwhile, when the nitrogen contained in the atmosphere gas is used as the N source of the phosphor (I) as described earlier, the firing temperature is usually 1300° C. or higher, preferably 1400° C. or higher, more preferably 1450° C. or higher, and usually 2300° C. or lower, preferably 2200° C. or lower.

A part of firing treatment is preferably carried out under a reduced pressure condition on the way of temperature rising. Specifically, the reduced pressure condition (specifically, $10^{-2}$ Pa or higher and 0.1 MPa or lower as usual) is preferably provided at a certain point of time at the temperature that is preferably the room temperature or higher, and preferably 1500° C. or lower, more preferably 1200° C. or lower, still more preferably 1000° C. or lower. Particularly, it is preferable to perform the temperature rising with an inert gas or reducing gas, to be described later, introduced in the system after reducing the pressure in the system.

During the pressure reduction, the temperature may be retained if necessary at a desired value for 1 minute or longer, preferably 5 minutes or longer, and more preferably 10 minutes or longer. The upper limit of the retention period is usually 5 hours or shorter, preferably 3 hours or shorter, and more preferably 1 hour or shorter.

The pressure at the time of firing varies depending on the firing temperature or the like; however, it is usually the normal pressure in the interest of convenience and facilitation. However, it is usually 3 atmospheres or higher, preferably 4 atmospheres or higher, and more preferably 8 atmospheres or higher, when the firing atmosphere is nitride.

The firing time (retention period at the maximum heating temperature) depends on the temperature or pressure at the time of firing. However, it is in the range of usually 10 minutes or longer, preferably 1 hour or longer, and usually 24 hours or shorter, preferably 10 hours or shorter. It is preferable to decide whether the evacuation of the furnace is necessary before firing or not in light of properties of the raw materials.

There is no special limitation on the atmosphere at the time of firing insofar as the phosphor of the present invention (I) can be obtained; however, it is preferable that the firing is carried out in an atmosphere with low oxygen concentration. This is because the content of the oxygen in the resultant phosphor (I) can be controlled then. The oxygen concentration at the time of firing is preferably 100 ppm or lower, more preferably 50 ppm or lower, and particularly preferably 20 ppm or lower. It is ideally preferable that no oxygen exists. It is preferable that the atmosphere used for firing is selected appropriately in accordance with the kind of the materials. Examples thereof include: inert gases such as mixed gas of nitrogen and hydrogen, ammonia gas, argon, carbon monoxide, carbon dioxide; and mixed gases in which two or more kind of them are mixed. Among them, nitrogen gas or mixed gas of nitrogen and hydrogen is preferable.

As the above-mentioned nitrogen ($N_2$) gas, it is preferable that the one with the purity of 99.90 or higher is used.

When a hydrogen gas is used, the hydrogen content in the atmosphere is preferably 1 volume % or larger, more preferably 2 volume % or larger, and preferably 5 volume % or smaller. This is because, when the content of hydrogen in the atmosphere is too high, safety may not be guaranteed, and when it is too low, sufficient reducing atmosphere may not be secured.

The above-mentioned atmosphere gas can be introduced either before starting the temperature rising or in the course of the temperature rising. Or otherwise, it can be introduced at the firing temperature. It is particularly preferable to introduce it before or in the course of the temperature rising. When the firing is carried out under a flow of such an atmosphere, the flow rate is usually 0.1 L/min to 10 L/min.

In addition, it is preferable that the phosphor precursors are treated in an atmosphere containing less moisture or oxygen in the steps before the firing for example from weighing each phosphor precursor to filling the phosphor precursors into a crucible or the like, from the standpoint of controlling the oxygen content of the phosphor (I).

When a large number of firing vessels are fired in the firing furnace in the above-mentioned firing step, it is preferable to distribute heat uniformly to each firing vessel, for example by decelerating the above-mentioned temperature rising rate, in the interest of uniformity of firing.

When carbon monoxide or cyanide is generated as a by-product in the firing, it is preferable to replace the gas in the firing furnace with nitrogen or another inert gas while the temperature decreases after completing the firing. In the course of temperature decrease, a step may be provided where a specific temperature is retained, if necessary.

The firing may be carried out either in one step or in two or more steps separately. For example, it may be divided into the primary firing and the secondary firing. In such a case, the mixture of materials obtained in the mixing step may be subjected to the primary firing first, and after pulverized using a ball mill or the like, subjected to the secondary firing. It is preferable to perform the secondary firing as appropriate because the emission intensity may be enhanced by performing the secondary firing. The conditions of the secondary firing can be decided in the same way as the above-mentioned firing conditions in general. However, the firing temperature (maximum heating temperature) is preferably lower than that of the primary firing.

[2-4. Flux]

In the firing step, flux may be added to the reaction system in order to secure growth of good quality crystals. No particular limitation is imposed on the kind of flux. The examples include: ammonium halides such as $NH_4Cl$ and $NH_4F \cdot HF$; alkali metal carbonates such as $Na_2CO_3$ and $LiCO_3$; alkali metal halides such as LiCl, NaCl, KCl, CsCl, LiF, NaF, KF and CsF; alkaline-earth metal halides such as $CaCl_2$, $BaCl_2$, $SrCl_2$, $CaF_2$, $BaF_2$, $SrF_2$, $MgCl_2$ and $MgF_2$; alkaline-earth metal oxides such as BaO; boron oxides such as $B_2O_3$, $H_3BO_3$ and $NaB_4O_7$; boric acid and boric acid salts of alkali metals or alkaline-earth metals; phosphates such as $Li_3PO_4$ and $NH_4H_2PO_4$; aluminum halides such as $AlF_3$; zinc compounds such as zinc halides like $ZnCl_2$ and $ZnF_2$, and zinc oxides; compounds of the 15th group elements of the periodic table such as $Bi_2O_3$; and nitrides of alkali metals, alkaline earth metals or the 13th group elements such as $Li_3N$, $Ca_3N_2$, $Sr_3N_2$, $Ba_3N_2$ and BN. Other examples of the flux include: halides of rare-earth elements such as $LaF_3$, $LaCl_3$, $GdF_3$, $GdCl_3$, $LuF_3$, $LuCl_3$, $YF_3$, $YCl_3$, $ScF_3$, and $ScCl_3$; and oxides of rare-earth elements such as $La_2O_3$, $Gd_2O_3$, $Lu_2O_3$, $Y_2O_3$, and $Sc_2O_3$. Of these, halides are preferable. Particularly preferable are alkali metal halides, alkaline-earth metal halides, Zn halides, and rare-earth element halides. Of these halides, fluorides and chlorides are preferable. For the above-mentioned fluxes with deliquescence, it is preferable to use their anhydrides.

These fluxes can be used either as a single one or as a mixture of two or more kinds in any combination and in any ratio.

When the phosphor (I) is produced by multiple firing (namely, multiple steps of firing), the flux may be added at the primary firing or the secondary firing. However, it is preferable to add it at the secondary firing. Particularly for fluxes with deliquescence, it is preferable to add it in a firing step as late as possible.

The amount of flux used differs depending on the kind of the materials or compounds used as the flux. It is preferably in the range of usually 0.01 weight % or more, preferably 0.1 weight % or more, more preferably 0.3 weight % or more, and usually 20 weight % or less, preferably 5 weight % or less, relative to the entire raw materials. When the amount of the flux used is too small, the effect of flux may not be exhibited. When the amount of the flux used is too large, the effect of flux may be saturated, or it may be taken up into the host crystals, leading possibly to change in the luminescent color, decrease in the brightness, and deterioration of the firing furnace.

[2-5. Post-Treatment]

Steps other than described above can be carried out in the production method (I) according to the present invention if necessary. For example, a pulverization step, washing step, classification step, surface treatment step, drying step or the like can be carried out if necessary after the above-mentioned firing step.

Pulverization Step

In the pulverization step, pulverizers such as a hammer mill, roll mill, ball mill, jet mill, ribbon blender, V type blender, and Henschel mixer, or pestle/mortar can be used, for example. For the sake of, for example, crushing the secondary particles while preventing destruction of the phosphor crystals generated, it is preferable to perform a ball milling using, for example, a container made of alumina, silicon nitride, $ZrO_2$, glass or the like and balls made of the same material as the container, iron-core urethane, or the like in the container for on the order of 10 minutes to 24 hours. In this case, a dispersant such as an organic acid or a alkaline phosphate like hexametaphosphate can be used at 0.05 weight % to 2 weight %.

Washing Step

Washing can be done using, for example, water such as deionized water, organic solvent such as ethanol, or alkaline aqueous solution such as ammonia water. Further, water solutions of inorganic acids such as hydrochloric acid, nitric acid, sulfuric acid, aqua regia, or a mixture of hydrofluoric acid and sulfuric acid; or water solutions of organic acids such as acetic acid can be used, for example for the purpose of removing an impurity phase, such as the flux used, attached to the phosphor and improving the luminescent characteristics. The phosphor of the present invention (I) tends to be removed of the impurity phase efficiently and improved in the emission intensity by washing it with a strong acid such as aqua regia. In such a case, it is preferable that, after washing with an acidic aqueous solution, an additional washing with water is carried out.

It is preferable to perform washing to the extent that the pH of the supernatant fluid obtained by dispersing the fired product, after washing it, in water which is 10 times as heavy as the phosphor and leaving it to stand for 1 hour becomes neutral (pH of around 5 to 9). This is because a deviation toward basicity or acidity of the above-mentioned supernatant fluid may adversely affect the liquid medium to be described later or the like when the phosphor is mixed with the liquid medium.

The above-mentioned degree of washing can also be indicated by the electric conductivity of the supernatant fluid that is obtained by dispersing the washed phosphor in water which is 10 times as heavy as the phosphor and leaving it to stand for 1 hour.

The lower the electric conductivity is, the more preferable, from the standpoint of higher luminescent characteristics. However, also in consideration of the productivity, it is preferable to repeat the washing treatments until the electric conductivity is usually 10 mS/m or lower, preferably 5 mS/m or lower, and more preferably 4 mS/m or lower.

The method for measuring the electric conductivity is as follows. The phosphor particles, which have larger specific gravity than water, are allowed to precipitate spontaneously, by leaving them to stand for 1 hour after they are stirred for dispersion in water which is 10 times as heavy as the phosphor for a predetermined period of time, for example, 10 minutes. The electric conductivity of the supernatant fluid at that time may be measured using a conductance meter, "EC METER CM-30G", manufactured by DKK-TOA CORPORATION or the like. There is no special limitation on the water used for the washing treatment and measurement of the electric conductivity, but desalted water or distilled water is preferable. Among them, the one having low electric conductivity is particularly preferable. Its electric conductivity should be usually 0.0064 mS/m or higher, and usually 1 mS/m or lower, preferably 0.5 mS/m or lower. The measurement of the electric conductivity is usually carried out at a room temperature (around 25° C.).

Classification Step

Classification treatment can be done by, for example, levigation, or using various classifiers such as air current classifier or vibrating sieve. Particularly, a dry classification using a nylon mesh can be preferably used to obtain the phosphor of good dispersibility with weight-average median diameter of about 10 μm.

In addition, combination of a dry classification using nylon mesh and elutriation treatment can obtain the phosphor of good dispersibility with weight-average median diameter of about 20 μm.

In a levigation or elutriation treatment, in order for phosphor particles to be dispersed in an aqueous medium at a concentration of around 0.1 weight % to 10 weight % and also to prevent the degradation of the phosphor, the pH of the aqueous medium is set at usually 4 or larger, preferably 5 or larger, and usually 9 or smaller, preferably 8 or smaller. In addition, for achieving the phosphor with weight-average median diameter such as described above by a levigation or elutriation treatment, it is preferable to perform two-step sieving in which, for example, particles of 50 μm or smaller are sifted out and then particles of 30 μm or smaller are sifted out, in terms of balance between the operating efficiency and the yield. Regarding the lower limit of sieving, it is preferable to sift out particles of usually 1 μm or larger, and preferably 5 μm or larger.

Surface Treatment Step

When the obtained phosphor of the present invention (I) is used to manufacture a light emitting device, the surface of the phosphors may be subjected to surface treatment if necessary such as covering the surfaces with some foreign compound, in order to improve weatherability such as moisture resistance or to improve dispersibility in a resin in the phosphor-containing part of the light emitting device described later.

Examples of the substance that can be applied to the phosphor surface (hereinafter referred to as "surface treatment substance" as appropriate) include: organic compounds, inorganic compounds, and glass materials.

Examples of the organic compounds include: thermofusible polymer such as acrylic resin, polycarbonate, polyamide and polyethylene; latex; and polyorganosiloxane.

Examples of the inorganic compounds include: metal oxides such as magnesium oxide, aluminum oxide, silicon oxide, titanium oxide, zirconium oxide, tin oxide, germanium oxide, tantalum oxide, niobium oxide, vanadium oxide, boron oxide, antimony oxide, zinc oxide, yttrium oxide and bismuth oxide; metal nitrides such as silicon nitride and aluminum nitride; orthophosphates such as calcium phosphate, barium phosphate and strontium phosphate; polyphosphate; and combinations of calcium salt and phosphates of alkali metals and/or alkaline-earth metals such as a combination of calcium nitrate and sodium phosphate.

Examples of the glass material include: boron silicate, phosphorus silicate, and alkali silicate.

These surface treatment substances can be used either as a single one or as a combination of two or more kinds in any combination and in any ratio.

The phosphor of the present invention (I) obtained by the surface treatment mentioned above has a surface treatment substance existing on its surface. The mode of existence of the surface treatment substance can be as follows, for example.

(i) The above surface treatment substance constitutes a continuous layer and covers the surface of the phosphor.

(ii) The above surface treatment substance is attached to the surface of the phosphor as numerous microparticles and these microparticles cover the surface of the phosphor.

There is no special limitation on the amount of the surface treatment substance which can cover or be attached to the surface of the phosphor, insofar as the advantage of the present invention is not significantly impaired. However, the amount, relative to the weight of the phosphor, is usually 0.1 weight % or more, preferably 1 weight % or more, more preferably 5 weight % or more, still more preferably 10 weight % or more, and usually 50 weight % or less, preferably 30 weight % or less, more preferably 20 weight % or less. When the amount of the surface treatment substance relative to that of the phosphor is too large, the luminescent characteristics of the phosphor may be impaired. When it is too small, the coverage of the surface may be insufficient, and moisture resistance and dispersibility may not be improved.

There is no special limitation on the film thickness (layer thickness) of the surface treatment substance formed by the surface treatment, insofar as the advantage of the present invention is not significantly impaired. However, it is usually 10 nm or larger, preferably 50 nm or larger, and usually 2000 nm or smaller, preferably 1000 nm or smaller. When the layer is too thick, the luminescent characteristics of the phosphor may be impaired. When it is too thin, the coverage of the surface may be insufficient, and moisture resistance and dispersibility may not be improved.

No particular limitation is imposed on the method of such surface treatment. The examples include the following coating treatment method using a metal oxide (silicon oxide).

The phosphor of the present invention (I) is added to an alcohol such as ethanol, mixed and stirred. To this is added an alkaline aqueous solution such as ammonia water, followed by stirring. A hydrolyzable silicic acid alkyl ester such as tetraethyl orthosilicate is then added and the mixture is stirred. The solution obtained is allowed to stand for 3 to 60 minutes, and then the supernatant containing silicon oxide particles which remain unattached to the surface of the phosphor is removed by pipetting or the like. Then, mixing in alcohol, stirring, allowing to stand and removal of the supernatant are repeated several times and a drying is performed under a reduced pressure at 120° C. to 150° C. for 10 minutes to 5 hours, for example 2 hours. Thereby, a surface-treated phosphor is obtained.

Examples of other surface treatment methods of phosphors include: various known methods such as a method in which spherical silicon oxide fine powder is attached to the phosphor (Japanese Patent Laid-Open Publications No. Hei 2-209989 and No. Hei 2-233794), a method in which a coating film of Si-compound is attached to the phosphor (Japanese Patent Laid-Open Publication No. Hei 3-231987), a method in which the surface of the phosphor is covered with polymer microparticles (Japanese Patent Laid-Open Publication No. Hei 6-314593), a method in which the phosphor is coated with organic, inorganic, glass and the like materials (Japanese Patent Laid-Open Publication No. 2002-223008), a method in which the surface of the phosphor is covered by means of chemical vapor reaction (Japanese Patent Laid-Open Publication No. 2005-82788), and a method in which particles of a metal compound is attached (Japanese Patent Laid-Open Publication No. 2006-28458).

[2-6. Production Method Using Alloy]

The phosphor of the present invention (I) can be produced by, in addition to the above-mentioned production method using the above raw materials, a production method using alloy as material.

As refinement technologies of elemental metals that are widely utilized industrially, sublimation refining, floating zone refining, distillation method and the like are known. As such, there are many elemental metals that can be purified easier than compounds. Accordingly, a method in which elemental metals necessary for producing a phosphor are used as starting materials for forming alloy and the phosphor is produced from the alloy is superior to the method using compounds as material, in that material of higher purity can be easily obtained. In addition, from the viewpoint of homogeneous dispersion of activator element within the crystal lattice, elemental metal can be used advantageously as constituent elements for the activator element. This is because by melting the elemental metal to form alloy the activator element can be easily dispersed uniformly.

From the above standpoint, by using, as raw material, alloy containing at least a part of the metal elements that constitute the desirable phosphor, preferably containing all the metal elements that constitute the desirable phosphor, it is possible to produce a high-performance phosphor industrially. In what follows, explanation will be given on an example of the production method (alloy method) using such alloy as raw material.

In the alloy method, alloy that can be used as material for the phosphor is first prepared. To obtain the alloy, starting material such as a simple substance is usually melted. There is no limitation on the melting method and various known methods such as arc melting or high-frequency dielectric melting can be used.

As the material alloy, any ones can be used insofar as the phosphor of the present invention (I) can be obtained. The alloy can be used either as a single kind or as a mixture of two or more kinds in any combination and in any ratio. It is particularly preferable to use an appropriate combination of alloy phases that are present stably such as $LaSi_2$, $Ce_xLa_{1-x}Si_2$ (where, $0<x<1$), $LaSi$, $La_3Si_2$, $La_5Si_3$, $Ca_{24}Si_{60}$, $Ca_{28}Si_{60}$, $CaSi_2$, $Ca_{31}Si_{60}$, $Ca_{14}Si_{19}$, $Ca_3Si_4$, $CaSi$, $Ca_5Si_3$, and $Ca_2Si$.

Other examples of the alloy that can be used as the material are as follows. Known examples of the alloy containing Si and alkaline-earth metal include: $Ca_7Si$, $Ca_2Si$, $Ca_5Si_3$, $CaSi$, $Ca_2Si_2$, $Ca_{14}Si_{19}$, $Ca_3Si_4$, $SrSi$, $SrSi_2$, $Sr_4Si_7$, $Sr_5Si_3$, and $Sr_7Si$. Known examples of the alloy containing Si, aluminum and alkaline-earth metal include: $Ca(Si_{1-x}Al_x)_2$, $Sr(Si_{1-x}Al_x)_2$, $Ba(Si_{1-x}Al_x)_2$, and $Ca_{1-x}Sr_x(Si_{1-y}Al_y)_2$. Of these, $A^1(B^1{}_{0.5}Si_{0.5})_2$ (where, $A^1$=(Ca, Sr, Ba) and $B^1$=(Al, Ga)) has been studied regarding its superconductivity and reported in such references as Japanese Patent Laid-Open Publication (Kokai) No. 2005-54182, M. Imai, Applied Physics Letters, 80 (2002) 1019-1021, and M. Imai, Physical Review B, 68, (2003), 064512, or the like.

Alloy in the form of a lump can hardly react to be formed into phosphor, and therefore it is preferable to adjust its particle diameter to a predetermined level by performing a pulverization. The preferable particle diameter is in the range of usually 1 μm or larger and 500 μm or smaller. Even if there is heterogeneity in the alloy, homogenization will be achieved by this pulverization process from a macroscopic viewpoint. However, it is not yet desirable that there is heterogeneity in its particle composition microscopically. Therefore, it is preferable that the alloy is homogeneous as a whole.

The alloy powder thus obtained is usually filled into a vessel such as a crucible or a tray, and placed in a heating furnace in which control of the atmosphere is possible. Concerning the material of the vessel, sintered boron nitride is desirable because it has low reactivity with metal compounds.

Subsequently, a gas containing nitrogen is passed until the atmosphere of the system is sufficiently replaced with the gas. If considered necessary, the gas may be passed after the air is evacuated from the system first. For the case of production of an oxynitride, a mixed gas of nitrogen and oxygen can also be used.

Then, the phosphor of the present invention (I) can be prepared by firing the alloy powder. At this point, it is desirable that the above-mentioned alloy powder is fired with its volume filling rate maintained at 40% or lower. The volume filling rate can be calculated by the formula: (bulk density of the mixed powder)/(theoretical density of the mixed powder)×100[%].

Incidentally, nitride formation reaction of metals is usually an exothermic reaction. Accordingly, there is a possibility that the alloys melt again due to reaction heat liberated suddenly and its surface areas decrease, while producing phosphor by the alloy method. Such a reduction in the surface area may lead to a delay in reaction between the alloy and the nitrogen gas. Therefore, in an alloy method, it is preferable to maintain a reaction rate that does not allow melting of the alloy for producing a high-performance phosphor in a stable manner.

[3. Phosphor (II)]

[3-1. Crystal Phase of Phosphor (II)]

The present inventors made a search for nitrides and oxynitrides of rare-earth elements and Si, for obtaining a new phosphor. As a consequence, they have found a substance including a crystal phase with a composition range represented by the general formula [II] below.

Namely, the phosphor of the present invention (II) includes a crystal phase represented by the general formula [II] below.

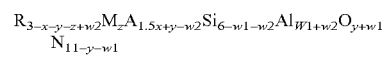

$$R_{3-x-y-z+w2}M_zA_{1.5x+y-w2}Si_{6-w1-w2}Al_{w1+w2}O_{y+w1}N_{11-y-w1} \quad \text{[II]}$$

(In the formula [II], R represents at least one kind of a rare-earth element selected from the group consisting of La, Gd, Lu, Y and Sc. M represents at least one kind of a metal element selected from the group consisting of Ce, Eu, Mn, Yb, Pr and Tb. A represents at least one kind of a bivalent metal element selected from the group consisting of Ba, Sr, Ca, Mg and Zn. And, x, y, z, w1 and w2 are the numeric values in the following ranges:

$(1/7) \le (3-x-y-z+w2)/6 < (1/2)$, $0 \le (1.5x+y-w2)/6 < (9/2)$, $0 \le x < 3$, $0 \le y \le 2$, $0 < z < 1$, $0 \le w \le 5$, $0 \le w1+w2 \le 5$, and $0 \le w1+w2 \le 5$.)

In the following, explanation will be given on the crystal phase represented by the general formula [II] in more detail.

The points of the general formula [II] are the same as those already explained for the crystal phase of the general formula [I], except for the points on the range of "x", the range of (1.5x+y)/6, the examples of the chemical composition, and the space group and powder X-ray diffraction pattern of the crystal phase.

Namely, the R of the general formula [II] is in the same way as described in the section of "Regarding R" of the general formula [I].

The M of the general formula [II] is in the same way as described in the section of "Regarding M" of the general formula [I].

The A of the general formula [II] is in the same way as described in the section of "Regarding A" of the general formula [I].

The Si and Al of the general formula [II] are in the same way as described in the section of "Regarding Si and Al" of the general formula [I].

The y of the general formula [II] is in the same way as described in the section of "Regarding range of y" of the general formula [I].

The z of the general formula [II] is in the same way as described in the section of "Regarding range of z" of the general formula [I].

The w1 and w2 of the general formula [II] are in the same way as described in the section of "Regarding range of w1 and w2" of the general formula The $(3-x-y-z+w2)/6$ of the general formula [II] meets the same condition as described in the section of ". Regarding conditions to be satisfied by x, y and z" of the general formula [I].

The y+w1 of the general formula [II] meets the same condition as described in the section of "Regarding range of y+w1" of the general formula [I].

The w1+w2 of the general formula [II] meets the same condition as described in the section of "Regarding range of w1+w2" of the general formula [I].

In the general formula [II], 1.5x is a numerical value representing the amount of A substituted for a part of R by the above-mentioned R-A substitution.

The numerical value of x in this case is 0 or larger, preferably 0.002 or larger, more preferably 0.01 or larger, still more preferably 0.03 or larger, and smaller than 3, preferably 2.7 or smaller, more preferably 2.5 or smaller, still more preferably 2.2 or smaller. This is because a concentration quenching may occur, when the content of the activation element is too large.

In the general formula [II], the above-mentioned x, y and z satisfy the following inequality.

$$0 \leq (1.5x+y-w2)/6 < (9/2)$$

Namely, in the general formula [II], "(1.5x+1 y−w2)/6" represents a numerical value of 0 or larger and smaller than 9/2. In addition, it is more preferable that "(1.5x+y−w2)/6" is larger than 0, and at the same time, x is larger than 0. The wavelength of emission peak can be thereby shifted to longer wavelength side. In this case, it is particularly preferable that x in the general formula [II] is larger than 0 and smaller than 3.

Preferable examples of the chemical composition of the above-mentioned general formula [II] will be listed below. However, the crystal phase composition of the phosphor of the present invention (II) is not limited to the following examples.

Preferable examples of the chemical composition of the general formula [II] with which oxygen is not mixed include: $La_{1.37}Ce_{0.03}Ca_{2.40}Si_6N_{11}$, $La_{2.15}Ce_{0.10}Ca_{1.23}Si_6N_{11}La_{2.5}Ce_{0.03}Ca_{0.60}Si_6N_{11}$, $La_{2.9}Ce_{0.1}Si_6N_{11}$ and $La_{2.95}Ce_{0.05}Si_6N_{11}$. Preferable examples in which oxygen is present include: $La_{1.71}Ce_{0.1}Ca_{1.57}Si_6O_{0.44}M_{10.56}$, $La_{1.71}Ce_{0.03}Ca_{2.20}Si_6O_{1.00}N_{10.00}$, $La_{2.37}Ce_{0.03}Ca_{0.75}Si_6O_{0.30}M_{10.70}La_{2.8}Ce_{0.1}Si_6N_{10.7}O_{0.3}$, and $La_{2.9}Ce_{0.1}Si_{5.9}N_{10.6}O_{0.4}$.

The crystal phase represented by the above-mentioned general formula [II] is essentially a new structure (with respect to its space group and site constituent ratio) among alkaline-earth metal element—rare-earth metal element (letting it "Ln")—Si—N systems. In the following, explanation will be given on the difference between this crystal phase and those of known substances.

The crystal phase represented by the above-mentioned general formula [II] is of P4bm or analogous space groups, whereas known $SrYbSi_4N_7$ and $BaYbSi_4N_7$ are of $P6_3mc$ space group (refer to Non-Patent Document 2) and known $BaEu(Ba_{0.5}Eu_{0.5})YbSi_6N_{11}$ is of $P2_13$ space group (refer to Non-Patent Document 3). In this way, the space group of the crystal phase represented by the general formula [II] is significantly different from those of previously known phosphors. In addition, the powder X-ray diffraction pattern of the crystal phase represented by the general formula [II] is significantly different from those of previously known phosphors. This apparently indicates that they have different crystal structures from each other since crystal phases are judged on the basis of the powder X-ray diffraction patterns.

In addition, every point described in the section of "Other points of crystal phase of the general formula [I]" of the general formula [I] is also true for the phosphor of the present invention (II).

[3-2. Characteristics of Phosphor (II)]

There is no limitation on the characteristics of the phosphor of the present invention (II) insofar as it comprises the crystal phase represented by the above-mentioned general formula [II]. However, it usually has such properties as described below.

[3-2-1. Characteristics on Luminescent Color of Phosphor (II)]

The phosphor of the present invention (II) usually emits yellow green to orange light. When the phosphor of the present invention (II) does not comprise the A element (such as Ca or the like) in the above-mentioned general formula [II], it usually emits yellow green to yellow light. On the other hand, when the phosphor of the present invention (II) comprises the A element (such as Ca or the like) in the above-mentioned general formula [II], it usually emits yellow to orange (yellow red) light. In addition, the luminescent color varies depending also on the amount of Ce, an activation element.

The color coordinates (x,y) of the fluorescence of the phosphor of the present invention (II) is usually within the area surrounded by (0.320, 0.400), (0.320, 0.570), (0.600, 0.570), and (0.600, 0.400). It is preferably within the area surrounded by (0.380, 0.430), (0.380, 0.560), (0.580, 0.560), and (0.580, 0.430). Accordingly, the color coordinate x of the fluorescence of the phosphor of the present invention (II) is usually 0.320 or larger, preferably 0.380 or larger, and usually 0.600 or smaller, preferably 0.580 or smaller. On the other hand, the color coordinate y is usually 0.400 or larger, preferably 0.430 or larger, and usually 0.570 or smaller, preferably 0.530 or smaller.

The color coordinate of fluorescence can be calculated from the emission spectrum to be described later. In this context, the above-mentioned color coordinates (x,y) mean those in the CIE standard colorimetric system of the luminescent color when excited with light having 460-nm wavelength.

[3-2-2. Characteristics on Emission Spectrum]

There is no special limitation on the spectrum (emission spectrum) of the fluorescence emitted by the phosphor of the present invention (II). However, the wavelength of emission peak of the emission spectrum when excited with light of 460-nm wavelength is in the range of usually 480 nm or longer, preferably 510 nm or longer, more preferably 530 nm or longer, and usually 620 nm or shorter, preferably 600 nm or shorter, more preferably 580 nm or shorter.

The wavelength of emission peak of the present invention depends on the composition of the crystal phase contained. For example when the phosphor of the present invention (II) does not include the A element (such as Ca or the like) of the above-mentioned general formula [II] in its composition, the wavelength of emission peak of the emission spectrum when excited with light of 460-nm wavelength is in the range of usually 480 nm or longer, preferably 500 nm or longer, more preferably 515 nm or longer, and usually 600 nm or shorter, preferably 580 nm or shorter, more preferably 575 nm or shorter.

In addition, the full width at half maximum (FWHM) of the emission peak of the phosphor of the present invention (II), when excited with light of 460-nm wavelength, is usually 100 nm or longer, preferably 110 nm or longer, more preferably 130 nm or longer. Such a large full width at half maximum can enhance the color rendering of the light emitting device or the like which uses the phosphor of the present invention (II) and a blue LED or the like in combination. In addition, since the phosphor of the present invention (II) has a sufficient emission intensity also at longer wavelength region (namely, around 630 nm to 690 nm) than that of yellow light, a warm white light can be obtained when incorporated with a blue LED. This characteristic of the phosphor of the present invention (II) is much superior to that of known YAG:Ce phosphors (the FWHM of commercially available P46-Y3 is 126 nm). There is no special limitation on the upper limit to the full width at half maximum of the emission peak, but usually it is 280 nm or smaller.

In addition, the emission spectrum of the phosphor of the present invention (II) containing infinitesimal or less amount of alkaline-earth metal, such as typified by that of x=0, usually exhibits a unique waveform satisfying the formula [B] below when excited with light of 460-nm wavelength.

$$I(B)/I(A) \leq 0.88 \quad [B]$$

(In the above formula [B], I(A) represents the emission intensity of the maximum peak wavelength that is present in the wavelength range of 500 nm or longer and 550 nm or shorter, and I(B) represents the emission intensity of the wavelength that is longer than the maximum peak wavelength by 45 nm.) Namely, in the phosphor of the present invention (II), the above-mentioned I(B)/I(A) is usually 0.88 or smaller, preferably 0.87 or smaller, and more preferably 0.85 or smaller. The I(B)/I(A) having such a small value leads to an advantageous effect that the phosphor can function as a yellow green to green phosphor. There is no limitation on the lower limit of the I(B)/I(A), but it is usually 0.5 or larger, and preferably 0.7 or larger.

When Ca is not contained as the bivalent metal element A of the general formula [II], the emission spectrum of the phosphor of the present invention (II) tends to be such a unique waveform. Accordingly, it can be inferred that the emission spectrum can be controlled, in terms of the above-mentioned condition (formula) [B], by adjusting the content of the bivalent metal element A.

In this regard, the phosphor of the present invention (II) shows such a unique emission spectrum even without washing it with a strong acid such as aqua regia. Conventional phosphors usually exhibit emission spectra that are unique to the phosphors only when crystal phases other than those desired are removed by washing with a strong acid or the like. In contrast, the phosphor of the present invention (II) shows a unique characteristic of exhibiting such a unique emission spectrum even without washing as described above. It can be inferred that this is because the phosphor is produced by a production method using alloy, as described later.

The measurement of the emission spectrum of the phosphor of the present invention (II) and the calculation of its light emitting area, wavelength of emission peak, and full width at half maximum of the peak can be carried out by, for example, using a fluorescence measurement apparatus manufactured by JASCO corporation at a room temperature (usually, 25° C.)

[3-2-3. Excitation Wavelength]

The phosphor of the present invention (II) can be excited by lights having a variety of wavelengths (excitation wavelengths) depending on the composition or the like of the phosphor of the present invention (II). However, the excitation wavelength is usually the same as that for the phosphor of the present invention (I).

[3-2-4. Weight-Average Median Diameter]

The weight-average median diameter of the phosphor of the present invention (II) is usually the same as that of the phosphor of the present invention (I).

[3-2-5. Chemical Resistance]

The phosphor of the present invention (II) is usually superior in chemical resistance as in the case with the phosphor of the present invention (I).

[3-2-6. Temperature Characteristics]

The temperature characteristics of the phosphor of the present invention (II) is usually the same as that of the phosphor of the present invention (I).

[3-2-7. Quantum Efficiency]

The quantum efficiencies such as external quantum efficiency, internal quantum efficiency, and absorption efficiency of the phosphor of the present invention (II) are usually the same as those of the phosphor of the present invention (I).

[3-2-8. Content of Impurity]

There are less amount of impurity phases in the phosphor of the present invention (II) even without performing washing or other special procedures after it is produced. Such a small amount of impurity phases can be verified by the powder X-ray diffraction pattern.

The phosphor of the present invention (II) has a peak at 2θ from 17° to 20°, in the powder X-ray diffraction pattern measured with CuKα line (1.54184 Å), and its peak intensity ratio I related to a peak present at 2θ from 21° to 24° is usually 0.05 or smaller, preferably 0.04 or smaller. Such a small amount of impurity phase can lead to a high emission intensity even when a washing step or the like is not carried out. Incidentally, there is no limitation on the lower limit thereof. However, it is usually 0.001 or larger, even though the lower limit is ideally 0.

The above-mentioned peak intensity ratio I is the ratio $(I_p)/I_{max}$ of the peak height $I_p$, present at from 21° to 24°, to the most-intensive peak height $I_{max}$, present at 2θ from 17° to 20°, in the powder X-ray diffraction pattern at 2θ from 10° to 60°. In this contest, the values of the peak intensities are used after background correction.

[3-3. Advantageous Effects of Phosphor of Present Invention (II)]

As described above, the phosphor of the present invention (II) contains much red light component and can emit lights having large full width at half maximums. Namely, the emission intensity of the phosphor of the present invention (II) is sufficient at red, longer wavelength region, and the emission spectrum thereof shows an emission peak with significantly large full width at half maximum. Accordingly, when the phosphor of the present invention (II) is used for a white light emitting device, the white light emitting device can emit warm white light with high color rendering.

In addition, the phosphor of the present invention (II) can be excited particularly efficiently by a near-ultraviolet or blue semiconductor luminous element and emit yellow green to orange fluorescence, usually.

Furthermore, in the phosphor of the present invention (II), there is usually less reduction in emission efficiency associated with temperature rising than YAG:Ce phosphors, which have been frequently used for white light emitting devices conventionally.

[3-4. Use of Phosphor of Present Invention (II)]

There is no limitation on the use of the phosphor of the present invention (II). However, it can be used, for example, in the same way as the phosphor of the present invention (I), making use of the above-mentioned advantageous effects. However, since the phosphor of the present invention (II) is usually a yellow green to orange phosphor, preferable examples of the above-mentioned other phosphor to be combined with the phosphor of the present invention (II) include: phosphors emitting blue, blue green, green, yellow green, yellow, orange, red, or deep red light. It is particularly preferable to use a blue light emitting diode, as excitation light source, and a green or red phosphor in combination with the phosphor of the present invention (II), because it can realize a white light emitting device. Moreover, a desirable white light emitting device can be realized also by using a near-ultraviolet light emitting diode and a blue phosphor, a green phosphor, and a red phosphor in combination with the phosphor of the present invention (II). By adding a deep red phosphor to these white light emitting devices, the color rendering thereof can be further enhanced.

[4. Production Method of Phosphor (II)]

The production method of the phosphor of the present invention (II) uses, as at least a part of the raw material, an alloy (hereinafter referred to as "alloy for phosphor precursor" as appropriate) containing two or more kinds of the metal elements that are included in the crystal phase represented by the general formula [II]. The phosphor of the present invention (II) is produced usually by mixing other materials if necessary to the above-mentioned alloy and subjecting the mixture to a nitriding treatment (hereinafter referred to as "secondary nitriding process" as appropriate) in which the mixture is fired under a nitrogen-containing atmosphere.

As refinement technologies of elemental metals that are widely utilized industrially, sublimation refining, floating zone refining, distillation method and the like are known. As such, there are many elemental metals that can be purified easier than compounds. Accordingly, a method in which elemental metals necessary for producing a phosphor are used as starting materials for forming an alloy and the phosphor is produced from the obtained alloy for phosphor precursor is superior to the method using metal compounds as raw materials, in that a material of higher purity can be easily obtained. In addition, an elemental metal can be used advantageously for constituting the activator element, from the viewpoint of homogeneous dispersion of the activator element within the crystal lattice. This is because by melting the elemental metal to form an alloy the activator element can be easily dispersed uniformly.

From the above standpoint, it is possible to produce a high-performance phosphor industrially by using, as raw material, an alloy for phosphor precursor containing at least a part of or preferably all of the metal elements that constitute the desirable phosphor, and nitriding the alloy.

In the following, such a production method (hereinafter referred to as "the production method (II) according to the present invention" as appropriate) will be described as an example of the production method of the phosphor of the present invention (II).

[4-1. Preparation of Alloy for Phosphor Precursor]

In the production method (II) according to the present invention, an alloy for phosphor precursor, which can be used as the material for the phosphor (II), is first prepared. To obtain the alloy for phosphor precursor, starting materials (hereinafter referred to as "material metals" as appropriate) such as elemental metals or metal alloys are usually melted. There is no limitation on the melting method and various known methods such as arc melting or high-frequency dielectric melting can be used.

[4-1-1. Weighing of Material Metal]

As material metal can be used materials such as metal or alloy of the corresponding metal. Further, material metal corresponding to the elements contained in the phosphor of the present invention (II) can be used either as a single one or as a mixture of two or more kinds in any combination and in any ratio. However, as material metal of the metal element M which is the activating element (for example, material metal corresponding to Eu or Ce) can be preferably used Eu metal or Ce metal, because these materials can be obtained easily.

It is preferable that the purity of metal used as the material metal of the alloy for phosphor precursor is high. Specifically, from the standpoint of luminescent characteristics of the synthesized phosphor, it is preferable to use a metal the content of impurities of which is 0.1 mole percent or less, more preferably 0.01 mole percent or less as the material metal corresponding to the activating element M. Further, regarding metals used as material metals of elements other than the activating element M, the content of impurities is preferably 0.1 mole percent or less, more preferably 0.01 mole percent or less for the same reason as described above for the activating element M. For example, when the impurity is at least one element selected from the group consisting of Fe, Ni and Co, the content of each impurity is usually 500 ppm or less, preferably 100 ppm or less.

There is no special limitation on the form of the material metals. Usually, grains or lumps with a diameter from several mm to several tens mm are used. In this context, those of a diameter of 10 mm or larger are called lumps and those of a diameter of less than 10 mm are called grains.

There is no special limitation on the form, such as grains or lumps, of the material metal corresponding to the alkaline-earth metal elements. It is preferable to select a suitable form depending on the chemical properties of the corresponding material metal. For example, Ca is stable in air in the form of both grains and lumps and therefore both forms can be used. Sr is chemically reactive and it is preferable to use it in the form of lumps.

For metal elements that are liable to be lost at the time of melting due to vaporization or reaction with crucible material, prior weighing of an excess amount may be useful if considered appropriate.

[4-1-2. Melting of Material Metal]

After weighing material metals, the corresponding material metals are melted to an alloy to produce the alloy for phosphor precursor (melting process). The alloy for phosphor precursor obtained contains two or more kinds of metal elements constituting the phosphor of the present invention (II). Even when one alloy for phosphor precursor does not contain all of the metal elements constituting the phosphor of the present invention (II), it is possible to produce the phosphor of the present invention (II) by combining two or more kinds of alloys for phosphor precursor and/or other material (such as metals) in the primary or secondary nitriding process to be described later.

There is no special limitation on the method of melting the material metals and any method can be used. For example, such methods as resistance heating method, electron beam method, arc melting method and high-frequency dielectric heating method (hereinafter also referred to as "high-frequency dielectric melting method") can be used. It is also possible to combine any two or more of these methods for melting.

Examples of the material of crucible that can be used at the time of melting include: alumina, calcia, graphite, and molybdenum.

When an alloy for phosphor precursor containing metal elements which can not be melted simultaneously, such as Si and alkaline-earth metal, is produced, production can be effected by mixing other metal material after producing a mother alloy. For the details of the method in such a case, reference can be made to the pamphlet of International Publication No. WO 2006/106948.

Specific temperature condition and melting time at the time of melting of the material metals can be set appropriately depending on each material metal used, for any material metal used.

There is no special limitation on the atmosphere at the time of melting of the material metals, insofar as the alloy for phosphor precursor can be obtained. Preferable is an inert gas atmosphere, in particular argon atmosphere. The inert gas can be used either as a single one or as a mixture of two or more kinds in any combination and in any ratio.

There is no special limitation on the pressure at the time of melting of the material metals, insofar as the alloy for phosphor precursor can be obtained. A pressure of $1 \times 10^3$ Pa or higher is preferable, and a pressure of $1 \times 10^5$ Pa or lower is preferable. From the standpoint of safety, it is preferable to select the atmospheric pressure or lower pressure.

[4-1-3. Casting of Molten Metal]

An alloy for phosphor precursor can be obtained by melting the material metals described above. This alloy for phosphor precursor is usually obtained as molten metal of the alloy. However, there are a number of technical difficulties in the direct production of the phosphor (II) from this molten metal of the alloy. Therefore, it is preferable to obtain a coagulated matter (hereinafter referred to as "alloy ingot" as appropriate) through a casting process in which this molten metal of the alloy is poured into a metallic mold and molded.

However, in this casting process, segregation is likely to occur depending on cooling speed of the molten metal, and a bias is likely to be caused in the composition of the alloy for phosphor precursor, which was homogeneous in the molten state. Therefore, it is preferable that the cooling speed is as rapid as possible. Further, it is preferable to use as a metallic mold a material with good thermal conductivity such as copper, and to select a form in which dissipation of heat is easy. It is also preferable to devise such means as cooling with water to cool the metallic mold if necessary.

It is preferable, through the attempts mentioned above, to induce rapid coagulation after the molten metal is poured into the metallic mold, for example by using a metallic mold which has a large area of base relative to its thickness.

The degree of segregation is different depending on the composition of the alloy for phosphor precursor, and therefore, it is preferable to obtain samples from several locations of the coagulated matter, to analyze the composition by means of, for example, ICP emission spectroscopy, and to determine the cooling speed necessary for prevention of the segregation.

As atmosphere at the time of casting, preferable is an inert gas atmosphere, particularly argon atmosphere. The inert gas can be used either as a single one or as a mixture of two or more kinds in any combination and in any ratio.

[4-1-4. Milling of Alloy Ingot]

It is preferable to make the alloy for phosphor precursor a powder of desired particle diameter before a heating process. Therefore, it is preferable to subject the alloy ingot (pulverizing process), obtained in the casting process, to a subsequent milling (milling process) so as to obtain an alloy powder of desired particle diameter and desired particle size distribution to be used as material of the phosphor.

There is no special limitation on the method of milling. For example, dry method and also wet method using an organic solvent such as ethylene glycol, hexane or acetone can be used.

The dry method will be explained in detail below as an example.

This milling process can be divided into plural number of processes, as needed, such as coarse milling process, medium milling process, and fine milling process. The same milling instrument can be used throughout these processes or different ones can be used in different processes.

Coarse milling process is a process in which about 90 weight % of alloy powder is milled to particles of 1-cm particle diameter or smaller. The milling instruments which can be used include a jaw crusher, gyratory crusher, crushing roll and impact crusher. Medium milling process is a process in which about 90 weight % of alloy powder is milled to particles of 1-mm particle diameter or smaller. The milling instruments which can be used include a corn crusher, crushing roll, hammer mill and disc mill.

Fine milling is a process in which alloy powder is milled to particles of the weight-average median diameter to be described later. The milling instruments which can be used include a ball mill, tube mill, rod mill, roller mill, stamp mill, edge runner, vibration mill and jet mill.

Among others, it is preferable to use a jet mill in the final milling process from the standpoint of preventing mixing of impurities. When a jet mill is used, it is preferable to mill preliminarily the alloy ingot to a level of 2-mm particle diameter or smaller. In using a jet mill, milling is effected by making use of expansion energy of fluid ejected from nozzle pressure to atmospheric pressure, and it is possible to control particle diameter by adjusting milling pressure and to prevent mixing of impurities.

Although the milling pressure depends on the instrument used, the gauge pressure is usually 0.01 MPa or higher, preferably 0.05 MPa or higher, more preferably 0.1 MPa or higher, and usually 2 MPa or lower, preferably 0.4 MPa or lower, more preferably 0.3 MPa or lower. When the gauge pressure is too low, the particle diameter of the obtained particles is possibly too large. When it is too high, the particle diameter of the obtained particles is possibly too small.

In all the cases, it is preferable, in order to prevent contamination due to impurities such as iron during the milling process, to give due consideration to the compatibility between the material of the milling instrument and the material to be milled. For example, ceramic lining is preferable at the area where contact with powder is possible. Of ceramics, preferable examples include: alumina, silicon nitride, tungsten carbide and zirconia. These substances can be used either as a single one or as a combination of two or more kinds in any combination and in any ratio.

Further, in order to prevent oxidation of the alloy powder, it is preferable to perform the milling process in an atmosphere of inert gas. There is no special limitation on the kind of inert gas used. Usually, of the gases such as nitrogen, argon and helium, one gas can be used singly or a mixture of two or more gases can be used. In particular, nitrogen is preferable from the standpoint of cost efficiency.

There is no special limitation on the concentration of oxygen in the atmosphere, insofar as oxidation of the alloy powder can be prevented.

Usually, it is 10 volume % or lower, preferably 5 volume % or lower. The lower limit of oxygen concentration is usually about 10 ppm. By adopting specific oxygen concentration range, oxidation film is probably formed on the surface of the alloy during the milling and stabilization ensues. When milling is carried out in an atmosphere in which oxygen concentration is 5 volume % or higher, it is likely that explosion of powder dust occurs during milling. Therefore, it is desirable to install a mechanism for preventing occurrence of powder dust.

In order to prevent rise in temperature of the alloy powder during the milling process, cooling may be provided when considered necessary.

[4-1-5. Classification of Alloy Powder]

It is preferable to use the alloy powder obtained in the above process after it is adjusted in size to the desired weight-average median diameter $D_{50}$ with desired particle size distribution (classification process) by means of, for example, sieving instrument utilizing mesh such as vibrating screen and sifter, inertial classification instrument such as air separator, and centrifuge such as cyclone. The subsequent procedures will then be easy.

In the adjustment of the particle size distribution, it is preferable to classify coarse particles and recycle them in the milling instrument, and to make classification and/or recycle a continuous process.

In this classification process also, it is preferable to perform it in an atmosphere of inert gas. There is no special limitation on the kind of inert gas used. Usually, of the gases such as nitrogen, argon and helium, one gas can be used singly or a mixture of two or more gases can be used. In particular, nitrogen is preferable from the standpoint of cost efficiency. The concentration of oxygen in the atmosphere of inert gas is preferably 10 volume % or lower, particularly 5 volume % or lower.

Particle diameter to be adjusted by the classification described above differs depending on the activity of the metal elements constituting the alloy powder. Its weight-average median diameter $D_{50}$ is usually 100 μm or smaller, preferably 80 μm or smaller, more preferably 60 μm or smaller, and usually 0.1 μm or larger, preferably 0.5 μm or larger, more preferably 1 μm or larger. When the alloy for phosphor precursor contains Sr, which is highly reactive with atmospheric gases, the weight-average median diameter $D_{50}$ of the alloy powder is usually 5 μm or larger, preferably 8 μm or larger, more preferably 10 μm or larger, particularly preferably 13 μm or larger. When the particle diameter of the alloy powder is smaller than the aforementioned range of weight-average median diameter $D_{50}$, the rate of heat liberation at the time of reaction such as nitriding tends to be high, leading to difficulty in controlling the reaction.

Also, the alloy powder is then liable to be oxidized in air and the phosphor obtained may take up oxygen readily, leading to difficulty in handling. On the other hand, when the particle diameter of the alloy powder exceeds the weight-average median diameter $D_{50}$ mentioned above, reaction such as nitriding inside the alloy particles may not be sufficient.

[4-1-6. Production of Alloy by Atomizing Method or the Like]

On the other hand, the alloy for phosphor precursor can also be produced through processes (a) to (c) described below, in addition to the method described above. In this way, it is possible to obtain an alloy powder to be used as material of the phosphor whose angle of repose is 45 degrees or less.

(a) Two or more kinds of material metals corresponding to metals constituting the phosphor (II) are melted, and the molten metal of the alloy containing these elements is prepared (melting process).

(b) The molten metal of the alloy is pulverized finely in an atmosphere of an inert gas (fine pulverizating process).

(c) The finely pulverized molten metal of the alloy is allowed to coagulate to obtain an alloy powder (coagulation process).

In other words, in this method, molten metal of the alloy is pulverized finely in a gas and allowed to coagulate to obtain a powder. In the fine milling process (b) and coagulation process (c) described above, it is preferable to prepare the powder by such methods as spraying molten metal of the alloy, fine milling into the shape of ribbons by rapid cooling through a roll or gas stream, or atomizing. Of these methods, atomizing is particularly preferable.

More specifically, reference can be made to known methods described in the pamphlet of International Publication No. WO2007/135975, modified appropriately.

[4-2. Firing Process]

The alloy for phosphor precursor obtained as above (it may be in the powder form or ingot form, preferably in the form of alloy powder described earlier) is fired in an atmosphere containing nitrogen, resulting in nitridation. Thereby, the phosphor of the present invention (II) is obtained. In this firing process, the secondary nitriding process (namely, nitriding treatment step) described later is essential, and the primary nitriding process described below is performed when needed.

[4-2-1. Mixing of Material]

When the composition of the metal elements contained in the alloy for phosphor precursor is the same as the composition of the metal elements contained in the crystal phase represented by the general formula [II], the alloy for phosphor precursor alone needs to be fired. When the compositions are different, an alloy for phosphor precursor having a different composition, elemental metal, or metal compound can be mixed with the alloy for phosphor precursor so that the composition of the metal elements contained in the material coincides with the composition of the metal elements contained in the crystal phase represented by the general formula [II]. Firing is then performed.

Even when the composition of the metal elements contained in the alloy for phosphor precursor is the same as the composition of the metal elements contained in the crystal phase represented by the general formula [II], by adding a nitride or oxynitride (it may be a nitride or oxynitride containing activating element, or may be the phosphor of the present invention (II) itself) to the alloy for phosphor precursor, heat releasing speed per unit volume at the time of nitriding is suppressed and nitriding reaction proceeds smoothly, as described in the pamphlet of International Publication No. WO2007/135975. The phosphor with excellent characteristics can then be obtained with a high yield. In producing the phosphor of the present invention (II), the secondary nitriding process, described later, may be performed in the presence of a suitable nitride or oxynitride by referring to the pamphlet of International Publication No. WO2007/135975, which can be modified appropriately.

It is preferable that stably-existing alloy phases are used in an appropriate combination as alloys for phosphor precursor that can be used for the production of the phosphor of the present invention (II). Examples of such alloy phases include: $LaSi_2$, $Ce_xLa_{1-x}Si_2$ ($0<x<1$), $LaSi$, $La_3Si_2$, $La_5Si_3$, $Ca_{24}Si_{60}$, $Ca_{28}Si_{60}$, $CaSi_2$, $Ca_{31}S_{60}$, $Ca_{14}Si_{19}$, $Ca_3Si_4$, $CaSi$, $Ca_5Si_3$, $Ca_2Si$, $Ca_xLa_{3-x}Si_6$ ($0<x<3$) and $Ce_yCa_xLa_{3-x-y}Si_6$ ($0<x<3$, $0<y<3$).

Other examples of the alloy for phosphor precursor include, as examples of alloys containing Si and alkaline-earth metal, $Ca_7Si$, $Ca_2Si$, $Ca_5Si_3$, $CaSi$, $Ca_2Si_2$, $Ca_{14}Si_{19}$, $Ca_3Si_4$, $SrSi$, $SrSi_2$, $Sr_4Si_7$, $Sr_5Si_3$ and $Sr_7Si$. Further, examples of alloys containing Si, aluminum and alkaline-earth metal include: $Ca(Si_{1-x}Al_x)_2$, $Sr(Si_{1-x}Al_x)_2$, $Ba(Si_{1-x}Al_x)_2$ and $Ca_{1-x}Sr_x(Si_{1-y}Al_y)_2$. Of these, $A^1(B^1{}_{0.5}Si_{0.5})_2$ (where, $A^1$=Ca, Sr, Ba, $B^1$=Al, Ga) has been investigated regarding its superconductivity in such documents as Japanese Patent Laid-Open Publication (Kokai) No. 2005-54182, M. Imai "Applied Physics Letters" 80 (2002)1019-1021, and M. Imai "Physical Review B" 68, (2003), 064512.

There is no special limitation on the metal compound that can be mixed with the alloy for phosphor precursor. Examples thereof include nitride, oxide, hydroxide, carbonate, nitrate, sulfate, oxalate, carboxylate, and halide. Of these metal compounds, a suitable one can be selected, in light of reactivity with the target compound or the level of $NO_x$ or $So_x$ generated at the time of firing. It is preferable to use a nitride and/or an oxynitride, as the phosphor of the present invention (II) is a nitrogen-containing phosphor. Nitrides are particularly preferable, as they also work as a source of nitrogen.

Examples of the nitride and oxynitride include: nitrides of elements constituting the phosphor such as AlN, $Si_3N_4$, $Ca_3N_2$, $Sr_3N_2$ and EuN; and complex nitrides of elements constituting the phosphor such as $CaAlSiN_3$, $(Sr, Ca)AlSiN_3$, $(Sr, Ca)_2Si_5N_8$, $CaSiN_2$, $SrSiN_2$ and $BaSi_4N_7$.

The nitrides described above may contain a minute amount of oxygen. There is no special limitation on the ratio (molar ratio) of oxygen/(oxygen+nitrogen) in the nitride, insofar as the phosphor of the present invention (II) can be produced. Usually, the ratio is 5% or smaller, preferably 1% or smaller, more preferably 0.5% or smaller, still more preferably 0.3% or smaller, particularly preferably 0.2% or smaller. When the ratio of oxygen in the nitride is too high, the brightness may decrease.

There is no special limitation on the weight-average median diameter $D_{50}$ of the metal compounds, insofar as no difficulty is encountered in mixing with other materials. However, it is preferably easy to be mixed with other materials. For example, the weight-average median diameter $D_{50}$ similar to that of the alloy powder is desirable. No particular limitation is imposed on the concrete value of weight-average median diameter $D_{50}$ of the metal compounds, insofar as the phosphor can be produced. Usually, it is 200 μm or smaller, preferably 100 μm or smaller, more preferably 80 μm or smaller, and still more preferably 60 μm or smaller. It is preferably 0.1 μm or larger and more preferably 0.5 μm or larger.

The above-mentioned alloy for phosphor precursor, metal element, and metal compound can be used either as a single one or as a mixture of two or more kinds in any combination and in any ratio, respectively.

There is no special limitation on the timing of mixing, insofar as it is before the secondary nitriding process. It may be before, during or after the primary nitriding process described later. Or the mixing can be done at 1 or 2 or more timings of these. However, when the primary nitriding process is performed, usually, the mixing is done after the primary nitriding process and before the secondary nitriding process.

In producing a phosphor containing Ca, for example, an alloy containing all of the metal elements constituting the phosphor is unstable and it is difficult to obtain a monophasic phosphor. It is preferable to mix an alloy for phosphor precursor containing a part of metal elements constituting the phosphor and one or more metal compounds containing other metal element(s) (for example, metal nitride(s)), thereby preparing a mixture containing all of the constituting elements as a whole. The mixture is then fired to produce the phosphor. The procedure at the time of production is then simple and emission efficiency of the phosphor can be improved.

When a phosphor not containing Ca is produced, it is preferable to prepare an alloy for phosphor precursor so that it contains all of the metal elements constituting the phosphor and fire it to produce the phosphor, for example. In this way, it is possible to readily produce an excellent phosphor with a few processes. In previous production methods not using an alloy, the composition of metal elements contained in the material may vary during firing, and it was sometimes difficult to obtain a phosphor with a desired element composition ratio. By making use of an alloy for phosphor precursor, it is now possible to obtain a phosphor with a desired composition ratio simply by charging metal elements in stoichiometric amount calculated from the target phosphor.

[4-2-2. Primary Nitriding Process]

From the standpoint of producing the phosphor of the present invention (II) industrially efficiently, the primary nitriding process may be included before the secondary nitriding process, if considered appropriate. This primary nitriding process is a process during which the alloy for phosphor precursor is preliminarily nitrided. Specifically, this preliminary nitriding is performed by heating the alloy for phosphor precursor at a predetermined temperature range for a predetermined length of time in a nitrogen-containing atmosphere. By introducing this primary nitriding process, it is possible to control the reactivity between the alloy and nitrogen in the secondary nitriding process and to produce the a phosphor from the alloy industrially.

In the explanation below, an alloy for phosphor precursor after the primary nitriding process may be referred to as "nitrogen-containing alloy".

Regarding this primary nitriding process, reference can be made to the pamphlet of International Publication No. WO2007/135975 pamphlet.

Modification can be added thereto when considered appropriate.

[4-2-3. Cooling and Milling Process]

When the primary nitriding process is performed, after completion of the primary nitriding process and before starting the secondary nitriding process, nitrogen-containing alloy obtained in the primary nitriding process may be cooled temporarily (cooling process). Regarding this cooling process, reference can be made to the pamphlet of International Publication No. WO2007/135975 pamphlet. Modification can be added thereto when considered appropriate.

After cooling, milling and/or stirring is performed as appropriate. The weight-average median diameter $D_{50}$ of the nitrogen-containing alloy after milling is usually 100 μm or smaller, and is preferably similar to that of the alloy powder before the primary nitriding process.

[4-2-4. Secondary Nitriding Process (Nitriding Treatment Step)]

In the secondary nitriding process, the phosphor of the present invention (II) is obtained through nitriding process of an alloy for phosphor precursor. As alloy for phosphor precursor can be employed either an alloy for phosphor precursor without undergoing the primary nitriding process (preferably, its alloy powder) or an alloy for phosphor precursor which has undergone the primary nitriding process (namely, nitrogen-containing alloy, preferably its alloy powder). Both can also be combined. If considered necessary, material other than the alloy for phosphor precursor (for example, metal itself or metal compound) can also be mixed. In the description below, the alloy for phosphor precursor (including nitrogen-containing alloy) and the above-mentioned other material which serve as materials of the phosphor of the present invention (II) are collectively called "phosphor material" as appropriate.

Nitriding treatment at the time of the secondary nitriding process is performed by heating phosphor material, filled in a firing vessel such as a crucible or tray, in a nitrogen-containing atmosphere. A specific procedure is as follows.

First, the phosphor material is filled into a firing vessel. Examples of material used for the firing vessel include boron nitride, silicon nitride, carbon, aluminum nitride and tungsten. Of these, boron nitride is preferable for its corrosion-resistant characteristics. The above-mentioned material can be used either as a single one or as a mixture of two or more kinds in any combination and in any ratio.

There is no special limitation on the shape of the firing vessel used. For example, its bottom may be circular or oval with no angles, or may be of polygonal shape such as triangular or quadrangular.

No particular limitation is imposed on the height of the firing vessel, either, insofar as it can be accommodated in a heating furnace. It can be high or low. It is preferable to select a shape which permits efficient heat liberation.

This firing vessel filled with phosphor material is placed in a firing instrument (also referred to as "heating furnace"). There is no special limitation on the firing instrument, insofar as the advantageous effect of the present invention is not impaired.

However, it is preferable to use an instrument which permits easy control of an atmosphere in the instrument and easy control of pressure. For example, a hot isostatic pressing instrument (HIP) or resistance-heating, vacuum, pressurized-atmosphere heat-treating furnace is desirable.

It is also preferable that a gas containing nitrogen is allowed to pass through the firing instrument before initiation of heating to replace a gas in the system sufficiently with the nitrogen-containing gas. When considered appropriate, vacuum is induced in the system before introduction of the nitrogen-containing gas.

Examples of the nitrogen-containing gas used at the time of nitriding include gases containing nitrogen element such as nitrogen, ammonia or a mixed gas of nitrogen and hydrogen. The nitrogen-containing gas can be used either as a single one or as a mixture of two or more kinds in any combination and in any ratio. The concentration of oxygen in the system affects the oxygen content of the phosphor to be produced and too high a content does not lead to high luminescence. Therefore, oxygen concentration in the nitriding atmosphere should be as low as possible. It is usually 0.1 volume % or lower, preferably 100 ppm or lower, more preferably 10 ppm or lower, and still more preferably 5 ppm or lower. Oxygen getter such as carbon or molybdenum may be included in the heating part of the system, as appropriate, to decrease the concentration of oxygen. The oxygen getter can be used either as a single one or as a mixture of two or more kinds in any combination and in any ratio.

Nitriding treatment is done by heating the phosphor material under the conditions where nitrogen-containing gas is filled in the system or it is passed through the system. The pressure at that time may be a little lower than atmospheric pressure, equal to, or higher than atmospheric pressure. It is preferable, however, to maintain it higher than atmospheric pressure in order to prevent mixing of atmospheric oxygen. When the pressure is lower than atmospheric pressure, it is possible that a large amount of oxygen mixes in the case of incomplete airtightness of the heating furnace, leading to deterioration of luminous characteristics of the phosphor. The gauge pressure of the nitrogen-containing gas is preferably 0.2 MPa or higher, more preferably 0.5 MPa or higher, and still more preferably 0.92 MPa or higher. Heating at a high pressure of 20 MPa or higher is also possible. It is preferably 200 MPa or lower.

There is no special limitation on the heating temperature of the phosphor material, insofar as the phosphor of the present invention (II) can be produced. Usually, it is 800° C. or higher, preferably 1000° C. or higher, more preferably 1200° C. or higher, and usually 2200° C. or lower, preferably 2100° C. or lower, more preferably 2000° C. or lower. When the heating temperature is lower than 800° C., time required for nitriding may be too long. On the other hand, when the heating temperature is higher than 2200° C., the nitride compound produced may volatilize or decompose, and chemical composition of the resultant nitride phosphor may be distorted, leading to deterioration of the phosphor characteristics and reproducibility of the process.

Further, the heating temperature differs depending on, for example, the composition of the alloy for phosphor precursor. It is preferable that the heating temperature is higher than the melting point of the alloy for phosphor precursor usually by 300° C. or higher, preferably 400° C. or higher, more preferably 500° C. or higher, still more preferably 700° C. or higher. The melting point of the alloy can be determined by thermogravimetry-differential thermal analysis and usually 1000° C. or higher and 1400° C. or lower, although it is different depending on the composition of the alloy. The temperature described above means the temperature in the furnace at the time of heat treatment, namely preset temperature of the firing instrument.

In order to secure sufficient nitriding, it is preferable to slow down the rate of temperature elevation in a temperature range around the melting point of the alloy for phosphor precursor, preferably in a temperature range lower than the above melting point by 150° C. or higher than that temperature, or higher than the above melting point by 100° C. or lower than that temperature (for example, temperature range of 800° C. to 1600° C.)

In the temperature range where speed of temperature elevation is controlled, the rate of temperature elevation is usually 5° C./min or less, preferably 3° C./min or less. When the temperature elevation rate is higher than the above range, it is difficult to avoid a rapid accumulation of reaction heat and production of a phosphor with high brightness tends to be difficult. There is no lower limit to the rate of temperature elevation. From the standpoint of productivity, it is usually, 0.2° C./min or more, preferably 0.5° C./min or more.

Heating time at the time of nitriding treatment (length of time the maximum temperature is maintained) may be a period of time necessary for the reaction between the phosphor material and nitrogen. Usually, it is 1 min or longer, preferably 10 min or longer, more preferably 30 min or longer, still more preferably 60 min or longer. When the heating time is shorter than 1 min, nitriding reaction may not be completed and a phosphor with excellent characteristics may not be obtained. The upper limit of the heating time will be determined from consideration of production efficiency, and usually, it is 24 hours or shorter.

Further, the secondary nitriding process may be repeated as plural processes, as appropriate. In this case, the conditions at the time of first firing (primary firing) and conditions at the time of second and later firing (secondary firing) are as described above. The conditions at the time of secondary and later firing may be the same as those of the primary firing or the conditions may be different.

Thus, by nitriding treatment of the phosphor material, it is possible to obtain the phosphor of the present invention (II) based on nitride or oxynitride.

In the secondary nitriding process, when the nitriding treatment of a large amount of phosphor material is allowed to proceed all at once, nitriding reaction may proceed too rapidly depending on some conditions, leading possibly to deterioration of characteristics of the phosphor of the present invention (II). Therefore, when a large amount of phosphor material is subjected to heat treatment all at once, the condition of raising temperature can be adjusted and thus, rapid progress of nitriding reaction can be avoided, which is desirable. In such a case, reference can be made to the pamphlet of International Publication No. WO2007/135975 pamphlet. Modification can be added thereto when considered appropriate.

As described above, it is possible to produce a phosphor of the present invention (II) by nitriding of an alloy for phosphor precursor (it may be a nitrogen-containing alloy).

[4-2-5. Points to be Noted in the Secondary Nitriding Process (Nitriding Treatment Step)]

As described above, nitriding reaction is an exothermic reaction. When a large amount of phosphor material is nitrided by heating all at once at the time of the secondary nitriding process (namely, nitriding treatment step), excessive exothermic reaction is liable to occur, leading to evaporation of a part of elements constituting the phosphor material or thermal fusion of particles of the alloy for phosphor precursor. This may result in deterioration of luminescent characteristics of the phosphor obtained, or the phosphor can not be obtained at all. It is then preferable to adjust the temperature range of the secondary nitriding reaction, by referring to known method described in the pamphlet of International Publication No. WO2007/135975 and by modifying the method appropriately. Then it may be possible to suppress a sudden and rapid progress of the nitriding reaction even when the amount of phosphor material to be treated is increased. It is then possible to produce industrially a phosphor with excellent characteristics.

[4-2-6. Flux]

In the secondary nitriding process, flux may be added to the reaction system in order to secure growth of good quality crystals. No particular limitation is imposed on the kind of flux. The examples include: ammonium halides such as $NH_4Cl$ and $NH_4F \cdot HF$; alkali metal carbonates such as $Na_2CO_3$ and $LiCO_3$; alkali metal halides such as LiCl, NaCl, KCl, CsCl, LiF, NaF, KF and CsF; alkaline-earth metal halides such as $CaCl_2$, $BaCl_2$, $SrCl_2$, $CaF_2$, $BaF_2$, $SrF_2$, $MgCl_2$ and $MgF_2$; alkaline-earth metal oxides such as BaO; aluminum halides such as $AlF_3$; zinc compounds such as zinc halides like $ZnCl_2$ and $ZnF_2$, and zinc oxides; compounds of the 15th group elements of the periodic table such as $Bi_2O_3$; and nitrides of alkali metals, alkaline earth metals or the 13th group elements such as $Li_3N$, $Ca_3N_2$, $Sr_3N_2$, $Ba_3N_2$ and BN. Other examples of the flux include: halides of rare-earth elements such as $LaF_3$, $LaCl_3$, $GdF_3$, $GdCl_3$, $LuF_3$, $LuCl_3$, $YF_3$, $YCl_3$, $ScF_3$, and $ScCl_3$; and oxides of rare-earth elements such as $La_2O_3$, $Gd_2O_3$, $Lu_2O_3$, $Y_2O_3$, and $Sc_2O_3$. Of these, halides are preferable. Particularly preferable are alkali metal halides, alkaline-earth metal halides, Zn halides, and rare-earth element halides. Of these halides, fluorides and chlorides are preferable.

These fluxes can be used either as a single one or as a mixture of two or more kinds in any combination and in any ratio.

The amount of flux used differs depending on the kind of the materials or compounds used as the flux. It is preferably in the range of usually 0.01 weight or more, preferably 0.1 weight % or more, more preferably 0.3 weight % or more, and usually 20 weight % or less, preferably 5 weight % or less, relative to the entire phosphor materials. When the amount of the flux used is too small, the effect of flux may not be exhibited. When the amount of the flux used is too large, the effect of flux may be saturated, or it may be taken up into the host crystals, leading possibly to change in the luminescent color, decrease in the brightness, and deterioration of the firing furnace.

[4-3. Other Processes]

Steps other than described above can be carried out in the production method (II) according to the present invention if necessary. The examples as the steps to be performed on the obtained phosphor include a refiring step, pulverization step, washing step, classification step, surface treatment step, drying step.

Of these, pulverization step, washing step, classification step and surface treatment step can be performed in the same way as described for the production method (I) according to the present invention.

The phosphor obtained by a secondary nitriding process may be subjected, if necessary, to a refiring process, in which the phosphor undergoes an additional heat treatment (refiring treatment) so that the particles grow. This may lead to improved phosphor characteristics such as high luminescence of the phosphor due to its particles grown.

In this refiring process, a phosphor can be refired after allowed to cool to room temperature. The heating temperature of such a refiring treatment is usually 1300° C. or higher, preferably 1400° C. or higher, more preferably 1450° C. or higher, still more preferably 1500° C. or higher, and usually 1900° C. or lower, preferably 1850° C. or lower, more preferably 1800° C. or lower, still more preferably 1750° C. or lower. Too low a temperature is likely to produce little effect of growing particles of the phosphor. On the other hand, too high a temperature may not only consume unnecessary heating energy but also decompose the phosphor. In addition, for preventing decomposition of the phosphor, an extremely high pressure of nitrogen, which is a part of atmospheric gas, is needed. This tends to result in higher production cost.

Preferable atmosphere used for refiring the phosphor is basically a nitrogen gas atmosphere, inert gas atmosphere, or reducing atmosphere. The inert gas and reducing gas can be used either as a single one or as a combination of two or more kinds in any combination and in any ratio, respectively.

The oxygen concentration in the atmosphere is usually 100 ppm or lower, preferably 50 ppm or lower, more preferably 10 ppm or lower. When refiring is performed in an oxidizing atmosphere such an oxygen-containing gas or air of which oxygen concentration is 250 ppm or higher, the phosphor may be oxidized and thus the intended phosphor may not be obtained. However, an atmosphere containing a minute amount of oxygen such as 0.1 ppm to 10 ppm is preferable, because a phosphor can be then synthesized at relatively low temperatures.

It is preferable that the pressure at the time of refiring is higher than atmospheric pressure in order to prevent mixing of atmospheric oxygen. When the pressure is too low, it is possible that a large amount of oxygen mixes in the case of incomplete airtightness of the firing instrument, leading to deterioration of characteristics of the phosphor, in the same way as the firing step described earlier.

The heating period (retention period of the maximum temperature) of the refiring treatment is usually 1 min or longer, preferably 10 min or longer, more preferably 30 min or longer, and usually 100 hours or shorter, preferably 24 hours or shorter, more preferably 12 hours or shorter. When the heating period is too short, particle growth tends to be insufficient. On the other hand, when the heating period is too long, unnecessary heating energy consumption tends to occur and the luminescent characteristics may decrease due to eliminated nitrogen from the phosphor surface.

[5. Phosphor-Containing Composition]

The phosphor (I) and phosphor (II) of the present invention can be used as a mixture with a liquid medium. Particularly when the phosphor (I) or phosphor (II) of the present invention is used for a light emitting device or the like, it is preferably used as a dispersion in a liquid medium, which is then sealed and cured by heat or light. In what follows, the phosphor (I) and phosphor (II) of the present invention will be referred to simply as "the phosphor of the present invention" when no distinction is made between them. The phosphor of the present invention that is dispersed in a liquid medium will be referred to as "the phosphor-containing composition of the present invention" as appropriate.

[5-1. Phosphor]

There is no limitation on the type of the phosphor of the present invention to be contained in the phosphor-containing composition of the present invention, and any of that can be selected from those described above. The phosphor of the present invention to be contained in the phosphor-containing composition of the present invention can be used as a single kind thereof or as a mixture of two or more kinds in any combination and in any ratio.

Furthermore, in the phosphor-containing composition of the present invention, a phosphor other than the phosphor of the present invention can be contained, insofar as the advantage of the present invention is not significantly impaired.

[5-2. Liquid Medium]

There is no special limitation on the kind of a liquid medium used for the phosphor-containing composition of the present invention, insofar as the performance of the phosphor can be sufficient enough to achieve the object of the present invention. For example, any inorganic material and/or organic material can be used, insofar as it exhibits liquid characteristics under a desired use condition and lets the phosphor of the present invention be dispersed preferably without any unfavorable reaction.

Examples of the inorganic materials include metal alkoxide, ceramic precursor polymer, a solution obtained by hydrolytic polymerization of a solution containing metal alkoxide using a sol-gel method (such as an inorganic material containing siloxane bond).

Examples of the organic materials include thermoplastic resin, thermosetting resin and light curing resin. More specifically, the examples include: methacrylic resin such as polymethacrylate methyl; styrene resin such as polystyrene, styrene-acrylonitrile copolymer; polycarbonate resin; polyester resin; phenoxy resin; butyral resin; polyvinyl alcohol; cellulose resin such as ethyl cellulose, cellulose acetate and cellulose acetate butyrate; epoxy resin; phenol resin; and silicone resin.

Of these, a silicon-containing compound can be preferably used as a liquid medium from the standpoint of high heat resistance, high light resistance and the like, particularly when the phosphor of the present invention is used for a high-power light emitting device such as an illuminating device.

Silicon-containing compound means a compound of which molecular contains a silicon atom. Examples thereof include organic materials (silicone materials) such as polyorganosiloxane, inorganic materials such as silicon oxide, silicon nitride and silicon oxynitride, glass materials such as borosilicate, phosphosilicate and alkali silicate. Among them, silicone materials are preferably used from the standpoint of ease in handling or the like.

The above-mentioned silicone material usually indicates organic polymers having a siloxane bond as the main chain. Examples thereof include compounds represented by the following general composition formula (I) and/or mixtures of them.

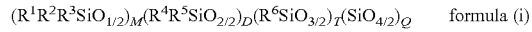

In the general composition formula (I), $R^1$ to $R^6$ are each selected from the group consisting of organic functional group, hydroxyl group and hydrogen atom. $R^1$ to $R^6$ can be the same as or different from each other.

In addition, M, D, T and Q of the above-mentioned formula (I) are each number of 0 or greater and smaller than 1, and they satisfies $M+D+T+Q=1$.

The silicone material can be used after being sealed with a liquid silicone material and cured by heat or light, when used for sealing a semiconductor luminous element.

When categorizing silicone materials based on the curing mechanism, they usually fall into such categories as addition polymerization-curable type, polycondensation-curable type, ultraviolet ray-curable type and peroxide vulcanized type. Of these, preferable are addition polymerization-curable type (addition type silicone resin) and condensation-curable type (condensing type silicone resin) and ultraviolet ray-curable type. In the following, addition type silicone material and condensing type silicone material will be explained.

Addition type silicone material represents a material in which polyorganosiloxane chain is crosslinked by means of organic additional bond. Typical examples thereof include a compound having a Si—C—C—Si bond as the crosslinking point, which can be obtained through a reaction between vinylsilane and hydrosilane in the presence of an addition type catalyst such as Pt catalyst. As such compounds, commercially available ones can be used. For example, as concrete commercial names of an addition polymerization-curable type can be cited "LPS-1400", "LPS-2410" and "LPS-3400", manufactured by Shin-Etsu Chemical Co., Ltd.

On the other hand, examples of a condensing type silicone material include a compound having an Si—O—Si bond as the crosslinking point, which can be obtained through hydrolysis and polycondensation of alkyl alkoxysilane. Examples thereof include: a polycondensate obtained by performing hydrolysis and polycondensation of compounds represented by the following general formula (II) and/or (iii), and/or an oligomer thereof.

(In the formula (II), M represents at least one element selected from silicon, aluminum, zirconium and titanium, X represents a hydrolyzable group, $Y^1$ represents a monovalent organic group, m represents an integer of 1 or larger representing the valence of M, and n represents an integer of 1 or larger representing the number of X groups, where m≥n.)

  (iii)

(In the formula (iii), M represents at least one element selected from silicon, aluminum, zirconium and titanium, X represents a hydrolyzable group, $Y^1$ represents a monovalent organic group, $Y^2$ represents a u-valent organic group, s represents an integer of 1 or larger representing the valence of M, t represents an integer of 1 or larger and s−1 or smaller, and u represents an integer of 2 or larger.)

The condensing type silicone material may contain a curing catalyst. As the curing catalyst, a metal chelate compound can be used preferably, for example. The metal chelate compound preferably contains at least one of Ti, Ta and Zr, and more preferably contains Zr. The curing catalysts may be used either as a single kind thereof or as a mixture of more than one kind in any combination and in any ratio.

As such condensing type silicone material can be used preferably, for example, semiconductor light emitting device members disclosed in Japanese Patent Laid-Open Publications (Kokai) No. 2007-112973 to No. 2007-112975, Japanese Patent Laid-Open Publication (Kokai) No. 2007-19459, and Japanese Patent Application No. 2006-176468.

In the following, particularly preferable ones among condensing type silicone materials will be explained.

Silicone materials generally have such problems as low adhesiveness to the semiconductor luminous element, the substrate at which the element is disposed, the package and the like. However, as a silicone material with especially high adhesion can be preferably used a condensing type silicone material having at least one of the following characteristics [1] to [3].

[1] The silicon content is 20 weight % or more.
[2] In the solid Si-nuclear magnetic resonance spectrum (NMR), measured by a method to be described later in detail, it has at least one of Si-originated peaks of the following (a) and/or (b).

(a) A peak whose peak top position is in an area of a chemical shift of −40 ppm or more and 0 ppm or less, with reference to tetramethoxysilane, and whose full width at half maximum is 0.3 ppm or more and 3.0 ppm or less.

(b) A peak whose peak top position is in an area of a chemical shift of −80 ppm or more and less than −40 ppm, with reference to tetramethoxysilane, and whose full width at half maximum is 0.3 ppm or more and 5.0 ppm or less.

[3] The silanol content is 0.1 weight % or more and 10 weight % or less.

It is preferable that the silicone material in the present invention has the characteristic [1], among the above-mentioned characteristics [1] to [3]. It is more preferable that the silicone material has the above-mentioned characteristics [1] and [2]. It is particularly preferable that the silicone material has all the above-mentioned characteristics [1] to [3].

In the following, the above-mentioned characteristics [1] to [3] will be explained.

[5-2-1. Characteristic [1] (Silicon Content)]

The silicon content in the silicone material that is preferable for the present invention is usually 20 weight % or more. However, it is particularly preferably 25 weight % or more, and more particularly preferably 30 weight % or more. On the other hand, the upper limit thereof is usually 47 weight %, because the silicon content of a glass, consisting only of $SiO_2$, is 47 weight %.

The silicon content of a silicone material can be calculated based on the result of inductively coupled plasma spectrometry (inductively coupled plasma spectrometry; hereinafter abbreviated as "ICP" when appropriate) analysis, carried out in accordance with, for example, a method described below.

{Measurement of Silicon Content}

A silicone material is kept in a platinum crucible in the air at 450° C. for 1 hour and then at 750° C. for 1 hour and at 950° C. for 1.5 hours for firing. After removal of carbon components, the small amount of residue obtained is added with a 10-fold amount or more of sodium carbonate, and then heated by a burner to melt it. Then the melted product is cooled and added with desalted water, being diluted to several ppm in silicon, while adjusting pH value to around neutrality using hydrochloric acid. And then ICP analysis is performed.

[5-2-2. Characteristic [2] (Solid Si—NMR Spectrum)]

When measuring the solid Si—NMR spectrum of a silicone material preferable for the present invention, at least one, preferably two or more of peaks can be observed in the aforementioned peak regions (a) and/or (b), originating from a silicon atom directly bonded with a carbon atom of an organic group.

Summarizing in terms of chemical shifts, in a silicone material preferable for the present invention, the full width at half maximum of the peak described in (a) is generally smaller than that of the peak of (b) described later, due to smaller constraints of molecular motion. Namely, it is in the range of usually 3.0 ppm or less, preferably 2.0 ppm or less, and usually 0.3 ppm or more.

On the other hand, the full width at half maximum of the peak described in (b) is in the range of usually 5.0 ppm or less, preferably 4.0 ppm or less, and usually 0.3 ppm or more, preferably 0.4 ppm or more.

If the full width at half maximum of a peak observed in the above chemical shift areas is too large, a state in which constraints of molecular motion are large and thus the distortion is large is created, leading possibly to forming a member inferior in heat resistance and weather resistance, and of which cracks are more likely to appear. For example when a lot of tetrafunctional silane is used or when large internal stress is generated by a rapid drying in the drying process, the range of the full width at half maximum will be larger than the above range.

If the full width at half maximum of the peak is too small, Si atoms existing in its environment are not involved in the siloxane crosslinking. In such a case, for example when trifunctional silane remains in a non-crosslinked state, the obtained member may be inferior in heat resistance and weather resistance to materials formed mainly of siloxane bonds.

However, even if a peak, of the above-mentioned range of the full width at half maximum, is observed in an area of −80 ppm or more in a silicone material containing a small amount of Si component in a large amount of organic components, the heat resistance, light resistance and coating properties may not be excellent.

The chemical shift value of a silicone material preferable for the present invention can be calculated based on the results of a solid Si—NMR measurement performed by, for example, a method described below. Also, the measured data (the full width at half maximum, silanol amount and so on) is analyzed by a method in which each peak is divided and extracted by the waveform separation analysis or the like utilizing, for example, the Gauss function or Lorentz function.

{Solid Si—NMR Spectrum Measurement and Calculation of the Silanol Content}

When measuring the solid Si—NMR spectrum of a silicone material, the solid Si—NMR spectrum measurement and the waveform separation analysis are performed under the following conditions. Further, the full width at half maximum of each peak is determined, for the silicone material, based on the obtained waveform data. In addition, the silanol content is determined by comparing the ratio (%) of silicon atoms in silanol to all silicon atoms, decided from the ratio of peak areas originating from silanol to all peak areas, with the silicon content ratio analyzed separately.

{Device Conditions}
Device: Infinity CMX-400 nuclear magnetic resonance spectroscope, manufactured by Chemagnetics Inc.
$^{29}$Si resonance frequency: 79.436 MHz
Probe: 7.5 mm (I) CP/MAS probe
Temperature: Room temperature
Rotational frequency of sample: 4 kHz
Measurement method: Single pulse method
$^{1}$H decoupling frequency: 50 kHz
$^{29}$Si flip angle: 90°
$^{29}$Si 90° pulse width: 5.0 µs
Repetition time: 600 s
Total count: 128 times
Observation width: 30 kHz
Broadening factor: 20 Hz
Authentic sample: tetramethoxysilane For a silicone material, 512 points are taken in as measured data and zero-filled to 8192 points, before Fourier transformation is performed.

{Waveform Separation Analysis Method}
For each peak of the spectrum after Fourier transformation, an optimization calculation is performed by the nonlinear least square method using the center position, height and full width at half maximum of a peak shape, created by a Lorentz waveform, Gauss waveform or a mixture of both, as variable parameters.

For identification of a peak, refer to AIChE Journal, 44(5), p. 1141, 1998 or the like.

[5-2-3. Characteristic [3] (Silanol Content)]
The silanol content of a silicone material preferable for the present invention is in the range of usually 0.1 weight % or more, preferably 0.3 weight % or more, and usually 10 weight % or less, preferably 8 weight % or less, more preferably 5 weight % or less. When the silanol content is small, the silanol material varies little over time and can be superior in long-term performance stability, as well as in low hygroscopicity and low moisture permeability. However, no silanol content results only in poor adhesion, and therefore, there is such appropriate range of the silanol content as described above.

The silanol content of a silicone material can be decided by such method as described before for {Solid Si—NMR spectrum measurement and calculation of the silanol content} in [5-2-2. Characteristic [2] (solid Si—NMR spectrum)], for example. In such a method, the ratio (%) of silicon atoms in silanol relative to all silicon atoms is determined from the ratio of peak areas originating from silanol relative to all peak areas by means of the solid Si—NMR spectrum measurement, and then, the silanol content can be calculated by comparing the determined silicon ratio with the silicon content analyzed separately.

Since a silicone material preferable for the present invention contains an appropriate amount of silanol, which is bound to a polar portion, usually existing on the device surface, through hydrogen bond, the adhesion develops. The polar portion includes, for example, a hydroxyl group and oxygen in a metalloxane bond.

In addition, a silicone material preferable for the present invention usually forms, due to dehydration condensation, a covalent bond with a hydroxyl group on the device surface when heated in the presence of an appropriate catalyst, leading to a development of still firmer adhesion.

With too much content of silanol, on the other hand, thickening in the system may make the coating difficult, and also, with increased activity, the occurrence of curing before low-boiling point components volatilize by heating may induce a foaming and an increase in internal stress, which may result in crack generations.

[5-3. Content of Liquid Medium]
There is no special limitation on the content of the liquid medium, insofar as the advantage of the present invention is not significantly impaired.

However, it is usually 50 weight % or more, preferably 75 weight % or more, and usually 99 weight % or less, preferably 95 weight % or less, to the whole phosphor-containing composition of the present invention. Even a large amount of liquid medium does not induce any problems particularly, but in order to achieve desired color coordinate, color rendering index, emission efficiency or the like when it is used for a semiconductor light emitting device, it is preferable that the liquid medium is used usually in the above-mentioned proportion. With too small amount of the liquid medium, on the other hand, its handling may be difficult due to too little fluidity.

The liquid medium serves mainly as binder, in the phosphor-containing composition of the present invention. The liquid medium can be used either as a single one or as a mixture of two or more kinds in any combination and in any ratio. For example, when a silicon-containing compound is used for the purpose of high heat resistance or light resistance, other thermosetting resin such as epoxy resin can be included to the extent that the durability of the silicon-containing compound will not be impaired. In such a case, it is preferable that the content of the other thermosetting resin is usually 25 weight % or lower, preferably 10 weight % or lower, to the whole amount of the liquid medium, which serves as the binder.

[5-4. Other Component]
In the phosphor-containing composition of the present invention, other components can be contained in addition to the phosphor and liquid medium, insofar as the advantage of the present invention is not significantly impaired. The other components may be used either as a single kind thereof or as a mixture of more than one kind in any combination and in any ratio.

[5-5. Advantageous Effect of Phosphor-Containing Composition]
The phosphor-containing composition of the present invention can fix the phosphor of the present invention at a desired location easily. For example when the phosphor-containing composition of the present invention is used for a light emitting device, the phosphor of the present invention can be easily fixed at a desired location by forming the phosphor-containing composition of the present invention at a desired location and curing the liquid medium for sealing the phosphor of the present invention with the liquid medium.

[6. Light Emitting Device]
The light emitting device of the present invention (hereinafter referred to as "the light emitting device" as appropriate) comprises a first luminous body (excitation light source) and a second luminous body which emits visible light when irradiated with light from the first luminous body. The light emitting device comprises one or more kinds of the phosphor of the present invention as the first phosphor in the second luminous body.

The light emitting device of the present invention can be of any known device configuration specifically in which an excitation light source to be described later is used as the first luminous body and the phosphor adjusted in its kind or content is used as the second luminous body. With such a configuration, the light emitting device of the present invention can emit any color of light.

For example, even an emission spectrum similarly to that of so-called pseudo-white (for example, a luminescent color of the light emitting device in which a blue LED and a yellow phosphor are combined) can be obtained by combining an excitation light source emitting blue light and a phosphor of the present invention emitting yellow green to orange fluorescence (namely, yellow green to orange phosphor). Furthermore, by incorporating a phosphor emitting red fluorescence (red phosphor) and, if necessary, a green phosphor in that white light emitting device, a light emitting device that is extremely excellent in red color rendering or emits a warm white light can be realized. A white light emitting device can also be produced by combining an excitation light source emitting near-ultraviolet light, a phosphor emitting blue fluorescence (blue phosphor), a green phosphor, and a red phosphor.

In this context, the white color of the white light emitting device includes all of (Yellowish) White, (Greenish) White, (Bluish) White, (Purplish) White and White, which are defined in JIS Z 8701. Of these, preferable is White.

Moreover, light emitting devices emitting any color of light can be produced by combining, as needed, a green phosphor (a phosphor emitting green fluorescence), blue phosphor, orange to red phosphor, or other kind of yellow phosphor and adjusting the kinds or the contents of the phosphors.

The phosphor of the present invention can be used either as a single kind or as a mixture of two or more kinds in any combination and in any ratio.

The emission spectrum peak in the green region, in the emission spectrum of light emitting device of the present invention, preferably exists in the wavelength range of from 515 nm to 535 nm. The emission spectrum peak in the red region thereof preferably exists in the wavelength range of from 580 nm to 680 nm. The emission spectrum peak in the blue region thereof preferably exists in the wavelength range of from 430 nm to 480 nm. The emission spectrum peak in the yellow region thereof preferably exists in the wavelength range of from 540 nm to 580 nm.

The emission spectrum of the light emitting device can be measured in a room of which temperature is kept at 25±1° C. with energization of 20 mA, using a software for measuring color and illumination intensity, manufactured by Ocean Optics, Inc., and a spectroscope of USB2000 series (integrating sphere version). From this emission spectrum data in the wavelength region of 380 nm to 780 nm, can be calculated the chromaticity value (x,y,z) as color coordinates of xyz colorimetric system, defined in JIS Z8701. In this case, the relational expression of x+y+z=1 holds. In the present Description, the aforementioned XYZ colorimetric system is occasionally referred to as XY colorimetric system and the value thereof is usually represented as (x,y).

Emission efficiency can be determined by calculating the total luminous flux from the results of emission-spectrum measurement using a light emitting device mentioned earlier and then dividing the lumen value (lm) obtained by the power consumption (W). The power consumption can be obtained as the product of the current value and the voltage value, which is measured using True RMS Multimeters Model 187 and 189 manufactured by Fluke Corporation while 20-mA energization.

The general color rendering index (Ra) and special color rendering index R9 of light emitting device of the present invention take the values of usually 80 or larger, preferably 90 or larger, and more preferably 95 or larger.

[6-1. Configuration of Light Emitting Device (Luminous Body)]

(First luminous body)

The first luminous body of the light emitting device of the present invention emits light for exciting the second luminous body to be described later.

The first luminous body has no particular limitation in its luminous wavelength, insofar as it overlaps the absorption wavelength of the second luminous body to be described later, and therefore, various luminous bodies with wide range of luminous wavelength regions are applicable. Usually a luminous body having luminous wavelength of from ultraviolet region to blue region is used. Among them, particularly preferable are luminous bodies having luminous wavelength of from near-ultraviolet region to blue region.

It is preferable that the luminous peak wavelength of the first luminous body usually has a concrete value of 200 nm or longer. Among them, it is preferable that, when a near-ultraviolet light is used as the excitation light, a luminous body with a peak luminous wavelength of usually 300 nm or longer, preferably 330 nm or longer, more preferably 360 nm or longer, and usually 420 nm or shorter is used. When a blue light is used as the excitation light, it is preferable that a luminous body with a peak luminous wavelength of usually 420 nm or longer, preferably 430 nm or longer, and usually 500 nm or shorter, preferably 480 nm or shorter is used. Both of these conditions are required from the standpoint of color purity of the light emitting device.

As the first luminous body, a semiconductor luminous element is generally used. Concretely, an LED, semiconductor laser diode (hereinafter, abbreviated as "LD" as appropriate) or the like can be used. Other examples of the luminous body that can be used as the first luminous body include an organic electroluminescence luminous element, inorganic electroluminescence luminous element or the like.

However, the luminous body that can be used as the first luminous body is not restricted to those exemplified in the present Description.

Among them, a GaN-based LED and GaN-based LD, using a GaN-based compound semiconductor, are preferable for the first luminous body. This is because a GaN-based LED and GaN-based LD have light output and external quantum efficiency far greater than those of an SiC-based LED and the like that emit the same range of light and therefore they can give very bright luminescence with very low electric power when used in combination with the above-mentioned phosphor. For example, when applying current load of 20 mA, a GaN-based LED and GaN-based LD usually have emission intensity 100 times or higher than that of an SiC-based ones. As GaN-based LED or GaN-based LD, one having an $Al_xGa_yN$ luminous layer, GaN luminous layer or $In_xGa_yN$ luminous layer is preferable. Among the GaN-based LEDs, one having an $In_xGa_yN$ luminous layer is particularly preferable due to its remarkably high emission intensity, and one having a multiple quantum well structure of the $In_xGa_yN$ layer and GaN layer is particularly preferable also due to its remarkably high emission intensity.

In the above description, the X+Y usually takes a value in the range of 0.8 to 1.2. A GaN-based LED having a such kind of luminous layer that is doped with Zn or Si or without any dopant is preferable for the purpose of adjusting the luminescent characteristics.

A GaN-based LED contains, as its basic components, a such kind of luminous layer, p layer, n layer, electrode and substrate. Among them, a GaN-based LED having such a heterostructure as sandwiching the luminous layer with n type and p type of $Al_xGa_yN$ layers, GaN layers, $In_xGa_yN$ layers or the likes is preferable, from the standpoint of high emission efficiency. Moreover, the one whose heterostructure is replaced by a quantum well structure is more preferable because it can show higher emission efficiency.

The first luminous body can be used either as a single one or as a mixture of two or more of them in any combination and in any ratio.

(Second Luminous Body)

The second luminous body of the light emitting device of the present invention is a luminous body which emits visible light when irradiated with light from the above-mentioned first luminous body. It comprises the aforementioned phosphor of the present invention as the first phosphor, as well as the second phosphor (orange to red phosphor, green phosphor, blue phosphor, yellow phosphor and the like) to be described later as appropriate depending on its use of the like. The second luminous body is formed, for example, so that the first and the second phosphors are dispersed in a sealing material.

There is no special limitation on the composition of the other phosphor than the phosphor of the present invention, which is used in the second luminous body. The examples include compounds incorporating a host crystal, such as a metal oxide typified by $Y_2O_3$, $YVO_4$, $Zn_2SiO_4$, $Y_3Al_5O_{12}$ and $Sr_2SiO_4$, a metal nitride typified by $Sr_2Si_5N_8$, phosphate typified by $Ca_5(PO_4)_3Cl$, a sulfide typified by ZnS, SrS and CaS and an oxysulfide typified by $Y_2O_2S$ and $La_2O_2S$, with an activation element or coactivation element, such as an ion of a rare earth metal including Ce, Pr, Nd, Pm, Sm, Eu, Tb, Dy, Ho, Er, Tm or Yb, or a metal ion of Ag, Cu, Au, Al, Mn or Sb.

Preferable examples of the host crystal include: sulfides such as (Zn, Cd)S, $SrGa_2S_4$, SrS and ZnS; oxysulfides such as $Y_2O_2S$; aluminates such as (Y, Gd)$_3Al_5O_{12}$, $YAlO_3$, $BaMgAl_{10}O_{17}$, (Ba, Sr)(Mg, Mn)$Al_{10}OP_{17}$, (Ba, Sr, Ca)(Mg, Zn, Mn)$Al_{10}O_{17}$, $BaAl_{12}O_{19}$, $CeMgAl_{11}O_{19}$, (Ba, Sr, Mg) O.$Al_2O_3$, $BaAl_2Si_2O_8$, $SrAl_2O_4$, $Sr_4Al_{14}O_{25}$ and $Y_3Al_5O_{12}$; silicates such as $Y_2SiO_5$ and $Zn_2SiO_4$; oxides such as $SnO_2$ and $Y_2O_3$; borates such as $GdMgB_5O_{10}$ and (Y, Gd)$BO_3$; halophosphates such as $Ca_{10}(PO_4)_6(F, Cl)_2$ and (Sr, Ca, Ba, Mg)$_{10}(PO_4)_6Cl_2$; and phosphates such as $Sr_2P_2O_7$ and (La, Ce)$PO_4$.

No particular limitation is imposed on the element compositions of the above-mentioned host crystal, and activation element or coactivation element. Partial substitution with an element of the same group is possible. Any phosphor obtained can be used so long as it absorbs light in the near-ultraviolet to visible region and emits visible light.

More concretely, those listed below can be used as phosphor. However, the lists are just examples and phosphors that can be used in the present invention are not limited to those examples. In the following examples, phosphors with different partial structure are shown abbreviated as a group for the sake of convenience, as mentioned earlier.

(First Phosphor)

The second luminous body in the light emitting device of the present invention contains at least the above-mentioned phosphor of the present invention as the first phosphor. The phosphor of the present invention can be used either as a single kind or as a mixture of two or more kinds in any combination and in any ratio.

In addition, the first phosphor may contain, in addition to the phosphor of the present invention, a phosphor (a combined same-color phosphor) emitting a fluorescence of the same color as that of the phosphor of the present invention. For example when the phosphor of the present invention is a green phosphor, another kind of green phosphor can be used as the first phosphor in combination with the phosphor of the present invention. When the phosphor of the present invention is a orange or red phosphor, another kind of orange to red phosphor can be used as the first phosphor in combination with the phosphor of the present invention. When the phosphor of the present invention is a blue phosphor, another kind of blue phosphor can be used as the first phosphor in combination with the phosphor of the present invention. In addition, when the phosphor of the present invention is a yellow phosphor, another kind of yellow phosphor can be used as the first phosphor in combination with the phosphor of the present invention.

There is no limitation on these phosphors, insofar as the advantage of the present invention is not significantly impaired.

(Green phosphor)

It is preferable that the wavelength of emission peak of such a green phosphor is in the range of usually longer than 500 nm, particularly 510 nm or longer, further particularly 515 nm or longer, and usually 550 nm or shorter, particularly 540 nm or shorter, further particularly 535 nm or shorter. When that wavelength of emission peak $\lambda_p$ is too short, the color tends to be bluish green. On the other hand, when it is too long, the color tends to be yellowish green. In both cases, the characteristics of its green light may deteriorate.

The full width at half maximum of emission peak of such a green phosphor is usually in the range of 40 nm to 80 nm.

The external quantum efficiency of such a green phosphor is usually 60% or higher, and preferably 70% or higher. The weight-average median diameter thereof is usually 1 μm or larger, preferably 5 μm or larger, more preferably 10 μm or larger, and usually 30 μm or smaller, preferably 20 μm or smaller, more preferably 15 μm or smaller.

Examples of such a green phosphor include an europium-activated alkaline earth silicon oxynitride phosphor represented by (Mg, Ca, Sr, Ba)$Si_2O_2N_2$:Eu, which is constituted by fractured particles having a fractured surface and emits light in the green region.

Other examples of such green phosphor include: Eu-activated aluminate phosphor such as $Sr_4Al_{14}O_{25}$:Eu and (Ba, Sr, Ca)$Al_2O_4$:Eu; Eu-activated silicate phosphor such as (Sr, Ba)$Al_2Si_2O_8$:Eu, (Ba, Mg)$_2SiO_4$:Eu, (Ba, Sr, Ca, Mg)$_2SiO_4$:Eu, (Ba, Sr, Ca)$_2$(Mg, Zn)$Si_2O_7$:Eu and phosphor; Ce, Tb-activated silicate phosphor such as $Y_2SiO_5$:Ce, Tb; Eu-activated borophosphate phosphor such as $Sr_2P_2O_7$—$Sr_2B_2O_5$:Eu; Eu-activated halosilicate phosphor such as $Sr_2Si_3O_8$-$2SrCl_2$:Eu; Mn-activated silicate phosphor such as $Zn_2SiO_4$:Mn; Tb-activated aluminate phosphor such as $CeMgAl_{11}O_{19}$:Tb and $Y_3Al_5O_{12}$:Tb; Tb-activated silicate phosphor such as $Ca_2Y_8(SiO_4)_6O_2$:Tb and $La_3Ga_5SiO_{14}$:Tb; Eu, Tb, Sm-activated thiogalate phosphor such as (Sr, Ba, Ca)$Ga_2S_4$:Eu, Tb, Sm; Ce-activated aluminate phosphor such as $Y_3$(Al, Ga)$_5O_{12}$:Ce and (Y, Ga, Tb, La, Sm, Pr, Lu)$_3$(Al, Ga)$_5O_{12}$:Ce; Ce-activated silicate phosphor such as $Ca_3Sc_2Si_3O_{12}$:Ce and $Ca_3$(Sc, Mg, Na, Li)$_2Si_3O_{12}$:Ce; Ce-activated oxide phosphor such as $CaSc_2O_4$:Ce; Eu-activated oxynitride phosphor such as Eu-activated β-sialon; Eu, Mn-activated aluminate phosphor such as $BaMgAl_{10}O_{17}$:Eu, Mn; Eu-activated aluminate such as $SrAl_2O_4$:Eu; Tb-activated oxysulfide phosphor such as $(La, Gd, Y)_2O_2S$:Tb; Ce, Tb-activated phosphate phosphor such as $LaPO_4$:Ce, Tb; sulfide phosphor such as ZnS:Cu, Al and ZnS:Cu, Au, Al; Ce, Tb-activated borate phosphor such as (Y, Ga, Lu, Sc, La)$BO_3$:Ce, Tb, $Na_2Gd_2B_2O_7$:Ce, Tb and (Ba, Sr)$_2$(Ca, Mg, Zn)$B_2O_6$:K, Ce, Tb; Eu, Mn-activated halosilicate phosphor such as $Ca_8Mg(SiO_4)_4Cl_2$:Eu, Mn; Eu-activated thioaluminate phosphor or thiogallate phosphor such as (Sr, Ca, Ba)(Al, Ga, In)$_2S_4$:Eu; Eu, Mn-activated halosilicate phosphor such as (Ca, Sr)$_8$(Mg, Zn)(SiO$_4$)$_4$Cl$_2$: Eu, Mn; and Eu-activated oxynitride such as $M_3Si_6O_9N_4$:Eu and $M_3Si_6O_{12}N_2$:Eu (here, M represents alkaline earth metal element).

Also applicable as the green phosphor are fluorescent dyes such as pyridine-phthalimide condensed derivative, benzoxadinone compound, quinazoline compound, coumarine compound, quinophthalone compound, naphthalimide compound, and organic phosphors such as terbium complex.

The green phosphor exemplified above can be used either as a single kind or as a mixture of two or more kinds in any combination and in any ratio.

(Orange to Red Phosphor)

It is preferable that the wavelength of emission peak of such an orange to red phosphor is in the range of usually 570 nm or longer, preferably 580 nm or longer, more preferably 585 nm or longer, and usually 780 nm or shorter, preferably 700 nm or shorter, more preferably 680 nm or shorter.

Examples of such an orange to red phosphor include an europium-activated alkaline earth silicon nitride phosphor represented by (Mg, Ca, Sr, Ba)$_2Si_5N_8$:Eu, which is constituted by fractured particles having red fractured surfaces and emits light in red region, and an europium-activated rare-earth oxychalcogenide phosphor represented by (Y, La, Gd, Lu)$_2O_2S$:Eu, which is constituted by growing particles having a nearly spherical shapes typical of regular crystal growth and emits light in red region.

The full width at half maximum of emission peak of such a red phosphor is usually in the range of 1 nm to 100 nm.

The external quantum efficiency of such a red phosphor is usually 60% or higher, and preferably 700 or higher. The weight-average median diameter thereof is usually 1 μm or larger, preferably 5 μm or larger, more preferably 10 μm or larger, and usually 30 μm or smaller, preferably 20 μm or smaller, more preferably 15 μm or smaller.

Also applicable in the present embodiment is an phosphor containing oxynitride and/or oxysulfide which include at least one element selected from the group consisting of Ti, Zr, Hf, Nb, Ta, W and Mo, described in Japanese Patent Laid-Open Publication (Kokai) No. 2004-300247, and containing an oxynitride having an α-sialon structure in which all or part of Al elements are replaced by Ga elements. These are phosphors which contain oxynitride and/or oxysulfide.

Other examples of the red phosphor include: Eu-activated oxysulfide phosphor such as (La, Y)$_2O_2S$:Eu; Eu-activated oxide phosphor such as Y(V, P)$O_4$:Eu and $Y_2O_3$:Eu; Eu, Mn-activated silicate phosphor such as (Ba, Mg)$_2SiO_4$:Eu, Mn and (Ba, Sr, Ca)$_2SiO_4$:Eu, Mn; Eu-activated tungstate such as $LiW_2O_8$:Eu, $LiW_2O_8$:Eu, Sm, $Eu_2W_2O_9$, $Eu_2W_2O_9$:Nb, $Eu_2W_2O_9$:Sm; Eu-activated sulfide phosphor such as (Ca, Sr)S:Eu; Eu-activated aluminate phosphor such as $YAlO_3$:Eu; Eu-activated silicate phosphor such as $Ca_2Y_8(SiO_4)_6O_2$:Eu, $LiY_9(SiO_4)_6O_2$:Eu, (Sr, Ba, Ca)$_3SiO_5$:Eu and $Sr_2BaSiO_5$:Eu; Ce-activated aluminate phosphor such as (Y, Gd)$_3Al_5O_{12}$:Ce and (Tb, Gd)$_3Al_5O_{12}$:Ce; Eu-activated oxide, nitride or oxynitride phosphor such as (Mg, Ca, Sr, Ba)$_2Si_5$(N, O)$_8$:Eu, (Mg, Ca, Sr, Ba)Si(N, O)$_2$:Eu and (Mg, Ca, Sr, Ba)AlSi(N, O)$_3$:Eu; Eu, Mn-activated halophosphate phosphor such as (Sr, Ca, Ba, Mg)$_{10}$(PO$_4$)$_6$Cl$_2$:Eu, Mn; Eu, Mn-activated silicate phosphor such as $Ba_3MgSi_2O_8$:Eu, Mn and (Ba, Sr, Ca, Mg)$_3$(Zn, Mg)Si$_2O_8$:Eu, Mn; Mn-activated germanate phosphor such as 3.5MgO.0.5MgF$_2$.GeO$_2$:Mn; Eu-activated oxynitride phosphor such as Eu-activated α-sialon; Eu, Bi-activated oxide phosphor such as (Gd, Y, Lu, La)$_2O_3$:Eu, Bi; Eu, Bi-activated oxysulfide phosphor such as (Gd, Y, Lu, La)$_2O_2S$:Eu, Bi; Eu, Bi-activated vanadate phosphor such as (Gd, Y, Lu, La)VO$_4$:Eu, Bi; Eu, Ce-activated sulfide phosphor such as $SrY_2S_4$:Eu, Ce; Ce-activated sulfide phosphor such as $CaLa_2S_4$:Ce; Eu, Mn-activated phosphate phosphor such as (Ba, Sr, Ca)MgP$_2O_7$:Eu, Mn and (Sr, Ca, Ba, Mg, Zn)$_2P_2O_7$:Eu, Mn; Eu, Mo-activated tungstate phosphor such as (Y, Lu)$_2WO_6$:Eu, Mo; Eu, Ce-activated nitride phosphor such as (Ba, Sr, Ca)$_x$Si$_y$N$_z$:Eu, Ce (x,y,z being an integer of 1 or larger); Eu, Mn-activated halophosphate phosphor such as (Ca, Sr, Ba, Mg)$_{10}$(PO$_4$)$_6$(F, Cl, Br, OH):Eu, Mn; and Ce-activated silicate phosphor such as ((Y, Lu, Gd, Tb)$_{1-x-y}$Sc$_x$Ce$_y$)$_2$(Ca, Mg)$_{1-r}$(Mg, Zn)$_{2+r}$Si$_{z-q}$Ge$_q$O$_{12+\delta}$.

Also applicable examples of the red phosphor include: red organic phosphor consisting of rare-earth ion complex containing anions of such as β-diketonate, β-diketone, aromatic carboxylic acid or Bronsted acid as ligands, perylene pigment (for example, dibenzo{[f,f']-4,4',7,7'-tetraphenyl}diindeno [1,2,3-cd:1',2',3'-lm]perylene), anthraquinone pigment, lake pigment, azo pigment, quinacridone pigment, anthracene pigment, isoindoline pigment, isoindolinone pigment, phthalocyanine pigment, triphenylmethane series basic dye, indanthrone pigment, indophenol pigment, cyanine pigment and dioxazine pigment.

Among them, it is preferable that the red phosphor contains (Ca, Sr, Ba)$_2Si_5$(N, O)$_8$:Eu, (Ca, Sr, Ba)Si(N, O)$_2$:Eu, (Ca, Sr, Ba)AlSi(N, O)$_3$:Eu, (Ca, Sr, Ba)AlSi(N, O)$_3$:Ce, (Sr, Ba)$_3SiO_5$:Eu, (Ca, Sr)S:Eu, (La, Y)$_2O_2S$:Eu or Eu complex. It is more preferable that it contains (Ca, Sr, Ba)$_2Si_5$(N, O)$_8$: Eu, (Ca, Sr, Ba)Si(N, O)$_2$:Eu, (Ca, Sr, Ba)AlSi(N, O)$_3$:Eu, (Ca, Sr, Ba)AlSi(N, O)$_3$:Ce, (Sr, Ba)$_3SiO_5$:Eu, (Ca, Sr)S:Eu, (La, Y)$_2O_2S$:Eu, 6-diketone Eu complex such as Eu(dibenzoylmethane)$_3$.1,10-phenanthroline complex or carboxylic acid Eu complex. Of these, especially preferable are (Ca, Sr, Ba)$_2Si_5$(N, O)$_8$:Eu, (Sr, Ca)AlSi(N, O):Eu and (La, Y)$_2O_2S$: Eu.

Among the above examples, a phosphor that can be preferably used as the orange phosphor is (Sr, Ba)$_3SiO_5$:Eu.

Such an orange to red phosphor may be used either as a single kind thereof or as a mixture of more than one kind in any combination and in any ratio.

(Blue Phosphor)

It is preferable that the wavelength of emission peak of such a blue phosphor is in the range of usually 420 nm or longer, preferably 430 nm or longer, more preferably 440 nm or longer, and usually 490 nm or shorter, preferably 480 nm or shorter, more preferably 470 nm or shorter, further preferably 460 nm or shorter.

The full width at half maximum of emission peak of such a blue phosphor is usually in the range of 20 nm to 80 nm.

The external quantum efficiency of such a blue phosphor is usually 60% or higher, and preferably 70% or higher. The weight-average median diameter thereof is usually 1 μm or larger, preferably 5 μm or larger, more preferably 10 μm or larger, and usually 30 μm or smaller, preferably 20 μm or smaller, more preferably 15 μm or smaller.

Examples of such a blue phosphor include: europium-activated barium magnesium aluminate phosphors represented by (Ba, Sr, Ca)MgAl$_{10}O_{17}$:Eu, which is constituted by growing particles having a nearly hexagonal shape typical of regular crystal growth and emits light in the blue region, europium-activated calcium halphosphate phosphors represented by $(Mg, Ca, Sr, Ba)_5(PO_4)_3(Cl, F):Eu$, which is constituted by growing particles having a nearly spherical shape typical of regular crystal growth and emits light in the blue region, europium-activated alkaline earth chloroborate phosphors represented by $(Ca, Sr, Ba)_2B_5O_9Cl:Eu$, which is constituted by growing particles having a nearly cubic shape typical of regular crystal growth and emits light in the blue region, and europium-activated alkaline earth aluminate phosphors represented by $(Sr, Ca, Ba)Al_2O_4:Eu$ or $(Sr, Ca, Ba)_4Al_{14}O_{25}:Eu$, which is constituted by fractured particles having fractured surfaces and emits light in the blue green region.

Other examples of such a blue phosphor include: Sn-activated phosphate phosphor such as $Sr_2P_2O_7:Sn$; Eu-activated aluminate phosphor such as $(Sr, Ca, Ba)Al_2O_4:Eu$ or $(Sr, Ca, Ba)_4Al_{14}O_{25}:Eu$, $BaMgAl_{10}O_{17}:Eu$, $(Ba, Sr, Ca)MgAl_{10}O_{17}:Eu$, $BaMgAl_{10}O_{17}:Eu, Tb, Sm$ and $BaAl_8O_{13}:Eu$; Ce-activated thiogalate phosphor such as $SrGa_2S_4:Ce$ and $CaGa_2S_4:Ce$; Eu, Mn-activated aluminate phosphor such as $(Ba, Sr, Ca)MgAl_{10}O_{17}:Eu, Mn$; Eu-activated halophosphate phosphor such as $(Sr, Ca, Ba, Mg)_{10}(PO_4)_6Cl_2:Eu$ and $(Ba, Sr, Ca)_5(PO_4)_3(Cl, F, Br, OH):Eu, Mn, Sb$; Eu-activated silicate phosphor such as $BaAl_2Si_2O_8:Eu$, $(Sr, Ba)_3MgSi_2O_8:Eu$; Eu-activated phosphate phosphor such as $Sr_2P_2O_7:Eu$; sulfide phosphor such as $ZnS:Ag$ and $ZnS:Ag, Al$; Ce-activated silicate phosphor such as $Y_2SiO_5:Ce$; tungstate phosphor such as $CaWO_4$; Eu, Mn-activated borophosphate phosphor such as $(Ba, Sr, Ca)BPO_5:Eu, Mn$, $(Sr, Ca)_{10}(PO_4)_6.nB_2O_3:Eu$ and $2SrO.0.84P_2O_5.0.16B_2O_3:Eu$; Eu-activated halosilicate phosphor such as $Sr_2Si_3O_8.2SrCl_2:Eu$; Eu-activated oxynitride phosphor such as $SrSi_9Al_{19}ON_{31}:Eu$ and $EuSi_9Al_{19}ON_{31}$; and Ce-activated oxynitride phosphor such as $La_{1-x}Ce_xAl(Si_{6-z}Al_z)(N_{10-z}O_z)$ (here, x and z are numbers satisfying $0 \leq x \leq 1$ and $0 \leq z \leq 6$, respectively) and $La_{1-x-y}Ce_x$-$Ca_yAl(Si_{6-z}Al_z)(N_{10-z}O_z)$ (here, x, y and z are numbers satisfying $0 \leq x \leq 1$, $0 \leq y \leq 1$ and $0 \leq z \leq 6$, respectively).

Also applicable as the blue phosphor are, for example, fluorescent dyes such as naphthalimide compound, benzoxazole compound, styryl compound, coumarine compound, pyrazoline compound and triazole compound, and organic phosphors such as thlium complex.

Among them, it is preferable that the blue phosphor contains $(Ca, Sr, Ba)MgAl_{10}O_{17}:Eu$, $(Sr, Ca, Ba, Mg)_{10}(PO_4)_6(Cl, F)_2:Eu$ or $(Ba, Ca, Mg, Sr)_2SiO_4:Eu$. It is more preferable that it contains $(Ca, Sr, Ba)MgAl_{10}O_{17}:Eu$, $(Sr, Ca, Ba, Mg)_{10}(PO_4)_6(Cl, F)_2:Eu$ or $(Ba, Ca, Sr)_3MgSi_2O_8:Eu$. It is still more preferable that it contains $BaMgAl_{10}O_{17}:Eu$, $Sr_{10}(PO_4)_6(Cl, F)_2:Eu$ or $Ba_3MgSi_2O_8:Eu$. Of these, $(Sr, Ca, Ba, Mg)_{10}(PO_4)_6Cl_2:Eu$ or $(Ca, Sr, Ba)MgAl_{10}O_{17}:Eu$ is particularly preferable in uses for an illuminating device and a display.

Such a blue phosphor may be used either as a single kind thereof or as a mixture of more than one kind in any combination and in any ratio.

(Yellow Phosphor)

It is preferable that the wavelength of emission peak of such a yellow phosphor is in the range of usually 530 nm or longer, preferably 540 nm or longer, more preferably 550 nm or longer, and usually 620 nm or shorter, preferably 600 nm or shorter, more preferably 580 nm or shorter.

The full width at half maximum of emission peak of such a yellow phosphor is usually in the range of 60 nm to 200 nm.

The external quantum efficiency of such a yellow phosphor is usually 600 or higher, and preferably 70% or higher. The weight-average median diameter thereof is usually 1 μm or larger, preferably 5 μm or larger, more preferably 10 μm or larger, and usually 30 μm or smaller, preferably 20 μm or smaller, more preferably 15 μm or smaller.

Examples of such a yellow phosphor include various phosphors of such as oxide, nitride, oxynitride, sulfide and oxysulfide.

Particularly preferable examples include garnet phosphors having garnet structures, represented by $RE_3M_5O_{12}:Ce$ (here, RE indicates at least one element selected from the group consisting of Y, Tb, Gd, Lu and Sm, M indicates at least one element selected from the group consisting of Al, Ga and Sc) and $M^a_3M^b_2M^c_3O_{12}:Ce$ (here, $M^a$, $M^b$ and $M^c$ are divalent, trivalent and tetravalent metal element respectively), for example; orthosilicate phosphors represented by $AE_2M^dO_4:Eu$ (here, AE indicates at least one element selected from the group consisting of Ba, Sr, Ca, Mg and Zn, $M^d$ indicates Si and/or Ge), for example; oxynitride phosphors in which a part of the oxygen, contained in the above types of phosphors as constituent element, are substituted by nitrogen; and Ce-activated nitride phosphors having $CaAlSiN_3$ structures such as $AEAlSi(N, O)_3:Ce$ (here, AE indicates at least one element selected from the group consisting of Ba, Sr, Ca, Mg and Zn).

Also applicable as the yellow phosphor are: Eu-activated phosphors including sulfides such as $CaGa_2S_4:Eu$, $(Ca, Sr)Ga_2S_4:Eu$ and $(Ca, Sr)(Ga, Al)_2S_4:Eu$; and oxynitrides having saialon structure such as $Ca_x(Si, Al)_{12}(O, N)_{16}:Eu$.

As other examples of the yellow phosphor can be cited fluorescent dyes such as brilliant sulfoflavine FF (Color Index Number 56205), basic yellow HG (Color Index Number 46040), eosine (Color Index Number 45380) and rhodamine 6G (Color Index Number 45160).

Such a yellow phosphor may be used either as a single kind thereof or as a mixture of more than one kind in any combination and in any ratio.

(Second Phosphor)

The second luminous body of the light emitting device of the present invention may contain another phosphor (namely, a second phosphor) in addition to the above-mentioned first phosphor, depending on its use. The second phosphor is a phosphor having a different wavelength of emission peak from that of the first phosphor. Such a second phosphor is usually used for adjusting color tone of light emission of the second luminous body. Therefore, as the second phosphor, a phosphor emitting a different-color fluorescence from the first phosphor is often used.

As described above, when a green phosphor is used as the first phosphor, a phosphor other than green phosphor, such as orange to red phosphor, blue phosphor, or yellow phosphor, is used as the second phosphor. When an orange to red phosphor is used as the first phosphor, a phosphor other than orange to red phosphor, such as green phosphor, blue phosphor, or yellow phosphor, is used as the second phosphor.

When a blue phosphor is used as the first phosphor, a phosphor other than blue phosphor, such as green phosphor, orange to red phosphor, or yellow phosphor, is used as the second phosphor. When a yellow phosphor is used as the first phosphor, a phosphor other than yellow phosphor, such as green phosphor, orange to red phosphor, or blue phosphor, is used as the second phosphor.

Examples of such green, orange to red, blue and yellow phosphors include the same phosphors listed above in the chapter of the first phosphor.

It is preferable that the weight-average median diameter of the second phosphor used for the light emitting device of the present invention is in the range of usually 10 μm or larger, preferably 12 μm or larger, and usually 30 μm or smaller, preferably 25 μm or smaller. When the weight-average median diameter is too small, the brightness tends to decrease and the phosphor particles tend to aggregate. On the other hand, the weight-average median diameter is too large, unevenness in coating, clogging in a dispenser or the like tend to occur.

(Combination of Second Phosphors)

Since the phosphor of the present invention usually emits a yellow green to orange light, it can realize a white light emitting device when used with a blue light emitting first luminous body (which usually has an emission peak in the wavelength range of 420 nm or longer and 500 nm or shorter). The color rendering can be enhanced and the color tone can be adjusted, by adjusting the wavelength of emission peak of the first luminous body or mixing a second phosphor as appropriate. The second phosphor can be used either as a single kind thereof or as a mixture of two or more kinds in any combination and in any ratio. There is no special limitation on the ratio between the first phosphor and the second phosphor, insofar as the advantage of the present invention is not significantly impaired. Accordingly, the amount of the second phosphor used, as well as the combination and the mixing ratio of the second phosphors used, can be specified arbitrarily according to the use or the like of the light emitting device.

The phosphor of the present invention can be used as a mixture with another phosphor (in this context, "mixture" does not necessarily mean to blend the phosphors with each other, but means to use different kinds of phosphors in combination). Among them, the combined use of phosphors described above will provide a preferable phosphor mixture. There is no special limitation on the kind or the ratio of the phosphors mixed.

One of such a preferable combination is as follows. A blue light emitting luminous body (which usually has an emission peak in the wavelength range of 420 nm or longer and 500 nm or shorter) is used as the first luminous body. The phosphor of the present invention is used as the first phosphor. An orange to red phosphor (which usually has an emission peak in the wavelength range of 570 nm or longer and 780 nm or shorter) and/or a green phosphor (which usually has an emission peak in the wavelength range of 500 nm or longer and 550 nm or shorter) are used as the second phosphor.

Another such preferable combination is as follows. A near-ultraviolet light emitting luminous body (which usually has an emission peak in the wavelength range of 300 nm or longer and 420 nm or shorter) is used as the first luminous body. The phosphor of the present invention is used as the first phosphor. A blue phosphor (which usually has an emission peak in the wavelength range of 420 nm or longer and 490 nm or shorter) is used as the second phosphor. An orange to red phosphor and/or a green phosphor may be added to this combination.

(Sealing Material)

In the light emitting device of the present invention, the above-mentioned first and/or second phosphors are usually used by being dispersed in a liquid medium, a sealing member, which seals the phosphors by being cured by heat or light.

Examples of that liquid medium include the same ones as listed earlier in the aforementioned section of [5. Phosphor-containing composition].

The liquid medium may contain a metal element that can be a metal oxide having high refractive index, for the purpose of adjusting the refractive index of the sealing member. As examples of a metal element providing metal oxide having high refractive indexes can be cited Si, Al, Zr, Ti, Y, Nb and B.

These metal elements can be used as a single kind or as a mixture of two or more kinds in any combination and in any ratio.

There is no special limitation on the state of existence of such metal elements, insofar as the transparency of the sealing member does not deteriorate. For example, they may exist as a uniform grass layer of metalloxane bonds or as particles in the sealing member. When they exist in a state of particles, the structure inside the particles may be either amorphous or crystal structure. However, for higher refractive index, the crystal structure is preferable. In such a case, the particle diameter thereof is usually equal to or smaller than the luminous wavelength of a semiconductor luminous element, and preferably 100 nm or smaller, more preferably 50 nm or smaller, particularly preferably 30 nm or smaller, in order not to impair the transparency of the sealing member. The above-mentioned metal elements in a state of particles contained in the sealing member can be obtained by means of adding, to a silicone material, such particles as silicon oxide, aluminium oxide, zirconium oxide, titanium oxide, yttrium oxide, niobium oxide or the like, for example.

Furthermore, the above-mentioned liquid medium may be further added with a known additive such as diffusing agent, filler, viscosity modifier and UV absorbing agent. These additives can be used either as a single one or as a combination of two or more kinds in any combination and in any ratio.

[6-2. (Other) Configurations of Light Emitting Device]

There is no special limitation on the other configuration of the light emitting device of the present invention, insofar as it comprises the above-mentioned first luminous body and second luminous body. However, it usually comprises a frame on which the above-mentioned first luminous body and second luminous body are located. The location is configured so that the second luminous body is excited (namely, the first and second phosphors are excited) by the light emitted from the first luminous body to emit light and the lights from the first luminous body and/or from the second luminous body are radiated to the outside. At this point, it is not always necessary for the first and second phosphors to be contained in the same layer. Each of different colored phosphors may be contained in the different layer from each other. For example, a layer containing the second phosphor can be laminated on a layer containing the first phosphor.

The light emitting device of the present invention may also utilize a member other than the above-mentioned excitation light source (the first luminous body), the phosphor (the second luminous body) and a frame. As the example can be cited the aforementioned sealing material. The sealing material can be used for, in addition to dispersing the phosphor (the second luminous body), adhering the excitation light source (the first luminous body), the phosphor (the second luminous body) and the frame to each other, in the light emitting device.

[6-3. Embodiment of Light Emitting Device]

The light emitting device of the present invention will be explained in detail below with reference to a concrete embodiment. However, it is to be noted that the present invention is by no means restricted to the following embodiment and any modifications can be added thereto insofar as they do not depart from the scope of the present invention.

FIG. 1 is a schematic perspective view illustrating the positional relationship between the first luminous body, which functions as the excitation light source, and the second luminous body, constructed as the phosphor-containing part containing a phosphor, in an example of the light emitting device of the present invention. In FIG. 1, the numeral 1 indicates a phosphor-containing part (second luminous body), the numeral 2 indicates a surface emitting type GaN-based LD as an excitation light source (first luminous body), and the numeral 3 indicates a substrate. In order to configure them so that they are in contact with each other, the LD (2) and the phosphor-containing part (second luminous body) (1), prepared separately, may be made contact with each other in their surfaces by means of adhesive or the like, or otherwise, a layer of the phosphor-containing part (second luminous body) may be formed (molded) on the emission surface of the LD (2). With such configurations, the LD (2) and the phosphor-containing part (second luminous body) (1) can be kept contact with each other.

With such device configurations, light quantity loss, induced by a leakage of light emitted from the excitation light source (first luminous body) and reflected on the layer surface of the phosphor-containing part (second luminous body) to outside, can be avoided, which makes possible enhancement in emission efficiency of the entire device.

Figure 2A:
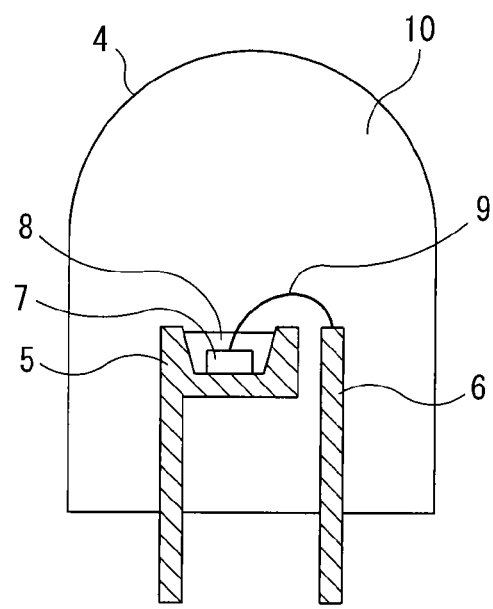
FIG. 2(*a*) and FIG. 2(*b*) are schematic sectional views illustrating examples of the light emitting device having an excitation light source (first luminous body) and a phosphor-containing part (second luminous body).
Figure 2B:
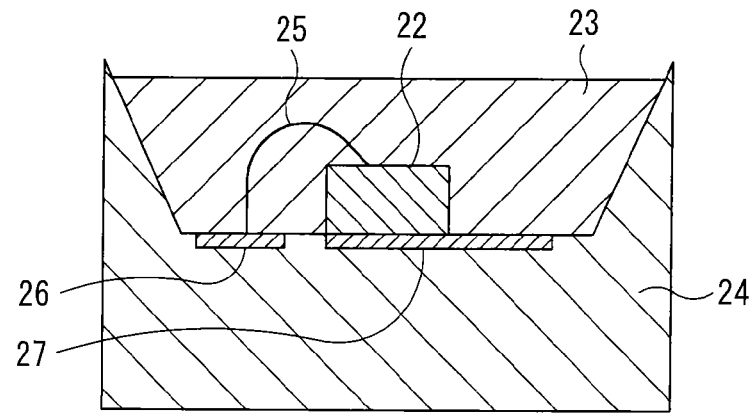

FIG. 2(*a*) shows a typical example of a light emitting device generally called a sell type. It is a schematic sectional view illustrating an example of the light emitting device comprising an excitation light source (first luminous body) and a phosphor-containing part (second luminous body). In this light emitting device (4), the numeral 5, numeral 6, numeral 7, numeral 8, numeral 9 and numeral 10 indicate a mount lead, inner lead, excitation light source (first luminous body), phosphor-containing resinous part, conductive wire and mold member, respectively.

FIG. 2(*b*) shows a typical example of a light emitting device generally called a surface-mount type. It is a schematic sectional view illustrating an example of the light emitting device comprising an excitation light source (first luminous body) and a phosphor-containing part (second luminous body). In the Figure, the numeral 22, numeral 23, numeral 24, numeral 25 and numerals 26, 27 indicate an excitation light source (first luminous body), a phosphor-containing resinous part as phosphor-containing part (second luminous body), a frame, a conductive wire and electrodes, respectively.

[6-4. Use of Light Emitting Device]

There is no special limitation on the use of the light emitting device of the present invention, and therefore it can be used in various fields where a usual light emitting device is used. However, owing to its wide color reproduction range and high color rendering, it can be used as a light source of illuminating devices or displays particularly preferably.

[6-4-1. Illuminating Device]

The application of the light emitting device of the present invention to an illuminating device can be carried out by incorporating a light emitting device such as described earlier into a known illuminating device as appropriate. A surface-emitting illuminating device (11), shown in FIG. 3, in which the aforementioned light emitting device (4) is incorporated, can be cited as the example.

Figure 3:
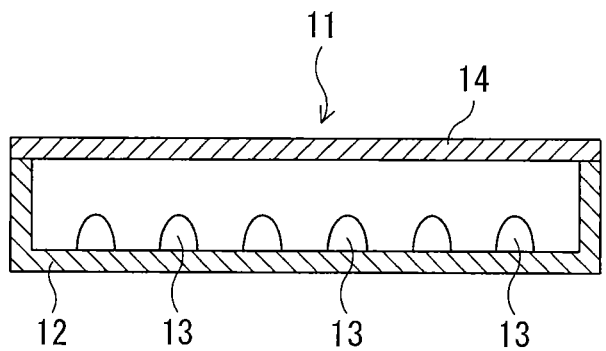
FIG. 3 is a schematic view of an example of a surface-emitting illuminating device incorporating the light emitting device.

FIG. 3 is a sectional view schematically illustrating an embodiment of the illuminating device of the present invention. As shown in this FIG. 3, the surface-emitting illuminating device comprises a large number of light emitting devices (13) (corresponding to the aforementioned light emitting device (4)) on the bottom surface of a rectangular holding case (12), of which inner surfaces are made to be opaque ones such as white smooth surfaces, and a power supply, circuit or the like (not shown in the figure) for driving the light emitting devices (13) outside the holding case. In addition, it comprises a milky-white diffusion plate (14), such as an acrylic plate, at the place corresponding to the cover part of the holding case (12), for homogenizing the light emitted.

When the surface-emitting illuminating device (11) is driven by means of applying a voltage to the excitation light source (the first luminous body) of the light emitting device (13), light is emitted from the light source and the aforementioned phosphor in the phosphor-containing resinous part, which serves as phosphor-containing part (the second luminous body), absorbs a part of the emitted light and emits visible light. On the other hand, the blue light that is not absorbed in the phosphor is mixed with the visible light to form a light emission with high color rendering, and then the mixed light passes through the diffusion plate (14) to be radiated in the upward direction of the figure. Consequently, an illumination light with a brightness that is uniform within the surface of the diffusion plate (14) of the holding case (12) can be obtained.

[6-4-2. Display]

When the light emitting device of the present invention is used as a light source in a display, there is no limitation on the concrete configuration of the display. However, it is preferable to be used together with a color filter. For example, a color display, which is a kind of display, utilizing a color liquid-crystal display element can be formed by combining the above-mentioned light emitting device as back-lighting, an optical shutter utilizing a liquid crystal, and a color filter having red, green and blue picture elements.

The NTSC ratio of the color reproduction range of the light passed through the color filter is usually 60% or higher, preferably 80% or higher, more preferably 90% or higher, still more preferably 100% or higher, and usually 150% or lower.

The transmitted light amount from each color filter relative to the transmitted light amount from the entire color filters (namely, light utilization efficiency) is usually 20% or higher, preferably 25% or higher, more preferably 28% or higher, and still more preferably 30% or higher. The higher the utilization efficiency, the more preferable. However, since three kinds of filters red, green and blue are used, they are usually 33% or lower.

EXAMPLE

The present invention will be explained specifically below by referring to examples. However, the present invention is not limited to the examples and any modifications can be added thereto insofar as they do not depart from the scope of the present invention.

I. Examples with Respect to Phosphor of Present Invention (I)

In what follows, Examples or the like with respect to the phosphor of the present invention (I) will be explained.

[Raw Materials]

As commercially available materials for a phosphor, lanthanum nitride powder (manufactured by Kojundo Chemical Lab. Co., Ltd), silicon nitride powder ($Si_3N_4$, manufactured by DENKI KAGAKU KOGYO KABUSHIKI KAISHA, mean particle diameter of 0.5 μm, oxygen content of 0.93 weight %, α-type content of 92%), and cerium oxide powder (manufactured by Shin-Etsu Chemical Co., Ltd.) were used. As another phosphor material, synthesized $CaSiN_2$ powder was used.

[Measurement Methods]

[Emission Spectrum]

The emission spectra were measured by using a fluorescence measurement apparatus (manufactured by JASCO corporation) equipped with an excitation light source of 150-W xenon lamp and a spectrum measurement apparatus of multichannel CCD detector, C7041 (manufactured by Hamamatsu Photonics K.K.). The lights from the excitation light source were passed through a grating monochromator with focal length of cm so as to isolate the excitation lights of 460-nm or 465-nm wavelength, and the isolated excitation lights were radiated onto the phosphors via an optical fiber. The lights emitted from the phosphors by irradiation of the excitation light were separated using a grating monochromator with focal length of 25 cm, and the emission intensity of each wavelength of the lights was measured using the spectrum measurement apparatus at the wavelength range of from 300 nm to 800 nm. Then, through a signal processing such as sensitivity correction by a personal computer, the emission spectra were obtained. The slit width of the receiving spectroscope was specified at 1 nm during the measurement.

[Full Width at Half Maximum of Emission Peak]

The full width at half maximum of each emission peak (hereinafter simply referred to as "the full width at half maximum" occasionally) was calculated from the emission spectra obtained by the above-mentioned method.

[Color Coordinates]

The color coordinates of x, y colorimetric system (CIE 1931 colorimetric system) were calculated, as color coordinates x and y of the XYZ colorimetric system defined in JIS 28701, by a method in accordance with JIS 28724 from the data of the emission spectra in the wavelength region of from 420 nm to 800 nm obtained by the above-mentioned method.

[Method for Measuring Excitation Spectrum]

The excitation spectra were measured using a fluorescence spectrophotometer, F-4500 type, (manufactured by Hitachi, Ltd.) at a room temperature.

[Internal Quantum Efficiency, External Quantum Efficiency, and Absorption Efficiency]

The absorption efficiency $\alpha_q$, internal quantum efficiency $\eta_i$, and external quantum efficiency $\eta_o$ of the phosphor were determined by the following procedure. First, the phosphor sample to be measured is stuffed up in a cell with its surface smoothed sufficiently to keep high measurement accuracy, and then it was set on an integrating sphere.

The integrating sphere was irradiated with light, from a light emission source (150-W Xe lamp) for exciting the phosphor, using an optical fiber. The light from the aforementioned light emission source was adjusted to be a monochromatic light having a wavelength of emission peak of 455 nm using a monochromator (grating monochromator) and the like.

Then the spectra of the emitted light (fluorescence) and the reflected light from the phosphor sample were measured using a spectrometer (MCPD7000, manufactured by Otsuka Electronics Co., Ltd.) by irradiating the phosphor sample to be measured with the above monochromatic excitation light. The light within the integrating sphere was guided to the spectrometer with an optical fiber.

Absorption efficiency $\alpha_q$ takes the value obtained through dividing $N_{abs}$ by N, where $N_{abs}$ is the number of photons of the excitation light that is absorbed in the phosphor sample and N is the number of all the photons in the excitation light.

First, the latter one, namely the total number N of all the photons in the excitation light is proportional to the numerical value obtained by the (formula a) below. Therefore, the reflection spectrum $I_{ref}(\lambda)$ was measured using a spectrometer for a reflection plate "Spectralon" with reflectance R of approx. 100% to excitation lights (actually with reflectance of 98% to the 450-nm excitation light) manufactured by Labsphere, by attaching it to the above-mentioned integrating sphere in the same disposition as the phosphor sample and radiating the excitation light thereon, and then the value of the (formula a) below was calculated.

[Mathematical Formula 4]

$$\frac{1}{R}\int \lambda \cdot I_{ref}(\lambda)d\lambda \qquad \text{(formula a)}$$

The integration interval was set at from 410 nm to 480 nm with respect to the excitation wavelength of 455 nm.

The number $N_{abs}$ of the photons in the excitation light absorbed in the phosphor sample is proportional to the amount calculated in the following (formula b).

[Mathematical Formula 5]

$$\frac{1}{R}\int \lambda \cdot I_{ref}(\lambda)d\lambda - \int \lambda \cdot I(\lambda)d\lambda \qquad \text{(formula b)}$$

Therefore, the reflection spectrum $I(\lambda)$ was decided with the phosphor sample of which absorption efficiency $\alpha_q$ is intended to be determined attached. The integration interval in (formula b) was set to be the same as in (formula a). Since the actual measurement value of the spectrum is generally obtained as digital data which are divided by a certain finite band width relating to $\lambda$, the integrations of (formula a) and (formula b) were calculated as finite sum based on the band width.

Then, the value of $\alpha_q = N_{abs}/N = $ (formula b)/(formula a) was calculated.

Next, the internal quantum efficiency $\eta_i$ was decided according to the following procedure. The internal quantum efficiency $\eta_i$ takes the value obtained through dividing $N_{PL}$ by $N_{abs}$, where $N_{PL}$ is the number of photons originating from the fluorescence phenomenon and $N_{abs}$ is the number of photons absorbed in the phosphor sample.

Here, $N_{PL}$ is proportional to the amount calculated by the following (formula c). Therefore, the amount calculated by the following (formula c) was determined.

[Mathematical Formula 6]

$$\int \lambda \cdot I(\lambda) d\lambda \qquad \text{(formula c)}$$

The integration interval was set at from 481 nm to 800 nm with respect to the excitation wavelength of 455 nm.

Then, the internal quantum efficiency $\eta_i$ was determined by the calculation of $\eta_i = $ (formula c)/(formula b).

Incidentally, the integration from spectra expressed by digital data was carried out in the same way as when the absorption efficiency $\alpha_q$ was calculated.

The external quantum efficiency $\eta_o$ was then decided as a product of the absorption efficiency $\alpha_q$ and internal quantum efficiency $\eta_i$, which were determined as above.

Example I-1

Preparation of $CaSiN_2$ Powder

First, $CaSiN_2$ powder was synthesized by a procedure described below. Calcium nitride powder ($Ca_3N_2$) and silicon nitride powder ($Si_3N_4$, mean particle diameter of 0.5 μm, oxygen content of 0.93 weight %, α-type content of 92%) were weighed out at the weight ratio of 1:0.946 and mixed with a pestle and mortar for 10 min. Subsequently, the mixture was filled into a boron nitride crucible. The steps of weighing, mixing, and filling of the powders were all performed within a glove box that can keep its nitrogen atmosphere under 1 ppm or lower in moisture content and oxygen content. The boron nitride crucible holding the materials was placed in an electric graphite resistance furnace. Then, a firing step was carried out as follows. First, the firing atmosphere was evacuated with a diffusion pump and then heated from room temperature to 800° C. at a rate of 20° C./min, followed by introducing nitrogen with a purity of 99.999 volume % 800° C. until the pressure reached 0.92 MPa. The temperature was raised to 1600° C. at a rate of 20° C./min, maintained at 1600° C. for 2 hours, further raised to 1800° C. at 20° C./min, and maintained at 1800° C. for another 2 hours. After coarse milling of the fired product, it was pulverized with a silicon nitride sinter mortar and pestle, thereby obtaining a $CaSiN_2$ powder.

(Production of Phosphor)

Then, the $CaSiN_2$ powder, lanthanum nitride powder, cerium oxide powder, and silicon nitride powder were weighed out respectively at weights (g) described in Table I-1. Subsequently, the steps of mixing, filling, firing, and coarse milling were performed in the same way as the synthesis of the $CaSiN_2$ powder (firing step), except that the temperature program over 800° C. of the firing step was changed in such a way that the temperature was raised to 2000° C. at a rate of 20° C./min and the temperature was maintained at 2000° C. for 2 hours. A phosphor powder was thereby obtained.

Table I-1 shows the raw materials (namely, the phosphor precursors) and their charge weights. Table I-2 shows the charge molar ratios of the elements from the raw materials, letting the molar quantity of Si be 6. Table I-2 also shows the main-peak relative intensities of the powder X-ray diffraction patterns, which indicate to how much degree the phases of $LaSi_3N_5$ and the intended $Ca_{1.5x}La_{3-x}Si_6N_{11}$ are generated in the resultant phosphor sample, and the luminescent characteristics of the emission spectra obtained when excited by respective wavelengths. As the radiation source for the powder X-ray diffraction pattern measurement, the CuKα line (1.54056 Å) was used.

From the Table I-2, it is evident that the phosphor sample offered a significantly large full width at half maximum of the orange emission peak, 149 nm, when excited by the 460-nm-wavelength light of a blue LED light source.

Example I-2 to I-6 and Comparative Example I-1

The experiments were carried out in the same way as Example I-1 except that the charge weights of the materials were changed as described in Table I-1 and the charge molar ratios of Ca, La, Ce, and Si were changed as described in Table I-2. Table I-2 also shows the main-peak relative intensities of the powder X-ray diffraction patterns, which indicate to how much degree the phases of $LaSi_3N_5$ and the intended $La_{3-x-y}Ca_{1.5x+y}Si_6O_yN_{11-y}$ are generated in the resultant phosphor sample, and the luminescent characteristics of the emission spectra obtained when excited by respective wavelengths. As the radiation source for the powder X-ray diffraction pattern measurement, the CuKα line (1.54056 Å) was used.

Table I-2 clearly shows that change in the charge ratio of Ca relative to La varied the amount of intended $La_{3-x-y}Ca_{1.5x+y}Si_6O_yN_{11-y}$ phase produced. Therefore, it is evident that the orange phosphor of the present invention is a new substance actively relating to Ca, a bivalent element, in addition to La, a trivalent element, among nitrides. From the results of the above-mentioned experiments, it can be inferred that the desirable charge ratio of La:Ca is usually 2:1 or higher, preferably 1.8:1 or higher, more preferably 1.5:1 or higher, and usually 1:2 or lower, preferably 1:1.8 or lower, more preferably 1:1.5 or lower. In this context, "high" means that the content of Ca is high.

From the Table I-2, it is evident that the orange phosphors offered significantly large full width at half maximums of the orange emission peaks, 146 nm to 156 nm. Concerning Example I-6, accurate measurement for the full width at half maximum could not be performed because its wavelength of emission peak was 566 nm and its spectrum was so wide that it was overlapped partly with the excitation light spectrum.

Examples I-7 to I-12

The charge weights of the materials were changed as described in Table I-1 so that the amount of Ce, the activation element, varied while the molar ratios of Ca and (La+Ce) remained the same when letting the molar quantity of Si be 6. The experiments were carried out in the same way as Example I-1 except that the charge weights were changed. In every Example, $LaSi_3N_5$:Ce was not at all produced, but intended $La_{3-x-y}Ca_{1.5x+y}Si_6O_yN_{11-y}$ phase was only produced, as the phosphor. Thereby, orange phosphors that can be preferably used with a blue LED could be obtained. Table I-3 shows the emission intensities, luminous wavelengths, full width at half maximums, and color coordinates of the orange emission peaks of the phosphors.

Figure 4:
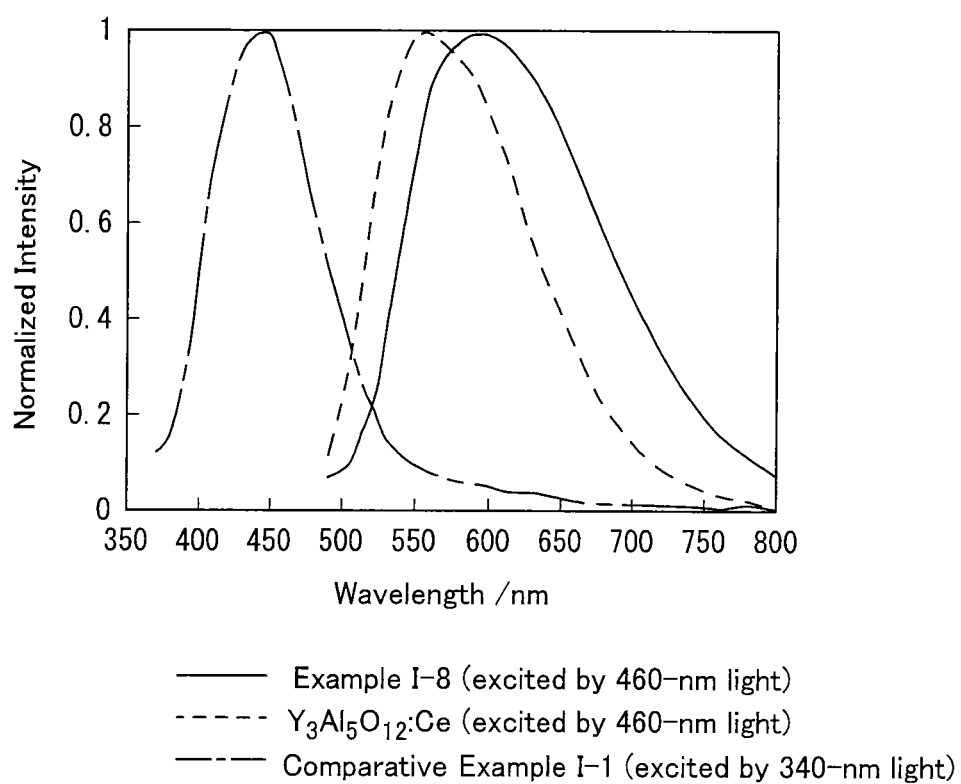
FIG. 4 is a graph showing emission spectral maps of the phosphor of Example I-8, the commercially available $Y_3Al_5O_{12}$:Ce phosphor, and the $LaSi_3N_5$:Ce phosphor of Comparative Example I-1, of the present invention.

As shown in Table I-3, the orange emission intensity was the highest when the Ce molar ratio was 0.1. The emission spectra of the powders of Example I-8, containing 0.1 molar ratio of Ce, a commercially available $Y_3Al_5O_{12}$:Ce phosphor (product number P46-Y3, manufactured by Kasei Optonics, Ltd.), and a $LaSi_3N_5$:Ce phosphor of Comparative Example I-1 are shown in FIG. 4. From FIG. 4, it is evident that the phosphor of Example I-8 offered a significantly wider full width at half maximum, 156 nm, than that of $Y_3Al_5O_{12}$:Ce, 126 nm, and an emission spectrum of which red wavelength region is sufficiently intensive, when excited by a light of blue LED wavelength.

Accordingly, use of the phosphor of Example I-8 in combination with a blue LED can create a warm white light of which color rendering is remarkably good.

In addition, it is evident from Table I-3 that the other phosphors of the present invention (the phosphors of Examples I-1, I-7, I-9 to I-12) have also significantly wide full width at half maximums, 149 nm to 165 nm.

FIG. 5 is a graph showing the powder X-ray diffraction pattern of the phosphor, which was washed with aqua regia, of Example I-8. As the radiation source for the powder X-ray diffraction pattern measurement, the CuKα line (1.54056 Å) was used. From FIG. 5, it is evident that the intended $La_{3-x-y}Ca_{1.5x+y}Si_6O_yN_{11-y}$ phase was produced as a single phase.

Furthermore, a Rietveld analysis of the result of the precise X-ray diffraction and an elemental analysis revealed that the chemical composition of the phosphor of Example I-8 was $La_{3-x-y-z}Ce_zCa_{1.5x+y}Si_6O_yN_{11-y}$ (where, x=0.75, y=0.44, z=0.1).

Examples I-13, I-14, I-15, I-16

Examples I-13, I-14, I-15, and I-16 were performed in the same way as Examples I-1, I-8, I-11, and I-12 except that the firing temperature was changed from 2000° C. to 1900° C. In every Example, $LaSi_3N_5$:Ce was not at all produced, but the intended $La_{3-x-y}Ca_{1.5x+y}Si_6O_yN_{11-y}$ phase was only produced, as the phosphor. Thereby, orange phosphors that can be preferably used with a blue LED could be obtained. Table I-3 shows the emission intensities and luminous wavelengths of the orange emission peaks of the phosphors. As shown in table I-3, the orange emission intensity was the highest when the Ce molar ratio was 0.49.

TABLE I-1

| Example or Comparative Example | Charge weight (g) of each material | | | |
|---|---|---|---|---|
| | CaSiN$_2$ | LaN | CeO$_2$ | Si$_3$N$_4$ |
| Example I-1 | 0.5567 | 0.654 | 0.013 | 0.4762 |
| Example I-2 | 0.5277 | 0.555 | 0.014 | 0.6035 |
| Example I-3 | 0.3849 | 0.803 | 0.012 | 0.4997 |
| Example I-4 | 0.6116 | 0.477 | 0.014 | 0.5969 |
| Example I-5 | 0.4195 | 0.655 | 0.013 | 0.6119 |
| Example I-6 | 0.2584 | 0.805 | 0.012 | 0.6245 |
| Comparative Example I-1 | 0.2817 | 0.657 | 0.013 | 0.7482 |
| Example I-7 | 0.5536 | 0.651 | 0.022 | 0.4735 |
| Example I-8 | 0.5464 | 0.642 | 0.044 | 0.4674 |
| Example I-9 | 0.5371 | 0.631 | 0.072 | 0.4595 |
| Example I-10 | 0.5259 | 0.618 | 0.106 | 0.4499 |
| Example I-11 | 0.5152 | 0.605 | 0.139 | 0.4407 |
| Example I-12 | 0.495 | 0.582 | 0.200 | 0.4234 |
| Example I-13 | 0.5567 | 0.654 | 0.013 | 0.4762 |
| Example I-14 | 0.5464 | 0.642 | 0.044 | 0.4674 |
| Example I-15 | 0.5152 | 0.605 | 0.139 | 0.4407 |
| Example I-16 | 0.495 | 0.582 | 0.200 | 0.4234 |

TABLE I-2

| Example or Comparative Example | Charge molar ratio | | | | Peak intensity ratio of X-ray diffraction of phase produced | | Intensity ratio of emission peaks | | Orange emission peak when excited by 460 nm | | | | | Blue emission peak when excited by 340 nm | |
|---|---|---|---|---|---|---|---|---|---|---|---|---|---|---|---|
| | Ca | La | Ce | Si | Peak at 2θ = 18.0° of intended phase | Peak at 2θ = 20.0° of LaSi$_3$N$_5$ phase | Orange peak when excited by 460 nm | Blue peak when excited by 340 nm | Emission intensity (a.u.) | Emission wavelength (nm) | Full width at half maximum (nm) | Color coordinate x | Color coordinate y | Emission intensity (a.u.) | Emission wavelength (nm) |
| Example I-1 | 2.2 | 1.6 | 0.028 | 6 | 100 | 0 | 100 | 0 | 15.4 | 579 | 149 | 0.488 | 0.497 | 0 | — |
| Example I-2 | 1.8 | 1.2 | 0.026 | 6 | 66 | 34 | 71 | 29 | 10.5 | 588 | 155 | 0.497 | 0.490 | 4.3 | 428 |
| Example I-3 | 1.6 | 2.1 | 0.028 | 6 | 64 | 36 | 100 | 0 | 9.0 | 569 | 146 | 0.461 | 0.518 | 0 | — |
| Example I-4 | 2.0 | 1.0 | 0.026 | 6 | 45 | 55 | 52 | 48 | 5.3 | 590 | 155 | 0.489 | 0.493 | 4.9 | 436 |
| Example I-5 | 1.5 | 1.5 | 0.026 | 6 | 39 | 61 | 65 | 35 | 10.0 | 580 | 156 | 0.485 | 0.499 | 5.5 | 426 |
| Example I-6 | 1.0 | 2.0 | 0.026 | 6 | 26 | 74 | 43 | 57 | 4.6 | 566 | — | 0.449 | 0.525 | 6.2 | 429 |
| Comparative Example I-1 | 0.9 | 1.4 | 0.025 | 6 | 0 | 100 | 0 | 100 | 0.0 | — | — | — | — | 13 | 442 |

TABLE I-3

| Example | molar ratio of Ca$_{1.8}$La$_{(1.8-a)}$Ce$_a$Si$_6$(N,O)$_{11}$ Ce molar ratio a | Firing temperature/ °C. | Orange emission peak when excited by 460 nm | | | | | Relative intensity of blue emission peak when excited by 340 nm |
|---|---|---|---|---|---|---|---|---|
| | | | Emission intensity (a.u.) | Emission wavelength (nm) | Full width at half maximum (nm) | Color coordinate x | Color coordinate y | |
| Example I-1 | 0.03 | 2000 | 15.4 | 579 | 149 | 0.488 | 0.497 | 0.0 |
| Example I-7 | 0.05 | 2000 | 17.3 | 585 | 151 | 0.504 | 0.486 | 0.0 |
| Example I-8 | 0.10 | 2000 | 19.6 | 591 | 156 | 0.519 | 0.473 | 0.0 |
| Example I-9 | 0.16 | 2000 | 15.6 | 596 | 156 | 0.528 | 0.465 | 0.0 |
| Example I-10 | 0.25 | 2000 | 15.8 | 597 | 158 | 0.538 | 0.457 | 0.0 |
| Example I-11 | 0.33 | 2000 | 15.7 | 608 | 160 | 0.547 | 0.449 | 0.0 |
| Example I-12 | 0.49 | 2000 | 11.7 | 611 | 165 | 0.552 | 0.444 | 0.0 |
| Example I-13 | 0.03 | 1900 | 16.4 | 578 | 152 | 0.488 | 0.497 | 0.0 |
| Example I-14 | 0.10 | 1900 | 16.1 | 591 | 160 | 0.526 | 0.467 | 0.0 |
| Example I-15 | 0.33 | 1900 | 17.8 | 611 | 164 | 0.554 | 0.441 | 0.0 |
| Example I-16 | 0.49 | 1900 | 19.4 | 613 | 165 | 0.559 | 0.437 | 0.0 |

Examples I-17 to I-24

The charge weights of the materials were changed as described in Table I-4, and the temperature program over 800° C. of the firing step was changed in such a way that the temperature was raised from 800° C. to 2000° C. at a rate of 22° C./min and the temperature was maintained at 2000° C. for 5 min. Except for those points, experiments were performed in the same way as Example I-1, and phosphors were thereby obtained.

Figure 6:
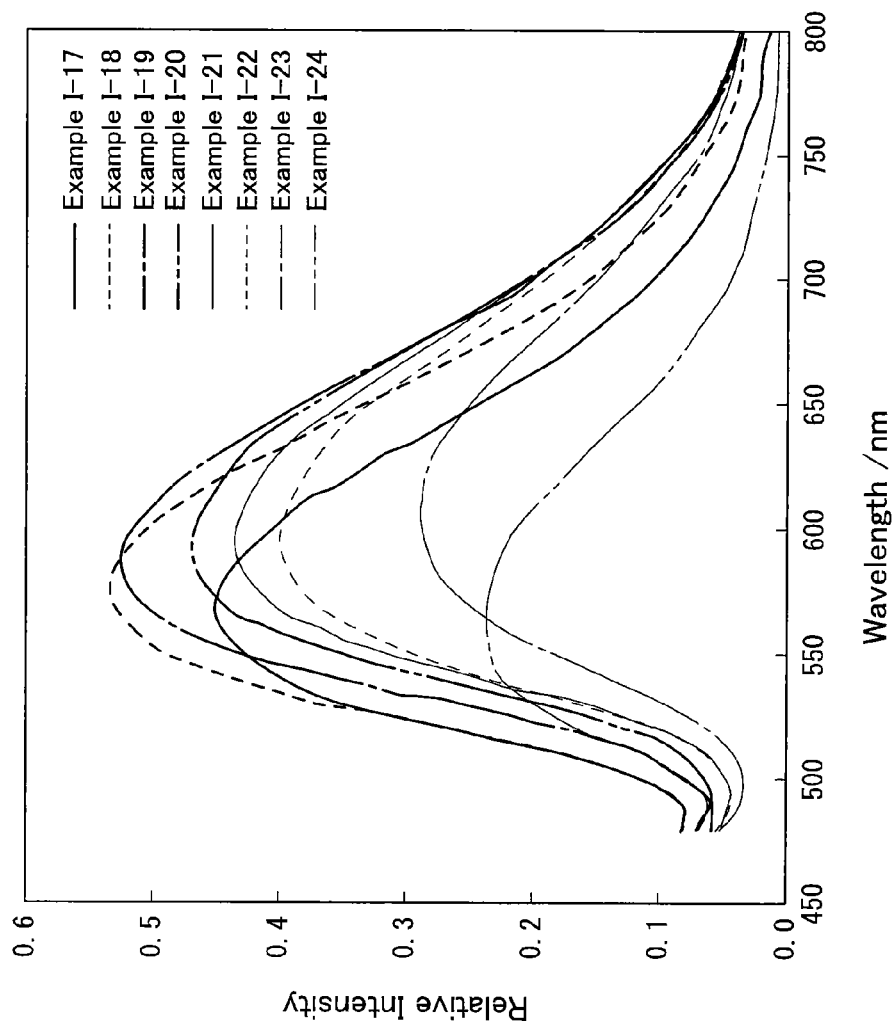
FIG. 6 is a graph showing the emission spectral maps of the phosphors prepared in Examples I-17 to I-24 of the present invention.

The luminescent characteristics of the resultant phosphor when excited by a light of 460-nm wavelength were measured in the same way as described earlier. FIG. 6 shows the measured emission spectra, and Table I-5 shows the luminescent characteristics including the emission intensities, wavelength of emission peaks, full width at half maximums, and CIE color coordinates.

Figure 7B:
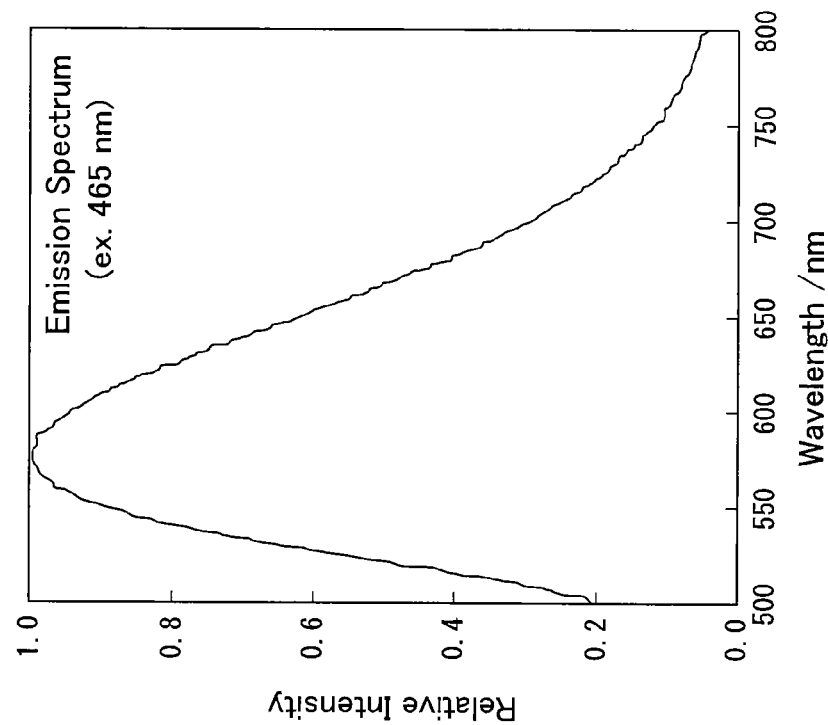
FIG. 7(*a*) shows the excitation spectrum.
Figure 7A:
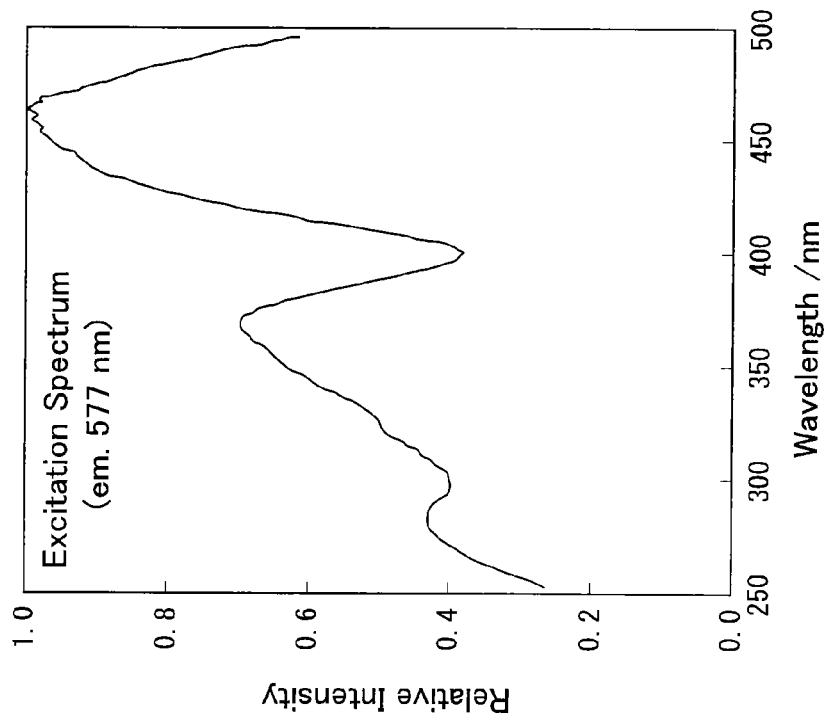

With respect to the phosphor of Example I-18, its excitation spectrum was measured using a monitoring wavelength of 577 nm, and also, its emission spectrum was measured using an excitation wavelength of 465 nm. FIG. 7(a) shows the excitation spectrum and 7(b) shows the emission spectrum.

Figures 8A, 8B, 8C:
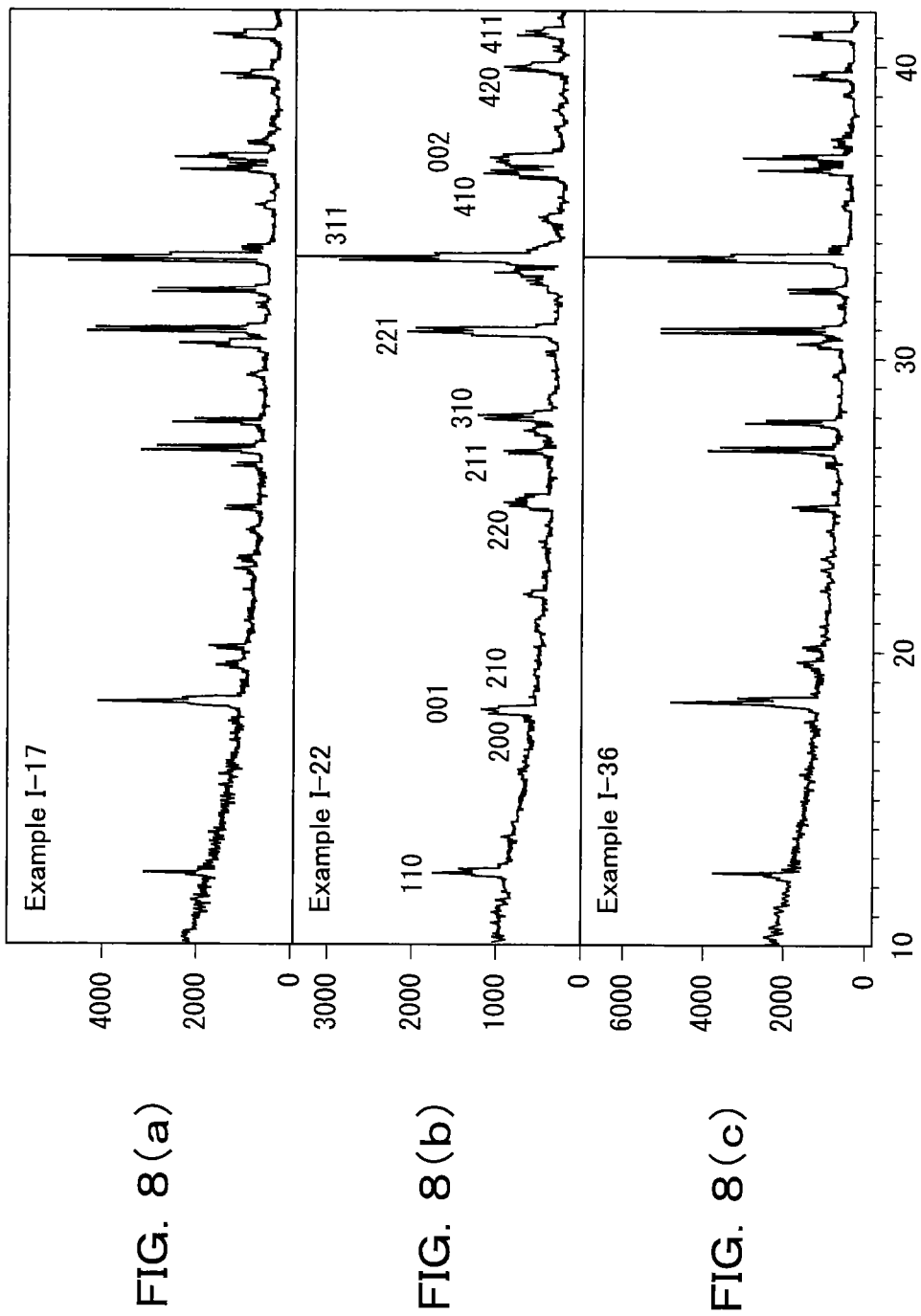
FIGS. 8(*a*), 8(*b*), and 8(*c*) are graphs showing the powder X-ray diffraction patterns of the phosphors prepared in Examples I-17, I-22, I-36 of the present invention, respectively.

FIGS. 8(a) and 8(b) show the powder X-ray diffraction patterns, measured using the CuKα line (1.54056 Å), of the phosphors prepared in Examples I-17 and I-22, of which substitution rates x (namely, the value x in the above-mentioned formula [I]) were such that x=0.5 and x=1.8, in terms of the charge composition, respectively. Crystal indices as tetragonal system are shown for each peak in FIG. 8(a) and FIG. 8(b). It is clear from FIGS. 8(a) and 8(b) that the intended phases could be obtained almost as a single phase and the La was substituted with 1.5 times amount (in molar ratio) of Ca even when the substitution rate x was as high as 1.8. We verified that, in all the phosphors of Examples I-17 to I-24, no $LaSi_3N_5$ phases were generated but $La_{3-x-y-z}Ce_zCa_{1.5x+y}Si_6O_yN_{11-y}$ phases were generated as phosphors, as typified by FIG. 8(a) and FIG. 8(b).

In addition, the powder X-ray diffraction patterns were measured on the phosphors obtained in the above-mentioned Examples using the CuKα line (1.54056 Å). The actual measured values of 2θ of the respective peaks of the powder X-ray diffraction pattern, corresponding to different substitution rates x of the La with 1.5 times amount (in molar ratio) of Ca (specifically, x=0.5 in the charge composition ratio of Example I-17, x=0.7 in the charge composition ratio of Example I-18, x=1.6 in the charge composition ratio of Example I-21, x=1.8 in the charge composition ratio of Example I-22, and x=2.0 in the charge composition ratio of Example I-23), are shown in Table I-6. It is evident that, with increasing substitution rates x, the value of 2θ changes significantly.

Table I-6 also shows calculated values obtained by fitting the actual measured values of 2θ of the respective peaks with the plane indices of tetragonal system. These calculated values were obtained from the equation below by the least square method. In the equation, the lattice constants of a axis and c axis of tetragonal system are designated as a and c respectively, and the plane indices are designated as (hkl). In the equation, λ is the wavelength 1.54056 Å of the Kα line of Cu, used as the X-ray source.

$$2\theta = 2\sin^{-1}[0.5\lambda(h^2/a^2 + k^2/a^2 + l^2/c^2)^{0.5}]$$

As can be seen from Table I-6, the actual measured values and the calculated values match within the limit of error. It is also evident that, as the substitution rate x changes, the powder X-ray diffraction pattern also changes. This is because the lattice constant of tetragonal system changes then.

Table I-7 shows changes in the lattice constant that were calculated from the measurement results of the powder X-ray diffraction patterns. From the table, it is evident that, with increasing x values of 0.5, 0.7, 1.6, 1.8, and 2.0, the lattice constant of a axis decreases and the lattice constant of c axis increases. The volume of the unit cell, which can be calculated as (the lattice constant of a axis)$^2$×(the lattice constant of c axis)$^2$, increases as the value x increases. This is probably because the substitution for $La^{3+}$ with $Ca^{2+}$, which has a little smaller ionic radius, is not of 1:1 type, but of unique, 1.5:1 type.

Also in light of the emission spectra of the respective Examples shown in FIG. 6 and the data on the luminous wavelengths of the respective Examples shown in Table I-5, it is evident that a change in x value varied the lattice constant and accordingly the luminous wavelength was shifted significantly to the longer wavelength side. Therefore, when using the phosphor of the present invention, it is very easy to control the color temperature of the white light synthesized by adjusting the x value.

In addition, the quantum efficiency measurements on the phosphor of Example I-20 showed that it had an internal quantum efficiency of 47.3%, absorption efficiency of 83.2%, and external quantum efficiency of 39.4%.

Furthermore, an elemental analysis with an oxygen-nitrogen analyzer and an ICP (inductively-coupled plasma) analyzer on the phosphor of Example I-22 showed that it has a crystal phase represented by $La_{3-x-y-z}Ce_zCa_{1.5x+y}Si_6N_{11-y}O_y$ (where, x=1.14, y=0.53, z=0.1).

Example I-25

About 0.7 g of the phosphor powder produced in Example I-17 was weighed out and fired again (secondary firing). Then, by a coarse milling of the fired product, a phosphor powder was obtained.

The specific firing condition of the above-mentioned secondary firing was the same as that of Example I-17 except that the temperature program over 800° C. was changed in such a way that the temperature was raised from 800° C. to 1500° C. at a rate of 3° C./min and then maintained at 1500° C. for 58.5 hours.

The luminescent characteristics of the resultant phosphor when excited by a light of 460-nm wavelength were measured in the same way as described earlier. The luminescent characteristics measured are shown in Table I-5. It is evident that the emission intensity was further increased by carrying out the secondary firing, in comparison with the phosphor obtained in Example I-17.

Example I-26

An experiment was carried out in which the phosphor composition of Example I-8 was changed in such a way that 0.59 mol of La was substituted with the same mol of Ca, and 0.59 mol of N was substituted with the same mol of O, by changing the charge weights of the materials in accordance with Table I-4. Namely, an experiment was carried out in the same way as Example I-8, except that the charge weights of the materials were changed as described in Table I-4 and the temperature program over 800° C. of the firing step was changed in such a way that the temperature was raised from 800° C. to 2000° C. at a rate of 22° C./min and the temperature was maintained at 2000° C. for 2 hours.

The luminescent characteristics of the resultant phosphor when excited by a light of 460-nm wavelength were measured in the same way as described earlier.

Figure 9:
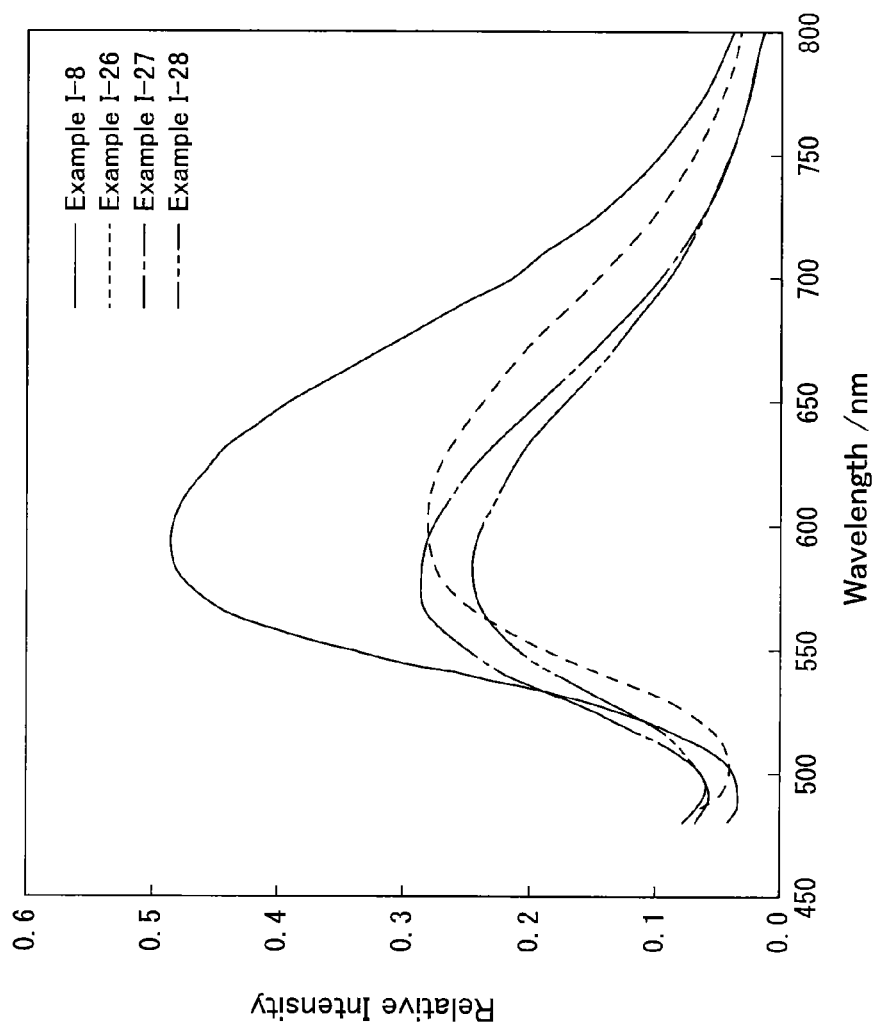
FIG. 9 is a graph showing the emission spectral maps of the phosphors of Examples I-8, I-26 to I-28 of the present invention.

The emission spectrum measured is shown in FIG. 9, and the luminescent characteristics are shown in Table I-5.

Example I-27

An experiment was carried out in the same way as Example I-26, except that the phosphor composition of Example I-8 was changed in such a way that 0.4 mol of Si was substituted with the same mol of Al, and 0.4 mol of Ca was substituted with the same mol of La, by changing the charge weights of the materials in accordance with Table I-4. A phosphor was thereby obtained.

The luminescent characteristics of the resultant phosphor when excited by a light of 460-nm wavelength were measured in the same way as described earlier. The emission spectrum measured is shown in FIG. 9, and the luminescent characteristics are shown in Table I-5.

Example I-28

An experiment was carried out in the same way as Example I-26, except that the phosphor composition of Example I-8 was changed in such a way that 0.4 mol of Si was substituted with the same mol of Al, and 0.4 mol of N was substituted with the same mol of O, by changing the charge weights of the materials in accordance with Table I-4. A phosphor was thereby obtained.

The luminescent characteristics of the resultant phosphor when excited by a light of 460-nm wavelength were measured in the same way as described earlier.

The emission spectrum measured is shown in FIG. 9, and the luminescent characteristics are shown in Table I-5.

By comparing the results of Examples I-8, and I-26 to I-28, it is clear that their wavelength of emission peaks and full width at half maximums were different, as can be seen in FIG. 9. This indicates that the color rendering and the luminescent color can be finely adjusted by changing the amount of O (oxygen) or Al.

Example I-29

The phosphor of Example I-29 was obtained in the same way as Example I-14 except that the charge weights of the materials were changed as described in Table I-4.

The luminescent characteristics of the resultant phosphor when excited by a light of 460-nm wavelength were measured in the same way as described earlier.

The luminescent characteristics measured are shown in Table I-5. It was verified that the reproducibility could be obtained within the experimental error.

Example I-30

An experiment was carried out in the same way as Example I-29 except that the 10 mole percent of Ca was substituted with Mg by changing the charge materials, and thereby a phosphor was obtained.

Figure 10:
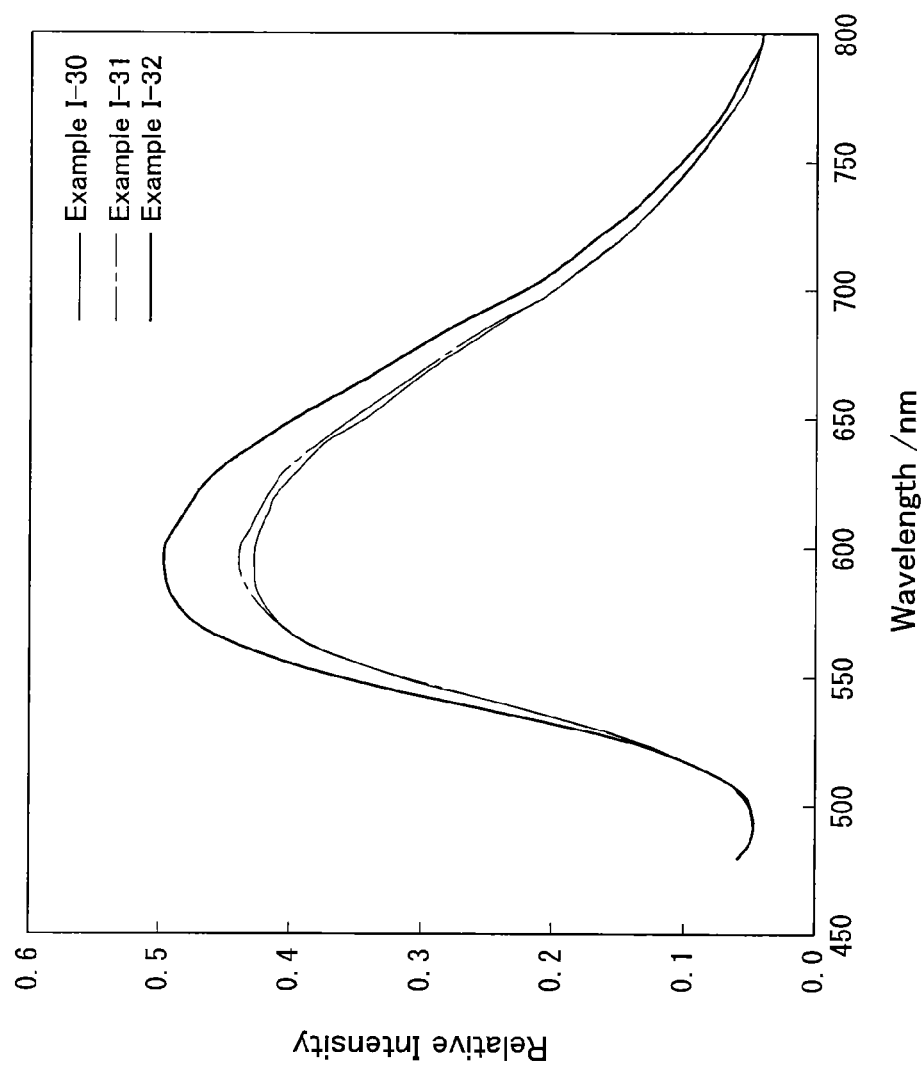
FIG. 10 is a graph showing the emission spectral maps of the phosphors prepared in Examples I-30 to I-32 of the present invention.

The luminescent characteristics of the resultant phosphor when excited by a light of 460-nm wavelength were measured in the same way as described earlier. The emission spectrum measured is shown in FIG. 10, and the luminescent characteristics are shown in Table I-5. It is evident that the emission intensity was enhanced by charging Mg material in place of Ca material.

Example I-31

An experiment was carried out in the same way as Example I-29 except that the 20 mole percent of Ca was substituted with Mg by changing the charge materials, and thereby a phosphor was obtained.

The luminescent characteristics of the resultant phosphor when excited by a light of 460-nm wavelength were measured in the same way as described earlier. The emission spectrum measured is shown in FIG. 10, and the luminescent characteristics are shown in Table I-5. It is evident that the emission intensity was enhanced by charging Mg material in place of Ca material.

Example I-32

An experiment was carried out in the same way as Example I-18 except that the 20 mole percent of Ca was substituted with Ba by changing the charge materials.

The luminescent characteristics of the resultant phosphor when excited by a light of 460-nm wavelength were measured in the same way as described earlier. The emission spectrum measured is shown in FIG. 10, and the luminescent characteristics are shown in Table I-5.

Example I-33 to I-35

An experiment was carried out in which the La was substituted with Gd (Example I-33), with Y (Example I-34), and with Lu (Example I-35), by changing the charge weight of the La material in accordance with Table I-4. Namely, the experiment was carried out in the same way as Example I-18 except that 0.3 mol of La was substituted with 0.3 mol of Gd, Y, or Lu and 0.3 mol of N was substituted with 0.3 mol of O by changing the charge materials, and thereby a phosphor was obtained.

The luminescent characteristics of the resultant phosphor when excited by a light of 460-nm wavelength were measured in the same way as described earlier. The luminescent characteristics measured are shown in Table I-5.

Example I-36

An experiment was carried out in the same way as Example I-17 except that the $CaSiN_2$ powder, one of the raw materials, was used without being exposed to the air after synthesized but by being stored in a glove box that can keep its nitrogen atmosphere under 1 ppm or lower in moisture content and oxygen content, and thereby a phosphor was obtained.

The luminescent characteristics of the resultant phosphor when excited by a light of 460-nm wavelength were measured in the same way as described earlier.

The luminescent characteristics measured are shown in Table I-5.

In addition, the powder X-ray diffraction pattern was measured on the resultant phosphor using the CuKα line (1.54056 Å). The powder X-ray diffraction pattern measured is shown in FIG. 8(*c*).

It is evident from Table I-5 that the emission intensity of the phosphor obtained in the present Example was enhanced in comparison with the phosphor of Example I-17. This indicates that it is desirable for enhanced luminescent characteristics of a phosphor to use a $CaSiN_2$ powder containing as little oxygen and moisture as possible as a raw material. It is also evident, from the resultant powder X-ray diffraction pattern, that the slightly-remaining impurity phase disappeared.

In addition, the quantum efficiency measurements on the phosphor of the present Example showed that it had an internal quantum efficiency of 46.5%, absorption efficiency of 80.3%, and external quantum efficiency of 37.3%.

Example I-37

An experiment was carried out in the same way as Example I-25 except for the points described below, and thereby a phosphor was obtained. Namely, the firing temperature program over 800° C. of the secondary firing of Example I-25 was changed in such a way that the temperature was raised from 800° C. to 1200° C. at a rate of 3° C./min, then from 1200° C. to 1500° C. at a rate of 15° C./min, and then maintained at 1500° C. for 6 hours. In addition, the $CaSiN_2$ powder was used without being exposed to the air after synthesized but by being stored in a glove box that has the same properties as that of Example I-36.

The luminescent characteristics of the resultant phosphor when excited by a light of 460-nm wavelength were measured in the same way as described earlier. The luminescent characteristics measured are shown in Table I-5. It is evident from the result that the emission intensity was further increased by carrying out the secondary firing on the phosphor obtained in Example I-17.

In addition, the quantum efficiency measurements on the phosphor of the present Example showed that it had an internal quantum efficiency of 50.5%, absorption efficiency of 86.3%, and external quantum efficiency of 43.8%.

Example I-38

An experiment was carried out in the same way as Example I-37 except that the phosphor powder obtained in Example I-17 was fired in accordance with the secondary firing step of Example I-37 using a flux of $CaF_2$ of 0.5 weight % of the phosphor powder. Thereby, a phosphor was obtained.

The luminescent characteristics of the resultant phosphor when excited by a light of 460-nm wavelength were measured in the same way as described earlier.

The luminescent characteristics measured are shown in Table I-5.

Example I-39

A white light emitting device was produced by using the phosphor of Example I-38, of which charge composition was $Ca_{0.75}La_{2.4}Ce_{0.1}Si_6N_{11}$, and a blue-light emitting GaN-based LED chip (460EZ, manufactured by Cree, Inc.) in combination.

In order to disperse and seal the above-mentioned phosphor, a silicone resin sealant (SCR-1011, manufactured by Shin-Etsu Chemical Co., Ltd.) and a dispersant (QS-30, manufactured by TOKUYAMA Corp.) were used. The weight ratio of the phosphor powder of the Example I-38:sealant:dispersant was set at 4.0:97.0:3.0. After heating the mixture of them at 70° C. for 1 hour, it was hardened by an additional heating at 150° C. for 5 hours, thereby a phosphor-containing part was formed. A surface-mount white light emitting device was then produced using it.

Figure 11:
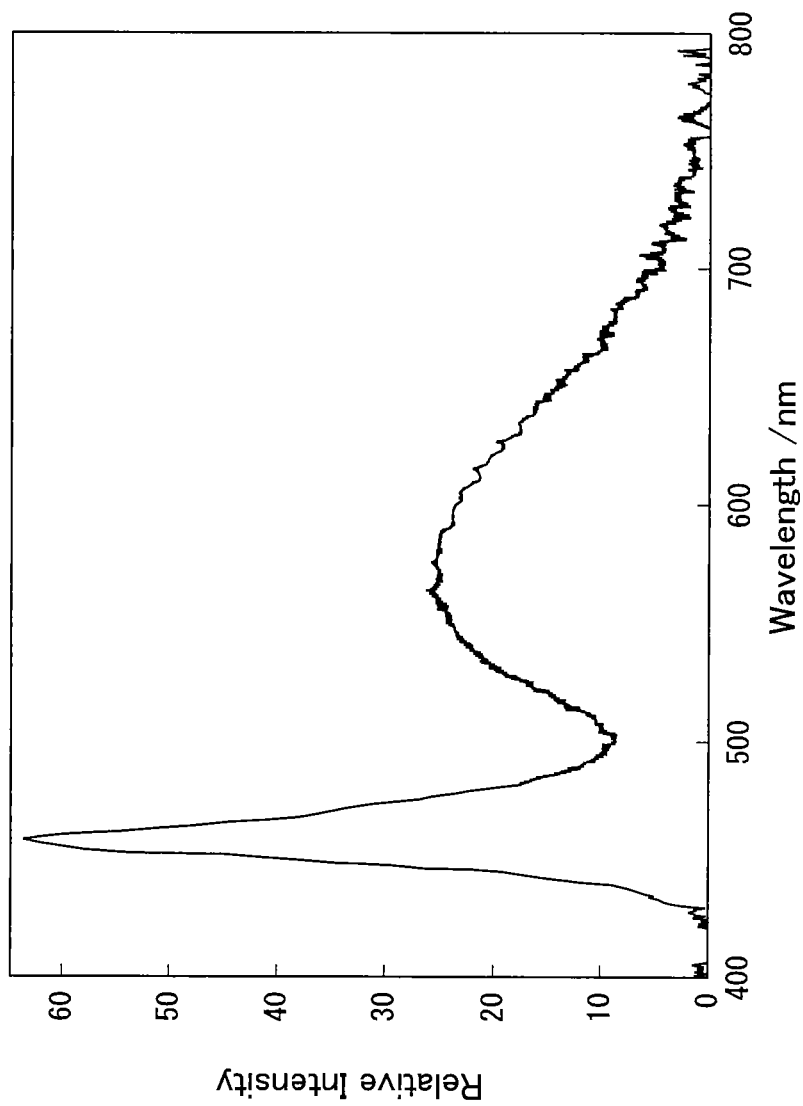
FIG. 11 is a graph showing the emission spectral map of the light emitting device prepared in Example I-39 of the present invention.

The emission spectrum of the obtained light emitting device is shown in FIG. 11, and its spectral characteristics are shown in Table I-8. The general color rendering index of the obtained light emitting device was 83. By bringing the color coordinate x close to 0.45 and the color coordinate y to 0.41, the general color rendering index will probably be further improved.

TABLE I-4

| | Charge weight (g) of each material | | | | | | | | | |
|---|---|---|---|---|---|---|---|---|---|---|
| | $CeO_2$ | LaN | $Si_3N_4$ | $CaSiN_2$ | Rare earth element source other than La | $Al_2O_3$ | $La_2O_3$ | AlN | $MgSiN_2$ | $Ba_3N_2$ |
| Example I-17 | 0.041 | 0.933 | 0.599 | 0.176 | — | — | — | — | — | — |
| Example I-18 | 0.042 | 0.878 | 0.578 | 0.252 | — | — | — | — | — | — |
| Example I-19 | 0.042 | 0.813 | 0.506 | 0.390 | — | — | — | — | — | — |
| Example I-20 | 0.045 | 0.661 | 0.481 | 0.562 | — | — | — | — | — | — |
| Example I-21 | 0.047 | 0.595 | 0.467 | 0.641 | — | — | — | — | — | — |
| Example I-22 | 0.048 | 0.523 | 0.440 | 0.740 | — | — | — | — | — | — |
| Example I-23 | 0.049 | 0.447 | 0.410 | 0.843 | — | — | — | — | — | — |
| Example I-24 | 0.040 | 0.986 | 0.620 | 0.103 | — | — | — | — | — | — |
| Example I-25 | 0.041 | 0.933 | 0.599 | 0.176 | — | — | — | — | — | — |
| Example I-26 | 0.051 | — | 0.408 | 0.921 | — | — | 0.320 | — | — | — |
| Example I-27 | 0.040 | 0.823 | 0.426 | 0.348 | — | — | — | 0.064 | — | — |
| Example I-28 | 0.044 | 0.642 | 0.387 | 0.546 | — | 0.058 | — | 0.023 | — | — |
| Example I-29 | 0.104 | 1.511 | 1.100 | 1.286 | — | — | — | — | — | — |
| Example I-30 | 0.104 | 1.519 | 1.106 | 1.163 | — | — | — | — | 0.108 | — |
| Example I-31 | 0.105 | 1.527 | 1.112 | 1.039 | — | — | — | — | 0.217 | — |
| Example I-32 | 0.041 | 0.853 | 0.585 | 0.196 | — | — | — | — | — | 0.075 |
| Example I-33 | 0.040 | 0.733 | 0.555 | 0.242 | 0.130 of $Gd_2O_3$ | — | — | — | — | — |
| Example I-34 | 0.042 | 0.755 | 0.571 | 0.249 | 0.084 of $Y_2O_3$ | — | — | — | — | — |
| Example I-35 | 0.040 | 0.727 | 0.550 | 0.240 | 0.142 of $Lu_2O_3$ | — | — | — | — | — |
| Example I-36 | 0.094 | 2.133 | 1.370 | 0.403 | — | — | — | — | — | — |
| Example I-37 | 0.094 | 2.133 | 1.370 | 0.403 | — | — | — | — | — | — |
| Example I-38 | 0.041 | 0.931 | 0.598 | 0.176 | — | — | — | — | — | — |

TABLE I-5

| | | | | Firing condition | | Orange emission peak when excited by 460 nm | | | | |
|---|---|---|---|---|---|---|---|---|---|---|
| | | | | Firing temperature | Firing temperature | | Emission | Full width at half | CIE Color | |
| | | At- | Pressure | and time | and time | Emission | wave- | maxi- | coordinate | |
| Example | Charge composition | mosphere | (MPa) | (primary firing) | (secondary firing) | intensity (a.u.) | length (nm) | mum (nm) | x | y |
| Example I-17 | $Ca_{0.75}La_{2.4}Ce_{0.1}Si_6N_{11}$ | $N_2$ | 0.92 | 2000° C., 0.08 h | none | 18.0 | 571 | 142 | 0.461 | 0.512 |
| Example I-18 | $Ca_{1.05}La_{2.2}Ce_{0.1}Si_6N_{11}$ | $N_2$ | 0.92 | 2000° C., 0.08 h | none | 21.3 | 577 | 148 | 0.476 | 0.502 |
| Example I-19 | $Ca_{1.35}La_{2.0}Ce_{0.1}Si_6N_{11}$ | $N_2$ | 0.92 | 2000° C., 0.08 h | none | 20.4 | 586 | 149 | 0.499 | 0.483 |
| Example I-20 | $Ca_{2.17}La_{1.45}Ce_{0.1}Si_6N_{11}$ | $N_2$ | 0.92 | 2000° C., 0.08 h | none | 18.2 | 593 | 153 | 0.511 | 0.472 |
| Example I-21 | $Ca_{2.4}La_{1.3}Ce_{0.1}Si_6N_{11}$ | $N_2$ | 0.92 | 2000° C., 0.08 h | none | 16.9 | 596 | 156 | 0.517 | 0.468 |
| Example I-22 | $Ca_{2.7}La_{1.8}Ce_{0.1}Si_6N_{11}$ | $N_2$ | 0.92 | 2000° C., 0.08 h | none | 15.5 | 598 | 159 | 0.516 | 0.468 |
| Example I-23 | $Ca_{3.0}La_{0.9}Ce_{0.1}Si_6N_{11}$ | $N_2$ | 0.92 | 2000° C., 0.08 h | none | 11.2 | 608 | 159 | 0.525 | 0.458 |
| Example I-24 | $Ca_{0.45}La_{2.6}Ce_{0.1}Si_6N_{11}$ | $N_2$ | 0.92 | 2000° C., 0.08 h | none | 9.5 | 566 | 137 | 0.448 | 0.517 |
| Example I-25 | $Ca_{0.75}La_{2.4}Ce_{0.1}Si_6N_{11}$ | $N_2$ | 0.92 | 2000° C., 0.08 h | 1500° C., 58.5 h | 25.1 | 579 | 129 | 0.478 | 0.507 |
| Example I-26 | $Ca_{2.7}La_{0.9}Ce_{0.1}Si_6N_{10.4}O_{0.6}$ | $N_2$ | 0.92 | 2000° C., 2 h | none | 11.3 | 599 | 163 | 0.524 | 0.464 |
| Example I-27 | $Ca_{1.7}La_{1.9}Ce_{0.1}Si_{5.6}Al_{0.4}N_{11}$ | $N_2$ | 0.92 | 2000° C., 2 h | none | 11.5 | 579 | 151 | 0.487 | 0.497 |
| Example I-28 | $Ca_{2.1}La_{1.5}Ce_{0.1}Si_{5.6}Al_{0.4}N_{10.6}O_{0.4}$ | $N_2$ | 0.92 | 2000° C., 2 h | none | 9.7 | 583 | 153 | 0.489 | 0.493 |
| Example I-29 | $Ca_{2.1}La_{1.5}Ce_{0.1}Si_6N_{11}$ | $N_2$ | 0.92 | 1900° C., 2 h | none | 17.1 | 595 | 158 | 0.518 | 0.472 |
| Example I-30 | $Ca_{1.9}Mg_{0.2}La_{1.5}Ce_{0.1}Si_6N_{11}$ | $N_2$ | 0.92 | 1900° C., 2 h | none | 17.5 | 595 | 158 | 0.520 | 0.471 |
| Example I-31 | $Ca_{1.7}Mg_{0.4}La_{1.5}Ce_{0.1}Si_6N_{11}$ | $N_2$ | 0.92 | 1900° C., 2 h | none | 19.9 | 595 | 155 | 0.519 | 0.472 |
| Example I-32 | $Ba_{0.3}Ca_{0.75}La_{2.2}Ce_{0.1}Si_6N_{11}$ | $N_2$ | 0.92 | 2000° C., 0.08 h | none | 20.9 | 577 | 143 | 0.477 | 0.505 |
| Example I-33 | $Ca_{1.1}La_{1.9}Gd_{0.3}Ce_{0.1}Si_6N_{11}$ | $N_2$ | 0.92 | 2000° C., 0.08 h | none | 17.7 | 579 | 149 | 0.484 | 0.500 |
| Example I-34 | $Ca_{1.1}La_{1.9}Y_{0.3}Ce_{0.1}Si_6N_{11}$ | $N_2$ | 0.92 | 2000° C., 0.08 h | none | 16.3 | 579 | 149 | 0.482 | 0.502 |
| Example I-35 | $Ca_{1.1}La_{1.9}Lu_{0.3}Ce_{0.1}Si_6N_{11}$ | $N_2$ | 0.92 | 2000° C., 0.08 h | none | 8.9 | 578 | 151 | 0.471 | 0.507 |
| Example I-36 | $Ca_{0.75}La_{2.4}Ce_{0.1}Si_6N_{11}$ | $N_2$ | 0.92 | 2000° C., 0.08 h | none | 21.6 | 571 | 138 | 0.464 | 0.513 |
| Example I-37 | $Ca_{0.75}La_{2.4}Ce_{0.1}Si_6N_{11}$ | $N_2$ | 0.92 | 2000° C., 0.08 h | 1500° C., 6 h | 26.3 | 572 | 135 | 0.465 | 0.514 |
| Example I-38 | $Ca_{0.75}La_{2.4}Ce_{0.1}Si_6N_{11}$ | $N_2$ | 0.92 | 2000° C., 0.08 h | 1500° C., 6 h and 0.5 weight % of $CaF_2$ | 25.5 | 568 | 138 | 0.459 | 0.517 |

TABLE I-6

| | 2θ of phosphors of which La substitution rate is x | | | | | | | | | |
|---|---|---|---|---|---|---|---|---|---|---|
| | x = 0.5 | | x = 0.7 | | x = 1.6 | | x = 1.8 | | x = 2.0 | |
| Plane indices hkl | Actual measured value | Calculated value | Actual measured value | Calculated value | Actual measured value | Calculated value | Actual measured value | Calculated value | Actual measured value | Calculated value |
| 110 | 12.332 | 12.326 | 12.351 | 12.343 | 12.363 | 12.392 | 12.347 | 12.380 | 12.356 | 12.397 |
| 001 | 18.207 | 18.204 | 18.154 | 18.153 | 17.965 | 17.964 | 17.962 | 17.968 | 17.912 | 17.927 |
| 220 | 24.792 | 24.798 | 24.827 | 24.833 | 24.915 | 24.931 | 24.891 | 24.907 | 24.924 | 24.943 |
| 211 | 26.823 | 26.833 | 26.804 | 26.819 | 26.749 | 26.746 | 26.737 | 26.735 | 26.739 | 26.728 |
| 310 | 27.770 | 27.780 | 27.809 | 27.819 | 27.925 | 27.930 | 27.895 | 27.903 | 27.934 | 27.944 |
| 221 | 30.916 | 30.936 | 30.916 | 30.933 | 30.905 | 30.900 | 30.895 | 30.883 | 30.900 | 30.888 |
| 311 | 33.397 | 33.416 | 33.402 | 33.420 | 33.417 | 33.408 | 33.401 | 33.387 | 33.409 | 33.399 |
| 410 | 36.462 | 36.480 | 36.515 | 36.533 | 36.698 | 36.680 | — | 36.644 | 36.900 | 36.698 |
| 002 | 36.852 | 36.889 | 36.750 | 36.783 | 36.387 | 36.389 | 36.411 | 36.398 | 36.346 | 36.313 |
| 420 | 39.673 | 39.692 | 39.731 | 39.750 | 39.919 | 39.911 | 39.883 | 39.872 | 39.945 | 39.931 |
| 411 | 41.041 | 41.061 | 41.064 | 41.084 | 41.136 | 41.129 | 41.130 | 41.098 | 41.148 | 41.128 |

TABLE I-7

| | x value and Ca molar ratio of $Ca_{1.5x}La_{2.9-x}Ce_{0.1}Si_6N_{11}$ | | Lattice constants of tetragonal system calculated from XRD patterns | |
|---|---|---|---|---|
| Example | x value | Ca molar ratio 1.5x | Lattice constant of a axis | Lattice constant of c axis |
| Example I-17 | 0.5 | 0.75 | 10.156 | 4.873 |
| Example I-18 | 0.7 | 1.05 | 10.141 | 4.887 |
| Example I-21 | 1.6 | 2.4 | 10.102 | 4.938 |
| Example I-22 | 1.8 | 2.7 | 10.112 | 4.937 |
| Example I-23 | 2 | 3 | 10.097 | 4.948 |

TABLE I-8

| | | Emission characteristics | | |
|---|---|---|---|---|
| | Charge composition (composition of synthesized substance) | Color coordinate x | Color coordinate y | General color rendering index |
| Example I-39 | $Ca_{0.75}La_{2.4}Ce_{0.1}Si_6N_{11}$ (x = 0.5) | 0.328 | 0.313 | 83 |

II. Examples with Respect to Phosphor of Present Invention (II)

In what follows, Examples or the like with respect to the phosphor of the present invention (II) will be explained.
[Raw Material Reagents]
The same commercially available raw materials were used as those used in the section "I. Examples with respect to phosphor of present invention (I)" for producing the phosphors.
[Measurement Methods]
[Emission Spectrum]
The emission spectra were measured in the same way as those described in the section "I. Examples with respect to phosphor of present invention (I)".
[Full Width at Half Maximum of Emission Peak]
The full width at half maximums of the emission peaks were calculated from the emission spectra obtained in the above-mentioned method.
[Color Coordinates]
The color coordinates of x, y colorimetric system (CIE 1931 colorimetric system) were measured in the same way as those described in the section "I. Examples with respect to phosphor of present invention (I)".
[Method for Measuring Excitation Spectrum]
The excitation spectra were measured in the same way as those described in the section "I. Examples with respect to phosphor of present invention (I)".
[Measurement of Temperature Characteristics]
The temperature characteristics were examined as follows, for example, using an emission spectrum measurement device of multi-channel spectrum analyzer, MCPD7000, manufactured by Otsuka Electronics Co., Ltd., a brightness measurement apparatus of the luminance colorimeter BM5A, a stage equipped with a cooling mechanism using a peltiert device and a heating mechanism using a heater, and a light source device equipped with a 150-W xenon lamp.

A cell holding the phosphor sample was put on the stage, and the temperature was changed stepwise at 20° C., 25° C., 60° C., 100° C., 135° C., and 175° C. The surface temperatures of the phosphor were measured, and subsequently, the emission spectra were measured by exciting the phosphor with a light from the light source having wavelength of 455 nm, which was separated using a diffraction grating. Then the emission peak intensities were decided from the measured emission spectra. At this point, as the measurement values of the surface temperatures of the phosphor on the side irradiated with the excitation light, were used values corrected by the temperature values measured with a radiation thermometer and a thermocouple.

A corrected temperature-emission intensity curve at around 20° C. to around 175° C. was plotted from the obtained emission-peak intensities. From the corrected temperature-emission intensity curve, I(130) and I(25), the values of the emission intensities at 130° C. and 25° C. respectively, were read out and then the temperature characteristics value was calculated as I(130)/I(25). Actually, the I(130) and I(25) were not very different from the emission intensities at 130° C. and 25° C. that were not yet corrected.

[Internal Quantum Efficiency, External Quantum Efficiency, and Absorption Efficiency]
The absorption efficiencies $\alpha_q$, internal quantum efficiencies $\eta_i$, and external quantum efficiencies $\eta_o$ of the phosphors were measured in the same way as those described in the section "I. Examples with respect to phosphor of present invention (I)".

Example II-1

Production of Alloy for Phosphor Precursor

The material metals, Ce, La, and Si, (all of them were elemental metals) were weighed out so that the metal elements composition ratio became Ce:La:Si=0.1:2.9:6 (in molar ratio) and the total amount of them became 2 g and mixed lightly, in a glove box of which atmosphere is a high purity nitrogen with oxygen concentration of smaller than 1 ppm and water vapor concentration of smaller than 1 ppm. The obtained mixture of the material metals was transferred into an arc melting furnace (ACM-CO1P, manufactured by DIAVAC LIMITED), and argon was introduced into the furnace after air was evacuated from the furnace to $1 \times 10^{-2}$ Pa. Then, the material metals were melted in the argon atmosphere by passing a current of about 100 mA. After verifying that the melted metals were rotated sufficiently by an electromagnetic induction, the current was stopped to be passed, and the melted product was solidified by natural cooling. Thereby, an alloy for phosphor precursor with metal element composition ratio of Ce:La:Si=0.1:2.9:6 (in molar ratio) was obtained. It was verified that the obtained alloy for phosphor precursor had a uniform composition of the above-mentioned ratio using a scanning electron microscope equipped with an energy dispersive X-ray spectrometer (namely, SEM-EDX), EX-250 manufactured by HORIBA, Ltd.

The alloy for phosphor precursor was pulverized in the same glove box as the one described above using an alumina mortar and a nylon mesh sieve so as to be alloy powders having a particle diameter of 37 µm or smaller, which was used as the material for a nitriding treatment.
(Secondary Nitriding Process)
(Primary Firing)
2 g of the obtained alloy powder was filled into a boron nitride crucible (inner diameter of 20 mm) and the crucible was placed in a hot isostatic pressing instrument (HIP). After the air was evacuated from the instrument to $5 \times 10^{-1}$ Pa, nitrogen was filled into it until the pressure reached 11 MPa.

Subsequently, the furnace temperature was raised to 1050° C. at a temperature rising rate of 15° C./min. After verifying that the internal pressure reached 25 MPa, the furnace temperature was raised from 1050° C. to 1205° C. at a rate of 3° C./min until the internal pressure reached 27 MPa. After that, the furnace temperature was maintained at 1205° C. for 30 min, and then the pressure was raised at a rate of 3° C./rain. When the furnace temperature reached 1750° C. and the internal pressure reached 33 MPa, cooling was started and thus the nitriding treatment was ended.

The obtained nitride powder (nitrogen-containing alloy) was pulverized in the same glove box as described above using an alumina mortar and a nylon mesh sieve so as to be powders having a particle diameter of 37 μm or smaller, which was used as the material (primary fired product) for the secondary firing described below.

(Secondary Firing)

About 1 g of the obtained nitrogen-containing alloy (namely, the primary fired product) was filled into a boron nitride crucible (inner diameter of 20 mm) and the crucible was placed in a hot isostatic pressing instrument (HIP). After the air was evacuated from the instrument to $5 \times 10^{-1}$ Pa, nitrogen was filled into it until the pressure reached 25 MPa. Subsequently, the furnace temperature was raised to 1300° C. at a temperature rising rate of 15° C./min. Then, the furnace temperature was raised from 1300° C. to 2000° C. at a rate of 10° C./min until the internal pressure reached 90 MPa. After the furnace temperature was maintained at 2000° C. for 3 hours, cooling was started and thus the firing was ended.

The obtained fired product was pulverized in the same glove box as described above using an alumina mortar, and thereby a phosphor was obtained.

(Measurement of Luminescent Characteristics)

Figure 12:
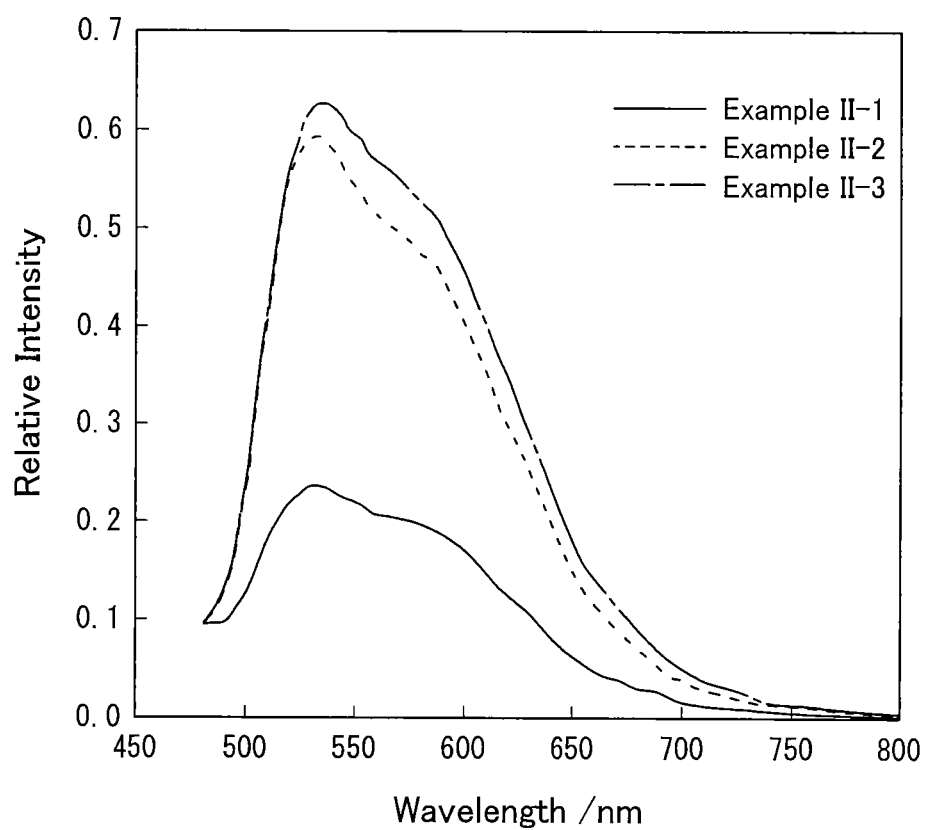
FIG. 12 is a graph showing the emission spectral maps of the phosphors prepared in Examples II-1, II-2 and II-3 of the present invention.

The luminescent characteristics of the resultant phosphor were examined in a manner described earlier. FIG. 12 shows the measured emission spectrum, and Table II-3 shows the luminescent characteristics including the emission intensity, wavelength of emission peak, full width at half maximum, and CIE color coordinates.

From FIG. 12, it is evident that the phosphor, $La_3Si_6N_{11}$:Ce, of the present Example, which was produced using an alloy as the material, have two emission peaks in its emission spectrum and the peak on shorter wavelength side is significantly higher than the peak at a wavelength longer than the shorter wavelength by 45 nm.

In addition, the value I(B)/I(A), which represents the ratio of (the peak height on longer wavelength side)/(the peak height on shorter wavelength side), of the emission spectrum measured in the present Example was as small as 0.852.

Since the phosphor, $La_3Si_6N_{11}$:Ce, of the present Example has the above-mentioned emission spectrum, it is characterized by its yellow green luminescent color.

Example II-2

Production of Alloy for Phosphor Precursor

An alloy powder was prepared in the same condition as described in the section "(Production of alloy for phosphor precursor)" of Example II-1. The steps of weighing and filling of the powder were all performed within a glove box that can keep its nitrogen atmosphere under 1 ppm or lower in moisture content and oxygen content, in the same way as Example II-1.

(Secondary Nitriding Process)
(Primary Firing)

About 0.7 g of the alloy powder was filled into a boron nitride crucible, and it was placed in an electric graphite resistance furnace. Then, a firing was carried out as follows. Namely, the firing atmosphere was first evacuated with a turbo molecular pump and then the temperature was raised from room temperature to 800° C. at a rate of 20° C./min, followed by introducing nitrogen with a purity of 99.999 volume % at 800° C. until the pressure reached 0.92 MPa. The temperature was then raised to 1500° C. at a rate of 3° C./min and maintained at 1500° C. for 58.5 hours. Thereby, the primary firing was carried out. By pulverizing the resultant fired product in the same glove box as described above, a powder (primary fired product) was obtained.

(Secondary Firing)

The primary fired product was subjected to a secondary nitriding in a condition described below.

Namely, the phosphor of the present Example was produced in the same condition as the above-mentioned primary firing, except that the temperature program over 800° C. of the above-mentioned primary firing was changed in such a way that the temperature was raised from 800° C. to 1500° C. at a rate of 1.5° C./min and maintained at 1500° C. for 3 hours, and then raised from 1500° C. to 1750° C. at a rate of 15° C./min and maintained at 1750° C. for 7 hours.

(Measurement of Luminescent Characteristics)

The luminescent characteristics of the resultant phosphor were examined in a manner described earlier.

FIG. 12 shows the measured emission spectrum, and Table II3 shows the luminescent characteristics.

In addition, the value I(B)/I(A), which represents the ratio of (the peak height on longer wavelength side)/(the peak height on shorter wavelength side), of the emission spectrum measured in the present Example was as small as 0.816.

The luminescent color of the phosphor obtained in the present Example was green.

Furthermore, the temperature characteristics I(130)/I(25) of the phosphor obtained in the present Example was 74%.

In addition, the powder X-ray diffraction pattern was measured on the phosphor obtained in the present Example using the CuKα line (1.54184 Å). By comparing the result of the phosphor of the present Example, prepared using an alloy as the phosphor material, with that of the phosphor of Reference Example II-1 (described later), prepared without using an alloy as the phosphor material, it is evident that in the phosphor of the present Example there is extremely less impurity phases and a crystal structure of $La_3Si_6N_{11}$ can be produced as a single phase. Furthermore, in the phosphor of the present Example, the ratio of the peak intensity of the maximum peak (it indicates the peak of an impurity phase), in the 2θ range of 21° to 24°, to that of the 001 plane of the intended phase was as small as 0.027.

Example II-3

The phosphor of the present Example was produced in the same condition as the above-mentioned Example 11-2, except that the temperature program over 800° C. of the secondary firing of Example II-2 was changed in such a way that the temperature was raised from 800° C. to 1500° C. at a rate of 0.27° C./min and maintained at 1500° C. for 58.5 hours, and then raised from 1500° C. to 1750° C. at a rate of 15° C./min and maintained at 1750° C. for 39 hours.

The luminescent characteristics of the resultant phosphor were examined in a manner described earlier. FIG. 12 shows the measured emission spectrum, and Table II-3 shows the luminescent characteristics.

In addition, the value I(B)/I(A), which represents the ratio of (the peak height on longer wavelength side)/(the peak height on shorter cwavelength side), of the emission spectrum measured in the present Example was as small as 0.845.

The luminescent color of the phosphor obtained in the present Example was green.
Furthermore, the temperature characteristics I(130)/I(25) of the phosphor obtained in the present Example was 68%.

In addition, the quantum efficiency measurements on the phosphor of the present Example showed that it had an internal quantum efficiency of 53.4%, absorption efficiency of 82.0%, and external quantum efficiency of 43.8%.

Figure 13:
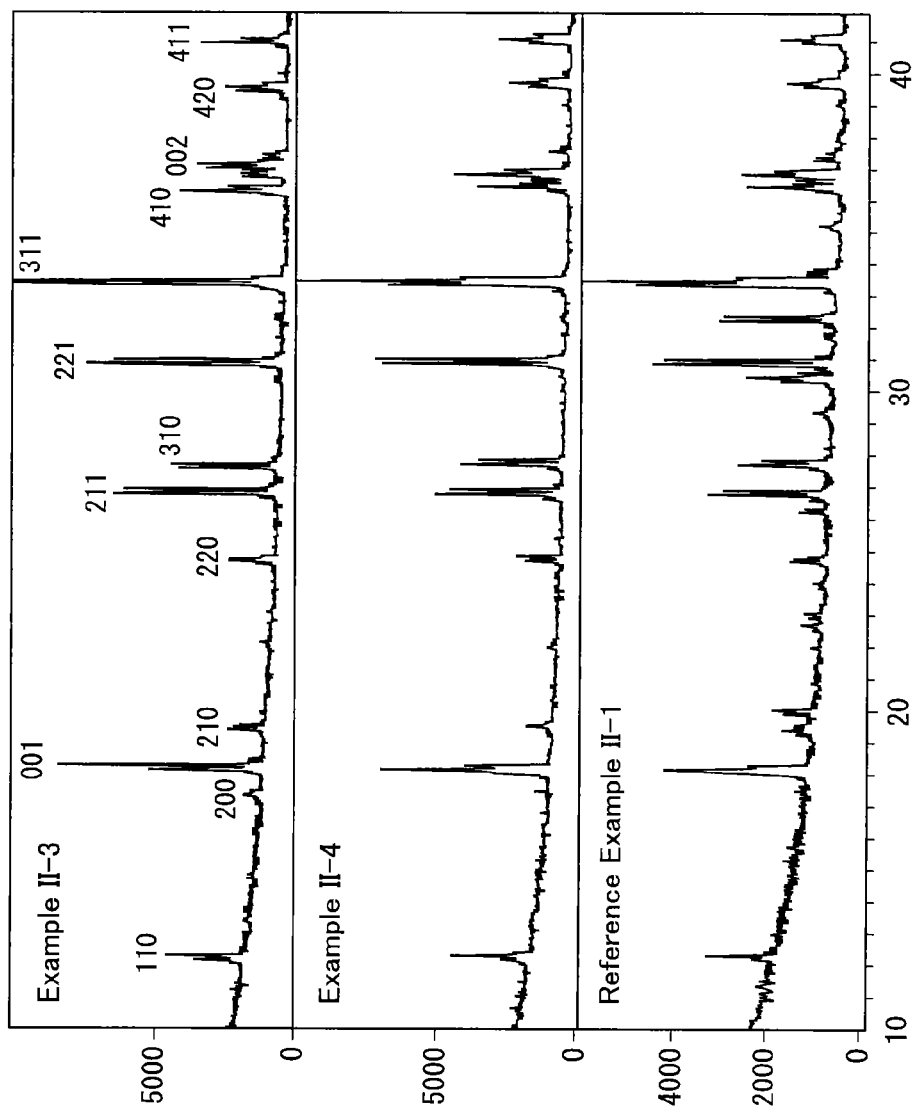
FIG. 13 is a graph showing the powder X-ray diffraction patterns of the phosphors prepared in Examples II-3, II-4, and Reference Example II-1 of the present invention, respectively.

In addition, the powder X-ray diffraction pattern was measured on the phosphor obtained in the present Example using the CuKα line (1.54184 Å). The result is shown in FIG. 13. Crystal indices as tetragonal system are shown for each peak of the powder X-ray diffraction pattern in FIG. 13. By comparing the result of the phosphor of the present Example, prepared using an alloy as the phosphor material, with that of the phosphor of Reference Example II-1 (described later), prepared without using an alloy as the phosphor material, it is evident that in the phosphor of the present Example there is extremely less impurity phases and a crystal structure of $La_3Si_6N_{11}$ can be produced as a single phase. Furthermore, in the phosphor of the present Example, the ratio (namely, the peak intensity ratio I) of the peak intensity of the maximum peak (it indicates the peak of an impurity phase) that exists in the 2θ range of 21° to 24° to the peak intensity of the 001 plane of the intended phase that exists in the 2θ range of 17° to 20° was as small as 0.027.

Moreover, from the emission spectra of Examples II-1 to 11-3, it is evident that the phosphor that contains no A element such as Ca and is prepared using an alloy as the phosphor material shows a luminescent color of yellow green.

Example II-4

Preparation of $CaSiN_2$, a Phosphor Material

First, $CaSiN_2$ powder was synthesized by a procedure described below. Calcium nitride powder ($Ca_3N_2$) and silicon nitride powder were weighed out at the weight ratio of 1:0.946 and mixed with a pestle and mortar for 10 min. Subsequently, the mixture was filled into a boron nitride crucible. The steps of weighing, mixing, and filling of the powders were all performed within a glove box that can keep its nitrogen atmosphere under 1 ppm or lower in moisture content and oxygen content. The boron nitride crucible holding the materials was placed in an electric graphite resistance furnace. Then, a firing step was carried out as follows. Namely, the firing atmosphere was first evacuated with a diffusion pump and then heated from room temperature to 800° C. at a rate of 20° C./min, followed by introducing nitrogen with a purity of 99.999 volume %, at 800° C. until the pressure reached 0.92 MPa. The temperature was then raised to 1750° C. at a rate of 15° C./min, and then maintained at 1750° C. for 2 hours. Thereby, the firing step was carried out. By a coarse milling of the fired product in the same glove box, a $CaSiN_2$ powder, one of the raw materials, was obtained.
(Production of Alloy for Phosphor Precursor)
An $La_4CeSi_{10}$ alloy (alloy for phosphor precursor) powder of which metal elements composition ratio was such that Ce:La:Si=1:4:10 (in molar ratio) was produced in the same way as Example II-1, except that the metal elements composition ratio of each material metal weighed out, described in the section "(Production of alloy for phosphor precursor)" of Example II-1, was changed so that Ce:La:Si=1:4:10 (in molar ratio).
(Secondary Nitriding Process)
Then, the $La_4CeSi_{10}$ alloy powder obtained as above, lanthanum nitride powder, silicon nitride powder, and $CaSiN_2$ powder, were weighed out and mixed in the same glove box as that of Example II-1. At that time, the numbers of moles of Ce in the $La_4CeSi_{10}$ alloy powder, La in the lanthanum nitride powder, Ca in the $CaSiN_2$ powder, and Si in the silicon nitride powder plus the $La_4CeSi_{10}$ alloy powder were specified so that they were proportional to the respective numbers of moles of Ce, La, Ca, and Si of the charge composition in Table II-1.

About 0.7 g of the obtained mixture was filled into a boron nitride crucible, and the boron nitride crucible was placed in an electric graphite resistance furnace. The firing atmosphere was first evacuated with a turbo molecular pump and then the temperature was raised from room temperature to 800° C. at a rate of 20° C./min, followed by introducing nitrogen with a purity of 99.999 volume % at 800° C. until the pressure reached 0.92 MPa. The temperature was raised to 1580° C. at a rate of 3° C./min, maintained at 1580° C. for 57 hours, further raised from 1580° C. to 2000° C. at a rate of 22° C./min, and then maintained at 2000° C. for 5 min. Thereby, the firing was carried out. The obtained fired product was pulverized in the same glove box as described above using an alumina mortar, and thereby the phosphor powder of the present Example was obtained.
(Measurement of Luminescent Characteristics)
The luminescent characteristics of the resultant phosphor were examined in a manner described earlier.

Figure 14:
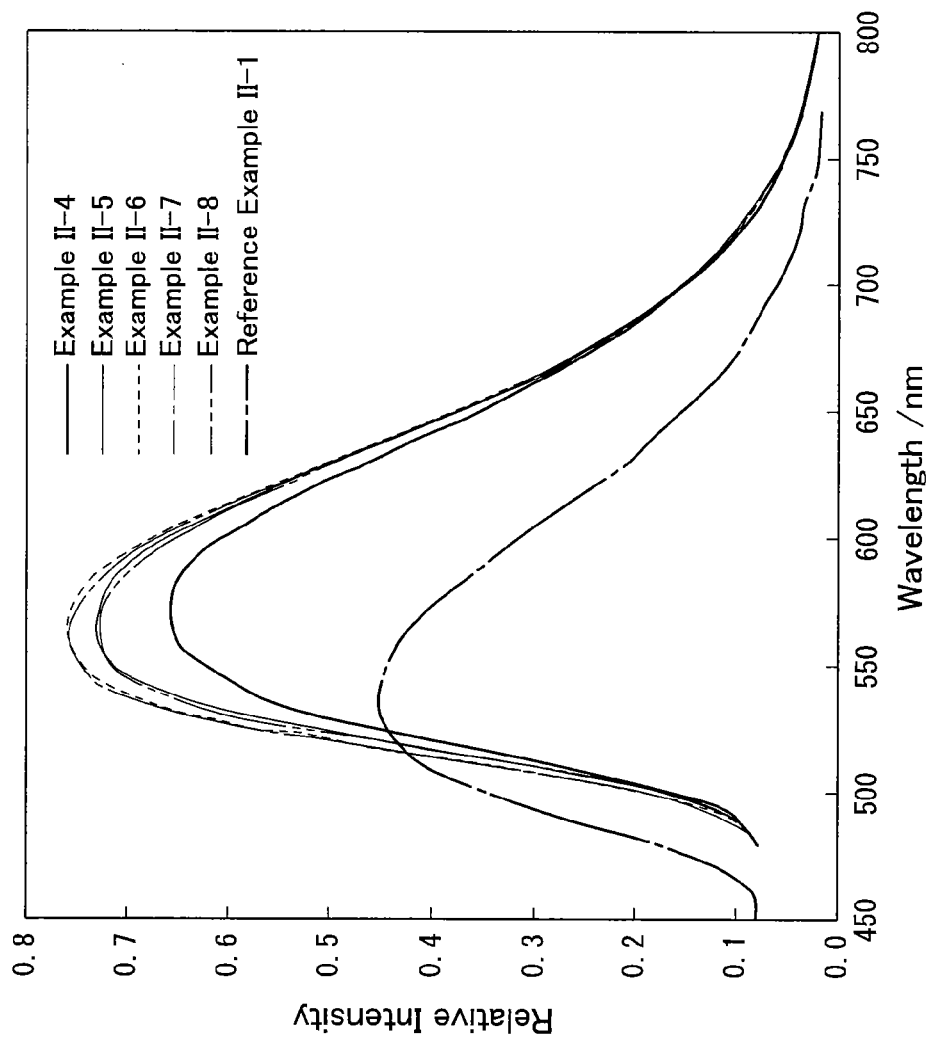
FIG. 14 is a graph showing the emission spectral maps of the phosphors prepared in Examples II-4 to II-8 and Reference Example II-1 of the present invention.

FIG. 14 shows the measured emission spectrum, and Table II-3 shows the luminescent characteristics.

The phosphor of the present Example shows a high emission intensity and has an emission peak shifted to longer wavelengths than those of the phosphors of Examples II-1 to II-3, which contained no A element such as Ca. In addition, since it has a large full width at half maximum of 140 nm, it is evident that it is a yellow phosphor that can contribute to enhancement of the color rendering.

In addition, the powder X-ray diffraction pattern was measured on the phosphor obtained in the present Example using the CuKα line (1.54184 Å). The result is shown in FIG. 13. From FIG. 13, it is evident that a single phase of tetragonal system P4bm or its analogous structure containing extremely little impurity phases could be produced by using an alloy as the phosphor material. Furthermore, in the phosphor of the present Example, the ratio (namely, the peak intensity ratio I) of the peak intensity of the maximum peak (it indicates the peak of an impurity phase) that exists in the 2θ range of 21° to 24° to the peak intensity of the 001 plane of the intended phase that exists in the 2θ range of 17° to 20° was as small as 0.028.

An analysis performed on the phosphor obtained in the present Example using an oxygen-nitrogen analyzer showed that the molar ratio (corresponding to y+w1) of O (oxygen) in the above-mentioned formula [II] was 0.24 and the molar ratio (corresponding to 11−y−w1) of N (nitrogen) in the above-mentioned formula [II] was 11.76.

Example II-5

The phosphor powder (primary fired product) obtained in Example II-4 was subjected to a secondary firing in the condition described below.

The phosphor of the present Example was prepared by the same procedure as the section of (secondary nitriding process) of Example II-4, except that the phosphor material was changed to the phosphor powder of Example II-4 and the temperature program over 800° C. was changed in such a way that the temperature was raised to 1200° C. at a rate of 20° C./min, further raised to 1580° C. at a rate of 13° C./min, and maintained at 1580° C. for 6 hours.

The luminescent characteristics of the resultant phosphor were examined in a manner described earlier.

FIG. 14 shows the measured emission spectrum, and Table II-3 shows the luminescent characteristics. It is evident from FIG. 14 that performing a refiring can enhance the emission intensity.

Examples II-6 to II-8

The phosphor powders of the Examples II-8, II-7, and II-6 were prepared by the same procedure as the section of (secondary nitriding process) of Example II-4, except that the phosphor material used was the phosphor powder of Example II-4 added with, respectively, 0.45 weight %, 0.9 weight %, and 1.36 weight % of $MgF_2$ and mixed in the Example II-5.

The luminescent characteristics of the resultant phosphor were examined in a manner described earlier. FIG. 14 shows the measured emission spectrum, and Table II-3 shows the luminescent characteristics. It is evident that performing a nitriding in the presence of appropriate amount of flux $MgF_2$ can enhance the emission intensity.

Examples II-9, II-10

About 0.7 g of the phosphor powder (primary fired product) obtained in Example II-4 (Example II-9) and the phosphor powder (secondary fired product) obtained in Example II-6 (Example II-10) were weighed out respectively. These were filled into a boron nitride crucible separately and placed in an electric furnace with a molybdenum heater. After evacuating the chamber to about 8 MPa, a nitrogen gas containing hydrogen (hydrogen:nitrogen=4:96 (in volume ratio)) was introduced therein until the pressure reached normal pressure. With a nitrogen gas containing 4% of hydrogen flowing at 0.5 L/min, the temperature was raised to 1400° C. at a temperature rising rate of 5° C./min, and the temperature was maintained at 1400° C. at 1 hour. Thereby, a nitrogen-hydrogen treatment (refiring process) was carried out. By pulverizing the obtained phosphor powders lightly, the respective phosphors of Example II-9 and Example II-10 were prepared.

The luminescent characteristics of the resultant phosphor were examined in a manner described earlier. The luminescent characteristics measured are shown in Table II-3. From the result, it is evident that the emission intensity can be enhanced by performing a nitrogen-hydrogen treatment. This is probably because a change in the reductive conditions of Ce, the activation element, affected the emission positively.

Examples II-11, II-12

An phosphor was prepared by the same procedure as Example II-3 except that, in the secondary firing step of Example II-3, a $CaSiN_2$ powder the same as that prepared in Example II-4 was added in addition to the primary fired product and mixed, before the secondary nitriding step.

When mixing the $CaSiN_2$ powder with the primary fired product, the weight ratio between the nitrogen-containing alloy and the $CaSiN_2$ powder was adjusted so that the charge compositions of $Ca_{0.75}La_{2.4}Ce_{0.1}Si_6N_{11}$ (Example II-11) and $Ca_{1.35}La_{2.0}Ce_{0.1}Si_6N_{11}$ (Example II-12), described in Table II-1, could be obtained. The phosphor powders of Example II-11 and Example II-12 were thereby prepared.

The luminescent characteristics of the resultant phosphor were examined in a manner described earlier. The luminescent characteristics measured are shown in Table II-3. This result indicates that a phosphor emitting yellow green light can be changed into one emitting yellow light by adding Ca on the way that it is produced using an alloy as the phosphor material.

The temperature characteristics I(130)/I(25) of the phosphor of Example II-11 was 65%.

Example II-13

A $Ce_{0.1}Ca_{0.2}La_{2.8}Si_6$ alloy was produced by the same procedure as Example II-1 except that, in the section of "(Production of alloy for phosphor precursor)" of Example II-1, Ca is added as a material metal and the charge composition of the metal elements was changed so that Ce:Ca:La:Si=0.1:0.2:2.8:6 (in molar ratio).

By subsequent steps of a primary firing, secondary firing, and pulverization in the same condition as Example II-1 using the obtained alloy as the material, an oxynitride phosphor powder of which charge composition was $Ca_{0.2}La_{2.8}Ce_{0.1}Si_6N_{10.8}O_{0.2}$ was produced.

The luminescent characteristics of the resultant phosphor were examined in a manner described earlier. The luminescent characteristics measured are shown in Table II-3. The luminescent color of the phosphor obtained in the present Example was yellow.

Example II-14

A white light emitting device was produced by using the phosphor powder of Example II-2, of which charge composition was $La_{2.9}Ce_{0.1}Si_6N_{11}$, and a blue-light emitting GaN-based LED chip (460EZ, manufactured by Cree, Inc.) in combination. In order to disperse and seal the above-mentioned phosphor powder, a silicone resin sealant (SCR-1011, manufactured by Shin-Etsu Chemical Co., Ltd.) and a dispersant (QS-30, manufactured by TOKUYAMA Corp.) were used. The weight ratio of the phosphor powder of the Example II-2: sealant:dispersant was set at 5.1:97.0:3.0. After heating the mixture of them at 70° C. for 1 hour, it was hardened by an additional heating at 150° C. for 5 hours, thereby a phosphor-containing part was formed. A surface-mount white light emitting device was then produced using it.

Figure 15:
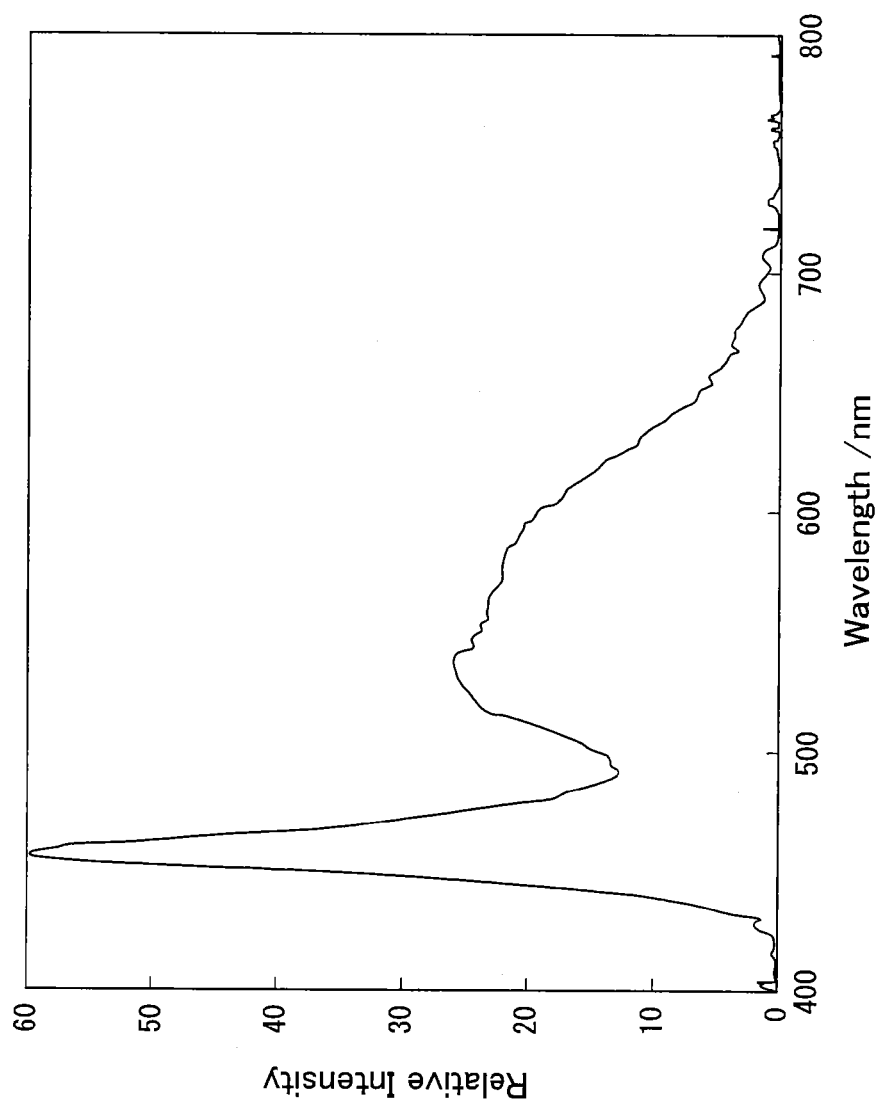
FIG. 15 is a graph showing the emission spectral map of the light emitting device prepared in Example II-14 of the present invention.

The emission spectrum of the obtained light emitting device is shown in FIG. 15, and its spectral characteristics are shown in Table II-4. As shown by the color coordinate values x and y in Table II-4, it is evident that white light emission can be realized easily with just one kind of the present phosphor.

The general color rendering index of the obtained light emitting device was 65. By bringing the color coordinate x close to 0.45 and the color coordinate y to 0.41, the general color rendering index will probably be further improved.

Reference Example II-1

The phosphor powder of Reference Example II-1 was prepared by the same procedure as described in "(Secondary nitriding process)" of Example II-4 except for the following points. Namely, no alloy was used. In addition, the cerium oxide powder, lanthanum nitride powder, silicon nitride powder, and $CaSiN_2$ powder were used as the phosphor materials by being weighed out in the respective amounts described in Table II-1 and mixed altogether. Moreover, the firing temperature program over 800° C. was changed in such a way that the temperature was raised to 2000° C. at a rate of 22° C./min and maintained at 2000° C. for 5 min.

In addition, the powder X-ray diffraction pattern was measured on the phosphor obtained in the present Reference Example using the CuKα line (1.54184 Å). The result is shown in FIG. 13. FIG. 13 shows that tetragonal system P4bm or its analogous structure could be produced as the main phase even without using an alloy as the phosphor material, but some more impurity phases then tends to be contained than in the phosphor prepared using an alloy as the phosphor material. That tendency could be seen more, as the substitution rate x from La to Ca got lower.

In the powder X-ray diffraction pattern of the phosphor of the present Reference Example (x=0.5), the ratio of the peak intensity of the maximum peak (it indicates the peak of an impurity phase) that exists in the 2θ range of 21° to 24° to that of the 001 plane of the intended phase was 0.118. The value was larger than that in the case where an alloy was used as the phosphor material.

The luminescent characteristics of the phosphor obtained in the present Reference Example were examined in a manner described earlier. FIG. 14 shows the measured emission spectrum, and Table II-3 shows the luminescent characteristics. It is evident that the emission intensities of the phosphors of the present invention, prepared in Examples II-2 to II-8, are significantly higher than that of the phosphor of the present Reference Example, prepared without using an alloy as the phosphor material.

TABLE II-1

| | Charge composition (composition of synthesized substance) |
|---|---|
| Reference Example II-1 | $Ca_{0.75}La_{2.4}Ce_{0.1}Si_6N_{11}$ (x = 0.5) |
| Example II-1 to II-3 | $La_{2.9}Ce_{0.1}Si_6N_{11}$ (x = 0) |
| Example II-4 to II-10 | $Ca_{0.75}La_{2.4}Ce_{0.1}Si_6N_{11}$ (x = 0.5) |
| Example II-11 | $Ca_{0.75}La_{2.4}Ce_{0.1}Si_6N_{11}$ (x = 0.5) |
| Example II-12 | $Ca_{1.35}La_{2.0}Ce_{0.1}Si_6N_{11}$ (x = 0.9) |
| Example II-13 | $Ca_{0.2}La_{2.8}Ce_{0.1}Si_6N_{10.8}O_{0.2}$ (x = 0.2) |

*In Table II-1, x represents x in formula [II].

TABLE II-2

| | Charge weight (g) of each material | | | |
|---|---|---|---|---|
| | $CeO_2$ | LaN | $Si_3N_4$ | $CaSiN_2$ |
| Reference Example II-1 | 0.041 | 0.933 | 0.599 | 0.176 |

TABLE II-3

| | Prinary firing (secondary nitriding process) | | | | Secodary firing (secondary nitriding process) | | | | |
|---|---|---|---|---|---|---|---|---|---|
| Example | Charge material | Atmosphere | Pressure (MPa) | Firing temperature × time | Charge material | Atmosphere | Pressure (MPa) | Firing temperature × time | Flux (kind and amount) |
| Reference Example II-1 | * Refer to Table II-2 | $N_2$ | 0.92 | 2000° C. × 0.08 h | — | — | — | — | — |
| Example II-1 | $La_{2.9}Ce_{0.1}Si_6$ alloy | $N_2$ | 27 | 1205° C. × 0.5 h | primary fired product | $N_2$ | 90 | 2000° C. × 3 h | — |
| Example II-2 | $La_{2.9}Ce_{0.1}Si_6$ alloy | $N_2$ | 0.92 | 1500° C. × 58.5 h | primary fired product | $N_2$ | 0.92 | 1750° C. × 7 h | — |
| Example II-3 | $La_{2.9}Ce_{0.1}Si_6$ alloy | $N_2$ | 0.92 | 1500° C. × 58.5 h | primary fired product | $N_2$ | 0.92 | 1750° C. × 39 h | — |
| Example II-4 | $La_4CeSi_{10}$ alloy + LaN + $Si_3N_4$ + $CaSiN_2$ | $N_2$ | 0.92 | 1580° C. × 57 h + 2000° C. × 0.08 h | — | — | — | — | — |
| Example II-5 | $La_4CeSi_{10}$ alloy + LaN + $Si_3N_4$ + $CaSiN_2$ | $N_2$ | 0.92 | 1580° C. × 57 h + 2000° C. × 0.08 h | primary fired product | $N_2$ | 0.92 | 1580° C. × 6 h | — |
| Example II-6 | $La_4CeSi_{10}$ alloy + LaN + $Si_3N_4$ + $CaSiN_2$ | $N_2$ | 0.92 | 1580° C. × 57 h + 2000° C. × 0.08 h | primary fired product | $N_2$ | 0.92 | 1580° C. × 6 h | 0.9 weight % of $MgF_2$ |
| Example II-7 | $La_4CeSi_{10}$ alloy + LaN + $Si_3N_4$ + $CaSiN_2$ | $N_2$ | 0.92 | 1580° C. × 57 h + 2000° C. × 0.08 h | primary fired product | $N_2$ | 0.92 | 1580° C. × 6 h | 1.36 weight % of $MgF_2$ |
| Example II-8 | $La_4CeSi_{10}$ alloy + LaN + $Si_3N_4$ + $CaSiN_2$ | $N_2$ | 0.92 | 1580° C. × 57 h + 2000° C. × 0.08 h | primary fired product | $N_2$ | 0.92 | 1580° C. × 6 h | 0.45 weight % of $MgF_2$ |
| Example II-9 | $La_4CeSi_{10}$ alloy + LaN + $Si_3N_4$ + $CaSiN_2$ | $N_2$ | 0.92 | 1580° C. × 57 h + 2000° C. × 0.08 h | — | — | — | — | — |
| Example II-10 | $La_4CeSi_{10}$ alloy + LaN + $Si_3N_4$ + $CaSiN_2$ | $N_2$ | 0.92 | 1580° C. × 57 h + 2000° C. × 0.08 h | primary fired product | $N_2$ | 0.92 | 1580° C. × 6 h | 0.9 weight % of $MgF_2$ |
| Example II-11 | $La_{2.9}Ce_{0.1}Si_6$ alloy | $N_2$ | 0.92 | 1500° C. × 58.5 h | primary fired product + $CaSiN_2$ | $N_2$ | 0.92 | 1750° C. × 39 h | — |
| Example II-12 | $La_{2.9}Ce_{0.1}Si_6$ alloy | $N_2$ | 0.92 | 1500° C. × 58.5 h | primary fired product + $CaSiN_2$ | $N_2$ | 0.92 | 1750° C. × 39 h | — |
| Example II-13 | $Ce_{0.1}Ca_{0.2}La_{2.8}Si_6$ alloy | $N_2$ | 27 | 1205° C. × 0.5 h | primary fired product | $N_2$ | 90 | 2000° C. × 3 h | — |

TABLE II-3-continued

| | N2—H2 treatment condition (refiring process) | | | Emission characteristics when excited by 460 nm | | | | |
|---|---|---|---|---|---|---|---|---|
| | | | Firing | Emission | Emission peak | | CIE Color coordinate | |
| | Charge | Pressure | temperature × | intensity | wavelength | Full width at | | |
| Example | material | (MPa) | time | (a.u.) | (nm) | half maximum (nm) | x | y |
| Reference Example II-1 | — | — | — | 0.451 | 571 | 142 | 0.461 | 0.512 |
| Example II-1 | — | — | — | 0.235 | 533 | 125 | 0.401 | 0.543 |
| Example II-2 | — | — | — | 0.593 | 533 | 118 | 0.407 | 0.553 |
| Example II-3 | — | — | — | 0.630 | 536 | 122 | 0.415 | 0.548 |
| Example II-4 | — | — | — | 0.662 | 574 | 140 | 0.465 | 0.514 |
| Example II-5 | — | — | — | 0.731 | 568 | 137 | 0.462 | 0.516 |
| Example II-6 | — | — | — | 0.764 | 564 | 137 | 0.457 | 0.520 |
| Example II-7 | — | — | — | 0.760 | 561 | 135 | 0.454 | 0.523 |
| Example II-8 | — | — | — | 0.728 | 564 | 138 | 0.458 | 0.519 |
| Example II-9 | primary fired product | Normal pressure | 1400° C. × 1 h | 0.796 | 561 | 135 | 0.461 | 0.519 |
| Example II-10 | secondary fired product | Normal pressure | 1400° C. × 1 h | 0.802 | 556 | 134 | 0.453 | 0.524 |
| Example II-11 | — | — | — | 0.541 | 558 | 133 | 0.443 | 0.529 |
| Example II-12 | — | — | — | 0.468 | 573 | 145 | 0.466 | 0.505 |
| Example II-13 | — | — | — | 0.420 | 540 | 127 | 0.425 | 0.538 |

TABLE II-4

| | Charge composition | Emission characteristics | |
|---|---|---|---|
| Example | (composition of synthesized substance) | Color coordinate x | Color coordinate y |
| Example II-14 | $La_{2.9}Ce_{0.1}Si_6N_{11}$ | 0.300 | 0.327 |

INDUSTRIAL APPLICABILITY

The present invention can be used in any field of industry. For example, it can be preferably used in the fields where light is used such as illuminating devices and displays. Among them, it is suitable for high-power LED lamps for general lighting, and more particularly for warm white LEDs with high brightness, high color rendering, and relatively low color temperature.

The present invention has been explained in detail above with reference to specific embodiments. However, it is evident to those skilled in the art that various modifications can be added thereto without departing from the intention and the scope of the present invention.

The present application is based on Japanese Patent Application (Patent Application No. 2007-109270) filed on Apr. 18, 2007 and their entireties are incorporated herewith by reference.

The invention claimed is:

1. A phosphor comprising a crystal phase represented by formula [I],

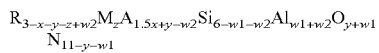

wherein,
R represents at least one kind of a rare-earth element selected from the group consisting of La, Gd, Lu, Y and Sc,
M represents at least one kind of a metal element selected from the group consisting of Ce, Eu, Mn, Yb, Pr and Tb,
A represents at least one kind of a bivalent metal element selected from the group consisting of Ba, Sr, Ca, Mg and Zn, and
x, y, z, w1 and w2 are the numeric values wherein:

$(1/7) \leq (3-x-y-z+w2)/6 < (1/2)$, $x=0$ $0 \leq y < 2$, $0 < z < 1$, $w1=0$, $w2=0$, the wavelength of emission peak of the emission spectrum when excited with light of 460-nm wavelength is 510 nm or longer and 580 nm or shorter, and
in the powder X-ray diffraction pattern measured with CuKα line (1.54184 Å), a peak exists at 2θ from 17° to 20°,
and a peak intensity ratio I, related to a peak present at 2θ from 21° to 24°, is 0.05 or smaller, where
the peak intensity ratio I is defined by, in the powder X-ray diffraction pattern at 2θ ranging from 10° to 60°, the ratio of height $I_p$ of the peak, present at 2θ from 21° to 24°, to height $I_{max}$ of the most-intensive peak, present at 2θ from 17° to 20°, and
the values of the peak intensities are used after background correction.

2. The phosphor according to claim 1, wherein La is used in an amount of at least 70 Mol % relative to the total amount of R, and
color coordinates x and y, in CIE standard colorimetric system, of the luminescent color when excited with light having 460 nm wavelength are in the ranges of $0.420 \leq x \leq 0.600$ and $0.400 \leq y \leq 0.570$, respectively.

3. A phosphor-containing composition comprising:
said phosphor according to claim 1 and a liquid medium.

4. A light emitting device comprising: a first luminous body and a second luminous body that emits visible light when irradiated with light from said first luminous body, wherein said light emitting device comprises, as said second luminous body, a first phosphor comprising at least one kind of said phosphor according to claim 1.

5. A light emitting device according to claim 4, wherein said light emitting device comprises, as said second luminous body, a second phosphor comprising at least one kind of a phosphor of which wavelength of emission peak is different from that of said first phosphor.

6. An illuminating device comprising a light emitting device according to claim 4.

7. A display comprising a light emitting device according to claim 4.

\* \* \* \* \*